US012164848B2

(12) United States Patent
Anisi et al.

(10) Patent No.: US 12,164,848 B2
(45) Date of Patent: Dec. 10, 2024

(54) TECHNOLOGIES FOR CIRCUIT DESIGN

(71) Applicant: Intel Corporation, Santa Clara, CA (US)

(72) Inventors: Daniel J. Anisi, Fair Oaks, CA (US); Vyasa Sai, Folsom, CA (US); Raju Kothandaraman Kasturi, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 332 days.

(21) Appl. No.: 17/485,296

(22) Filed: Sep. 24, 2021

(65) Prior Publication Data
US 2022/0164504 A1   May 26, 2022

Related U.S. Application Data

(60) Provisional application No. 63/116,508, filed on Nov. 20, 2020.

(51) Int. Cl.
*G06F 30/30* (2020.01)
*G06F 30/327* (2020.01)

(52) U.S. Cl.
CPC .................. *G06F 30/327* (2020.01)

(58) Field of Classification Search
CPC .......................... G06F 30/327; G06F 30/3308
See application file for complete search history.

(56) References Cited

U.S. PATENT DOCUMENTS

| | | | |
|---|---|---|---|
| 2002/0138812 A1* | 9/2002 | Johannsen | G06F 30/3323 716/103 |
| 2002/0162086 A1* | 10/2002 | Morgan | G06F 30/30 716/102 |
| 2011/0271244 A1* | 11/2011 | Baumgartner | G06F 30/3323 716/126 |
| 2013/0290917 A1* | 10/2013 | Nayak | G06F 30/30 716/103 |
| 2015/0220672 A1* | 8/2015 | Park | G06F 30/33 703/2 |

(Continued)

OTHER PUBLICATIONS

European Third Office Action, (EP Exam Report Article 94(3) EPC), for Patent Application No. 21199014.8, Mailed Jan. 24, 2024, 5 pages.

(Continued)

*Primary Examiner* — Jack Chiang
*Assistant Examiner* — Brandon Bowers
(74) *Attorney, Agent, or Firm* — Compass IP Law PC

(57) ABSTRACT

Examples described herein relate to at least one processor and at least one memory comprising instructions stored thereon, that if executed by the at least one processor, cause the at least one processor to access partitions representative of a first circuit representation, map at least one port representation of at least one partition of the partitions representative of the first circuit representation to at least one port of a second circuit representation based on a stored mapping of the at least one port representation of at least one partition of the partitions representative of the first circuit representation to the at least one port of a second circuit representation, and output the at least one single bit port representation of the at least one port of a second circuit representation.

25 Claims, 30 Drawing Sheets

(56) References Cited

U.S. PATENT DOCUMENTS

2016/0259879 A1   9/2016   Ganai et al.

OTHER PUBLICATIONS

European First Office Action, (EP Exam Report Article 94(3) EPC), for Patent Application No. 21199014.8, Mailed Jan. 4, 2023, 4 pages.
European First Office Action, (EP Exam Report Article 94(3) EPC), for Patent Application No. 21199014.8, Mailed Jun. 22, 2023, 4 pages.
"GenSys RTL Restructuring, Derivative Design and Design Assembly", SYNOPSYS Datasheet, Nov. 29, 2018, 2 pages.
D. Chatterjee, et al., "Event-driven gate-level simulation with GP-GPUs," 2009 46th ACM/IEEE Design Automation Conference, San Francisco, CA, 2009, pp. 557-562, 6 pages.
Kim, Dusung, et al., "Temporal Parallel Simulation: A Fast Gate-level HDL Simulation Using Higher Level Models", 2008 IEEE International High Level Design Validation and Test Workshop, Incline Village, NV, 2008, pp. 111-116, 6 pages.
Singh, Gagandeep, "Gate-Level Simulation Methodology", Cadence Design Systems, Inc., May 11, 2015, 34 pages.
"Method for gate-level power estimation using VCD from RTL simulations", ip.com PriorArtDatabase, May 30, 2007, 6 pages.
Extended European Search Report for Patent Application No. 2119901.8, Mailed Feb. 3, 2022, 14 pages.
Karthik, Sankaran, et al., "Distributed Mixed Level Logic and Fault Simulation on the Pentium Pro Microprocessor", International Test Conference, Jan. 1, 1996, 7 pages.
European Patent Office Summons to Attend Oral Proceedings for Patent Application No. 21199014.8, Mailed Jun. 5, 2024, 10 pages.

\* cited by examiner

GRAPHICS PROCESSOR INSTRUCTION FORMATS
700

128-BIT INSTRUCTION
710

64-BIT COMPACT INSTRUCTION
730

OPCODE DECODE
740 opcode=000xxxxxb ← Move/Logic - 742
opcode=0010xxxxb ← Miscellaneous - 746
opcode=0011xxxxb ← Flow Control - 744
opcode=0100xxxxb ← Parallel Math - 748
opcode=0101xxxxb ← Vector Math - 750

TECHNOLOGIES FOR CIRCUIT DESIGN

RELATED APPLICATION

The present application claims the benefit of priority of U.S. Provisional application 63/116,508, filed Nov. 20, 2020. The contents of that application are incorporated in their entirety herein.

RELATED ART

Existing circuit design verification methodologies and tools attempt to speed-up register transfer level (RTL) design simulation and verification. These methods are not effective for synthesized designs (e.g., gate level simulation) as the designs become large and more complex. Gate Level Simulation (GLS) is defined as a discipline in which a synthesized design, which is closer to silicon compared to RTL design, is verified for timing and/or functionality. GLS run times vary depending on design complexity. In a study, GLS run took 5.3 hours of simulation time whereas its corresponding RTL design only ran 1.3 hours.

Synopsys® GenSys is a verification tool that helps designers to scale down the larger RTL designs into smaller design sets that give the capability to test them in parallel to speed up RTL design simulation. Some existing work on tool methodology for RTL design simulation speed up are published as part of research articles. For example, D. Kim, M. Ciesielski, Kyuho Shim and Seiyang Yang, "Temporal Parallel Gate-level Timing Simulation," 2008 IEEE International High Level Design Validation and Test Workshop, Incline Village, N V, 2008, pp. 111-116, describes a methodology with ability to split an entire simulation into smaller captures, and then evaluate each capture independently to provide faster simulation result. However, unaccounted-for dependencies from the simulation in "Temporal Parallel Gate-level Timing Simulation" result in low visibility of entire simulation capture and bugs are possibly harder to detect as a result of multiple simulation capture review. This is especially true for designs consisting of millions of gates.

Another approach to speed up synthesized design simulation has been explored in D. Chatterjee, A. DeOrio and V. Bertacco, "Event-Driven Gate-level Simulation with GP-GPUs," 2009 46th ACM/IEEE Design Automation Conference, San Francisco, CA, 2009, pp. 557-562, which describes event driven simulator architecture for a graphics processing unit (GPU). The tool described in "Event-Driven Gate-level Simulation with GP-GPUs" works on gate level design that is partitioned into smaller chunks called "macro-gates" based on module's sensitivity lists' selection. Smaller chunks are grouped to form larger blocks, called layers, and are exercised in parallel in a simulation stage, which results in a faster simulation speed. However, in the case of simulation based on "Event-Driven Gate-level Simulation with GP-GPUs," there are "layer" overlaps in the design under test that may not be present in actual silicon.

DETAILED DESCRIPTION

Figure 1:
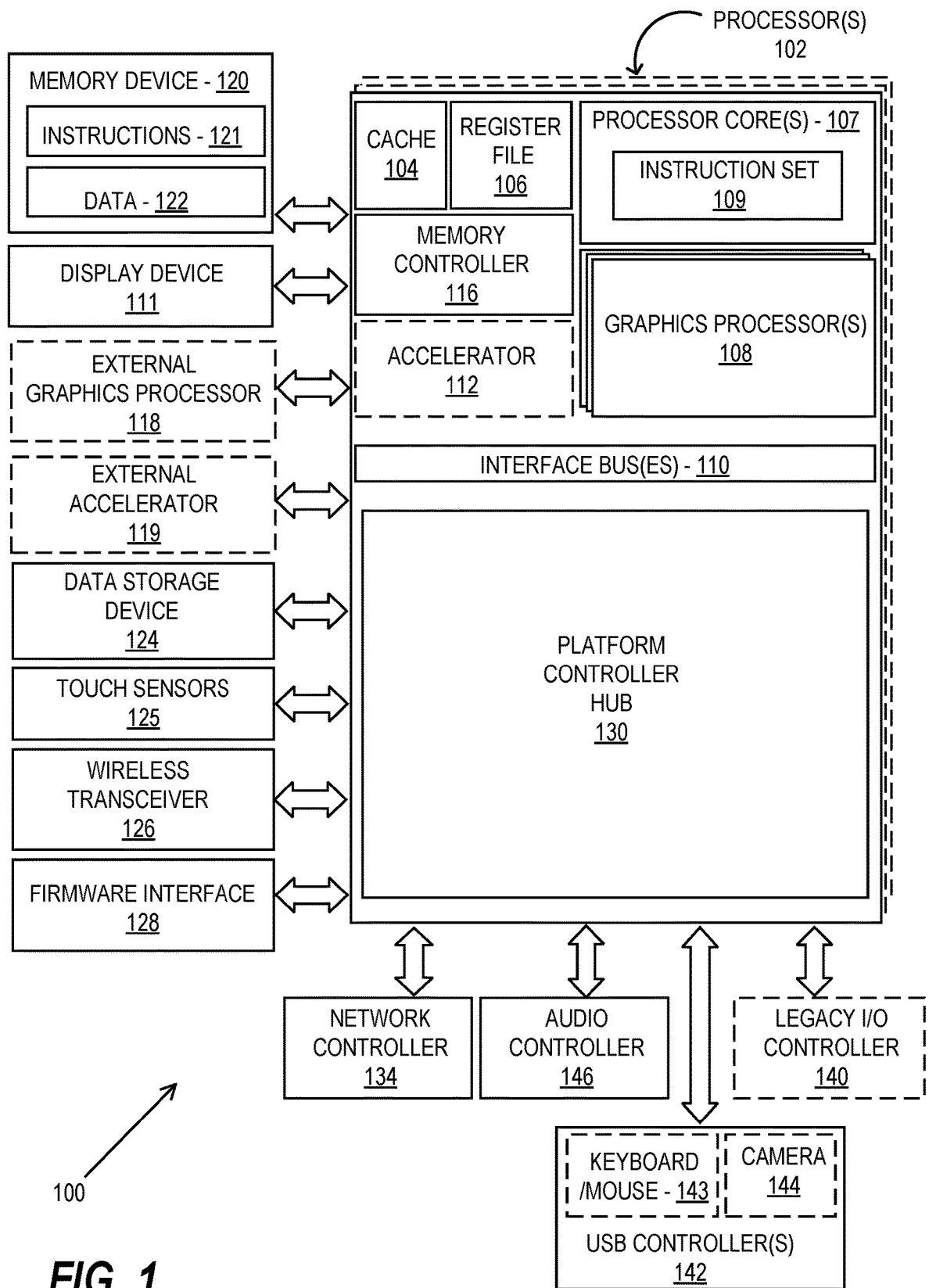
FIG. 1 is a block diagram of a processing system according to an embodiment.

In the following description, for the purposes of explanation, numerous specific details are set forth in order to provide a thorough understanding of the embodiments of the invention described below. It will be apparent, however, to one skilled in the art that the embodiments of the invention may be practiced without some of these specific details. In other instances, well-known structures and devices are shown in block diagram form to avoid obscuring the underlying principles of the embodiments of the invention.

In previous studies, either there are changes to original floorplan or schematics by creating smaller design pieces, which will not meet the intent of the original design, or a limitation is imposed on the designer for a complete full design verification for the sake of faster verification. Hence, there is a need for an efficient verification tool or methodology for synthesized design that can help a designer to unmask functional issues and reduce simulation speed.

Various embodiments provide a hybrid GLS methodology that can speed-up simulation by using RTL and synthesized design mix-and-match modeling to provide a hybrid technology that models a final manufactured hardware product. Various embodiments utilize interface and connectivity mapping and use prediction techniques to replace a selected number of RTL ("R") partitions with its equivalent synthesized Netlist ("N") partitions, to form a total number of "T" partitions, where T=R+N. In other words, a tool in accordance with various embodiments allows use of R number of RTL partitions to build a scalable technology with T=R+N by replacing synthesized design (T−R, where 0<R<T) with its corresponding RTL design. Various embodiments can reduce time to simulate a design to identify operation or errors of the design.

When an RTL fub goes through a synthesis process, as part of structural design engineering, (1) a single bit port signal could be synthesized and removed from the design, (2) a single bit port signal could be synthesized to a different name, (3) a single bit port signal could be synthesized and moved to a different hierarchy. So, an address bus of 32 bit could end up becoming a 30 single bit of wires in a post synthesis process, where 2 lower bits are removed and single bit signal names change to a new name based on the design compiler tool that performs the synthesis. Complexity increases in the design, with struct of structs whose child structs have their own structs and unions along with multiple bussed format signals and ports. These multi dimension hierarchy signals go through the synthesis process, and some signals are synthesized, some will be removed, renamed, and relocated. This becomes more complicated when synthesizing the larger design. The changes to the port, clock signals, and so forth can be logged into a database for later use in product's life. Some embodiments provide a simulation tool to use these databases to reuse changes to port, clock signals, and so forth in a validation environment to run a test. In some examples, partition collaterals from a structural design process are used in a simulation environment.

As part of a Netlist, a network of gates and interconnects can be present but some of these interconnects do not exist in the original RTL and are added during synthesis process. For example, in a Netlist partition, physical traces of a repeater, a clock tree network, or a power rail can exist that do not exist in simulation RTL. In simulation RTL, the repeater or power behavior is modeled via auxiliary/supporting repeater, or Unified Power Format (UPF) files during simulation, and the simulator can transform those into a schematic for simulation purpose. The challenges of physical connection from a Netlist partition (whose signals were synthesized to different name or removed) to a behavioral model RTL partition is a challenging in creating a GLS technology for simulation, and has been addressed, at least in part, by various embodiments of a GLS hybrid technology.

As part of a GLS hybrid technology, signal connectivity information from two different environments (e.g., RTL and Netlist) can be combined. The GLS hybrid technology breaks down the top IP design into partitions of Netlists with RTL partitions and provide a compile-able hybrid technology. Related databases from structural design synthesis process can be used by the tool, along with standard cell from library, port information from RTL design as there is no port direction concept in Netlist.

System Overview

FIG. 1 is a block diagram of a processing system 100, according to an embodiment. System 100 may be used in a single processor desktop system, a multiprocessor workstation system, or a server system having a large number of processors 102 or processor cores 107. In one embodiment, the system 100 is a processing platform incorporated within a system-on-a-chip (SoC) integrated circuit for use in mobile, handheld, or embedded devices such as within Internet-of-things (IoT) devices with wired or wireless connectivity to a local or wide area network.

In one embodiment, system 100 can include, couple with, or be integrated within: a server-based gaming platform; a game console, including a game and media console; a mobile gaming console, a handheld game console, or an online game console. In some embodiments the system 100 is part of a mobile phone, smart phone, tablet computing device or mobile Internet-connected device such as a laptop with low internal storage capacity. Processing system 100 can also include, couple with, or be integrated within: a wearable device, such as a smart watch wearable device; smart eyewear or clothing enhanced with augmented reality (AR) or virtual reality (VR) features to provide visual, audio or tactile outputs to supplement real world visual, audio or tactile experiences or otherwise provide text, audio, graphics, video, holographic images or video, or tactile feedback; other augmented reality (AR) device; or other virtual reality (VR) device. In some embodiments, the processing system 100 includes or is part of a television or set top box device. In one embodiment, system 100 can include, couple with, or be integrated within a self-driving vehicle such as a bus, tractor trailer, car, motor or electric power cycle, plane or glider (or any combination thereof). The self-driving vehicle may use system 100 to process the environment sensed around the vehicle.

In some embodiments, the one or more processors 102 each include one or more processor cores 107 to process instructions which, when executed, perform operations for system or user software. In some embodiments, at least one of the one or more processor cores 107 is configured to process a specific instruction set 109. In some embodiments, instruction set 109 may facilitate Complex Instruction Set Computing (CISC), Reduced Instruction Set Computing (RISC), or computing via a Very Long Instruction Word (VLIW). One or more processor cores 107 may process a different instruction set 109, which may include instructions to facilitate the emulation of other instruction sets. Processor core 107 may also include other processing devices, such as a Digital Signal Processor (DSP).

In some embodiments, the processor 102 includes cache memory 104. Depending on the architecture, the processor 102 can have a single internal cache or multiple levels of internal cache. In some embodiments, the cache memory is shared among various components of the processor 102. In some embodiments, the processor 102 also uses an external cache (e.g., a Level-3 (L3) cache or Last Level Cache (LLC)) (not shown), which may be shared among processor cores 107 using known cache coherency techniques. A register file 106 can be additionally included in processor 102 and may include different types of registers for storing different types of data (e.g., integer registers, floating point registers, status registers, and an instruction pointer register). Some registers may be general-purpose registers, while other registers may be specific to the design of the processor 102.

In some embodiments, one or more processor(s) 102 are coupled with one or more interface bus(es) 110 to transmit communication signals such as address, data, or control signals between processor 102 and other components in the system 100. The interface bus 110, in one embodiment, can be a processor bus, such as a version of the Direct Media Interface (DMI) bus. However, processor busses are not limited to the DMI bus, and may include one or more Peripheral Component Interconnect buses (e.g., PCI, PCI express), memory busses, or other types of interface busses. In one embodiment the processor(s) 102 include an integrated memory controller 116 and a platform controller hub 130. The memory controller 116 facilitates communication between a memory device and other components of the system 100, while the platform controller hub (PCH) 130 provides connections to I/O devices via a local I/O bus.

The memory device 120 can be a dynamic random-access memory (DRAM) device, a static random-access memory (SRAM) device, flash memory device, phase-change memory device, or some other memory device having suitable performance to serve as process memory. In one embodiment the memory device 120 can operate as system memory for the system 100, to store data 122 and instructions 121 for use when the one or more processors 102 executes an application or process. Memory controller 116 also couples with an optional external graphics processor 118, which may communicate with the one or more graphics processors 108 in processors 102 to perform graphics and media operations. In some embodiments, graphics, media, and or compute operations may be assisted by an accelerator 112 which is a coprocessor that can be configured to perform a specialized set of graphics, media, or compute operations. For example, in one embodiment the accelerator 112 is a matrix multiplication accelerator used to optimize machine learning or compute operations. In one embodiment the accelerator 112 is a ray-tracing accelerator that can be used to perform ray-tracing operations in concert with the graphics processor 108. In one embodiment, an external accelerator 119 may be used in place of or in concert with the accelerator 112.

In some embodiments a display device 111 can connect to the processor(s) 102. The display device 111 can be one or more of an internal display device, as in a mobile electronic device or a laptop device or an external display device attached via a display interface (e.g., DisplayPort, embedded DisplayPort, MIPI, HDMI, etc.). In one embodiment the display device 111 can be a head mounted display (HMD) such as a stereoscopic display device for use in virtual reality (VR) applications or augmented reality (AR) applications.

In some embodiments the platform controller hub 130 enables peripherals to connect to memory device 120 and processor 102 via a high-speed I/O bus. The I/O peripherals include, but are not limited to, an audio controller 146, a network controller 134, a firmware interface 128, a wireless transceiver 126, touch sensors 125, a data storage device 124 (e.g., non-volatile memory, volatile memory, hard disk drive, flash memory, NAND, 3D NAND, 3D XPoint, etc.). The data storage device 124 can connect via a storage interface (e.g., SATA) or via a peripheral bus, such as a Peripheral Component Interconnect bus (e.g., PCI, PCI express). The touch sensors 125 can include touch screen sensors, pressure sensors, or fingerprint sensors. The wireless transceiver 126 can be a Wi-Fi transceiver, a Bluetooth transceiver, or a mobile network transceiver such as a 3G, 4G, 5G, or Long-Term Evolution (LTE) transceiver. The firmware interface 128 enables communication with system firmware, and can be, for example, a unified extensible firmware interface (UEFI). The network controller 134 can enable a network connection to a wired network. In some embodiments, a high-performance network controller (not shown) couples with the interface bus 110. The audio controller 146, in one embodiment, is a multi-channel high definition audio controller. In one embodiment the system 100 includes an optional legacy I/O controller 140 for coupling legacy (e.g., Personal System 2 (PS/2)) devices to the system. The platform controller hub 130 can also connect to one or more Universal Serial Bus (USB) controllers 142 connect input devices, such as keyboard and mouse 143 combinations, a camera 144, or other USB input devices.

It will be appreciated that the system 100 shown is exemplary and not limiting, as other types of data processing systems that are differently configured may also be used. For example, an instance of the memory controller 116 and platform controller hub 130 may be integrated into a discreet external graphics processor, such as the external graphics processor 118. In one embodiment the platform controller hub 130 and/or memory controller 116 may be external to the one or more processor(s) 102. For example, the system 100 can include an external memory controller 116 and platform controller hub 130, which may be configured as a memory controller hub and peripheral controller hub within a system chipset that is in communication with the processor(s) 102.

For example, circuit boards ("sleds") can be used on which components such as CPUs, memory, and other components are placed are designed for increased thermal performance. In some examples, processing components such as the processors are located on a top side of a sled while near memory, such as DIMMs, are located on a bottom side of the sled. As a result of the enhanced airflow provided by this design, the components may operate at higher frequencies and power levels than in typical systems, thereby increasing performance. Furthermore, the sleds are configured to blindly mate with power and data communication cables in a rack, thereby enhancing their ability to be quickly removed, upgraded, reinstalled, and/or replaced. Similarly, individual components located on the sleds, such as processors, accelerators, memory, and data storage drives, are configured to be easily upgraded due to their increased spacing from each other. In the illustrative embodiment, the components additionally include hardware attestation features to prove their authenticity.

A data center can utilize a single network architecture ("fabric") that supports multiple other network architectures including Ethernet and Omni-Path. The sleds can be coupled to switches via optical fibers, which provide higher bandwidth and lower latency than typical twisted pair cabling (e.g., Category 5, Category 5e, Category 6, etc.). Due to the high bandwidth, low latency interconnections and network architecture, the data center may, in use, pool resources, such as memory, accelerators (e.g., GPUs, graphics accelerators, FPGAs, ASICs, neural network and/or artificial intelligence accelerators, etc.), and data storage drives that are physically disaggregated, and provide them to compute resources (e.g., processors) on an as needed basis, enabling the compute resources to access the pooled resources as if they were local.

A power supply or source can provide voltage and/or current to system 100 or any component or system described herein. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

FIGS. 2A-2D illustrate computing systems and graphics processors provided by embodiments described herein. The elements of FIGS. 2A-2D having the same reference numbers (or names) as the elements of any other figure herein can operate or function in any manner similar to that described elsewhere herein, but are not limited to such.

Figure 2A:
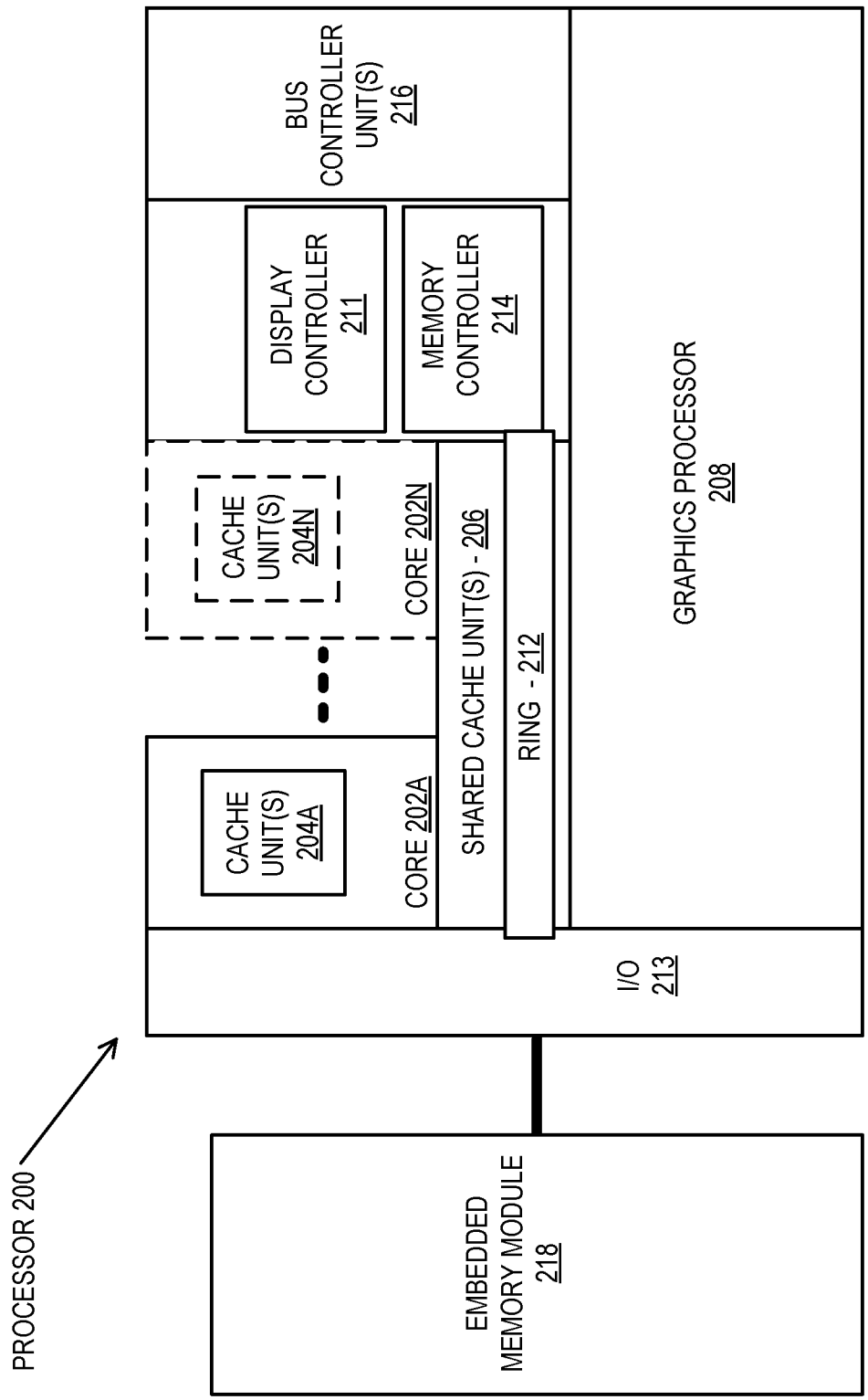
FIGS. 2A-2D illustrate computing systems and graphics processors provided by embodiments described herein.

FIG. 2A is a block diagram of an embodiment of a processor 200 having one or more processor cores 202A-202N, an integrated memory controller 214, and an integrated graphics processor 208. Processor 200 can include additional cores up to and including additional core 202N represented by the dashed lined boxes. Each of processor cores 202A-202N includes one or more internal cache units 204A-204N. In some embodiments each processor core also has access to one or more shared cached units 206. The internal cache units 204A-204N and shared cache units 206 represent a cache memory hierarchy within the processor 200. The cache memory hierarchy may include at least one level of instruction and data cache within each processor core and one or more levels of shared mid-level cache, such as a Level 2 (L2), Level 3 (L3), Level 4 (L4), or other levels of cache, where the highest level of cache before external memory is classified as the LLC. In some embodiments, cache coherency logic maintains coherency between the various cache units 206 and 204A-204N.

In some embodiments, processor 200 may also include a set of one or more bus controller units 216 and a system agent core 210. The one or more bus controller units 216 manage a set of peripheral buses, such as one or more PCI or PCI express busses. System agent core 210 provides management functionality for the various processor components. In some embodiments, system agent core 210 includes one or more integrated memory controllers 214 to manage access to various external memory devices (not shown).

In some embodiments, one or more of the processor cores 202A-202N include support for simultaneous multi-threading. In such embodiment, the system agent core 210 includes components for coordinating and operating cores 202A-202N during multi-threaded processing. System agent core 210 may additionally include a power control unit (PCU), which includes logic and components to regulate the power state of processor cores 202A-202N and graphics processor 208.

In some embodiments, processor 200 additionally includes graphics processor 208 to execute graphics processing operations. In some embodiments, the graphics processor 208 couples with the set of shared cache units 206, and the system agent core 210, including the one or more integrated memory controllers 214. In some embodiments, the system agent core 210 also includes a display controller 211 to drive graphics processor output to one or more coupled displays. In some embodiments, display controller 211 may also be a separate module coupled with the graphics processor via at least one interconnect, or may be integrated within the graphics processor 208.

In some embodiments, a ring-based interconnect unit 212 is used to couple the internal components of the processor 200. However, an alternative interconnect unit may be used, such as a point-to-point interconnect, a switched interconnect, or other techniques, including techniques well known in the art. In some embodiments, graphics processor 208 couples with the ring interconnect 212 via an I/O link 213.

The exemplary I/O link 213 represents at least one of multiple varieties of I/O interconnects, including an on package I/O interconnect which facilitates communication between various processor components and a high-performance embedded memory module 218, such as an eDRAM module. In some embodiments, each of the processor cores 202A-202N and graphics processor 208 can use embedded memory modules 218 as a shared Last Level Cache.

In some embodiments, processor cores 202A-202N are homogenous cores executing the same instruction set architecture. In another embodiment, processor cores 202A-202N are heterogeneous in terms of instruction set architecture (ISA), where one or more of processor cores 202A-202N execute a first instruction set, while at least one of the other cores executes a subset of the first instruction set or a different instruction set. In one embodiment, processor cores 202A-202N are heterogeneous in terms of microarchitecture, where one or more cores having a relatively higher power consumption couple with one or more power cores having a lower power consumption. In one embodiment, processor cores 202A-202N are heterogeneous in terms of computational capability. Additionally, processor 200 can be implemented on one or more chips or as an SoC integrated circuit having the illustrated components, in addition to other components.

Figure 2B:
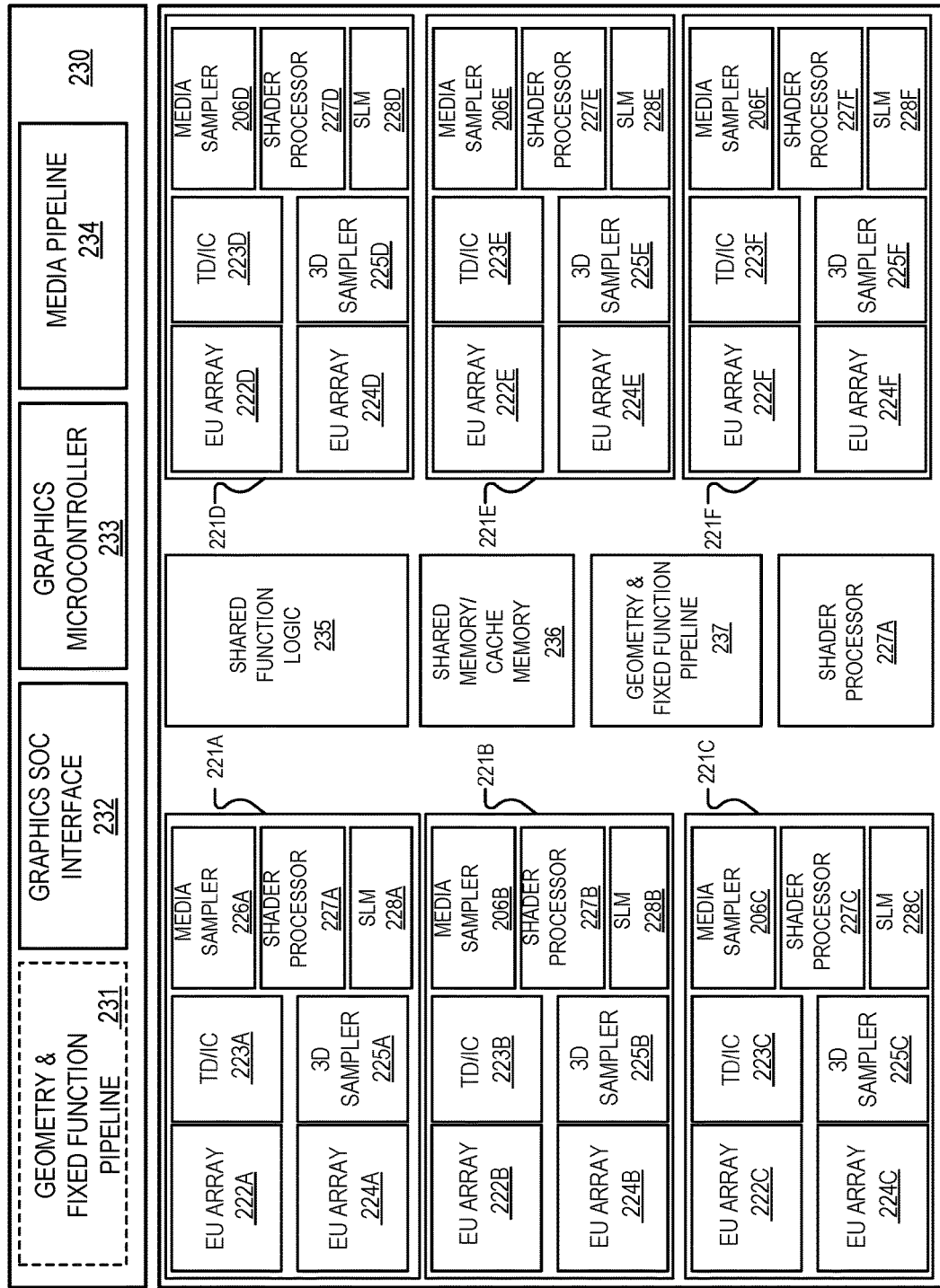

FIG. 2B is a block diagram of hardware logic of a graphics processor core 219, according to some embodiments described herein. Elements of FIG. 2B having the same reference numbers (or names) as the elements of any other figure herein can operate or function in any manner similar to that described elsewhere herein, but are not limited to such. The graphics processor core 219, sometimes referred to as a core slice, can be one or multiple graphics cores within a modular graphics processor. The graphics processor core 219 is exemplary of one graphics core slice, and a graphics processor as described herein may include multiple graphics core slices based on target power and performance envelopes. Each graphics processor core 219 can include a fixed function block 230 coupled with multiple sub-cores 221A-221F, also referred to as sub-slices, that include modular blocks of general-purpose and fixed function logic.

In some embodiments, the fixed function block 230 includes a geometry/fixed function pipeline 231 that can be shared by all sub-cores in the graphics processor core 219, for example, in lower performance and/or lower power graphics processor implementations. In various embodiments, the geometry/fixed function pipeline 231 includes a 3D fixed function pipeline (e.g., 3D pipeline 312 as in FIG. 3 and FIG. 4, described below) a video front-end unit, a thread spawner and thread dispatcher, and a unified return buffer manager, which manages unified return buffers (e.g., unified return buffer 418 in FIG. 4, as described below).

In one embodiment the fixed function block 230 also includes a graphics SoC interface 232, a graphics microcontroller 233, and a media pipeline 234. The graphics SoC interface 232 provides an interface between the graphics processor core 219 and other processor cores within a system on a chip integrated circuit. The graphics microcontroller 233 is a programmable sub-processor that is configurable to manage various functions of the graphics processor core 219, including thread dispatch, scheduling, and preemption. The media pipeline 234 (e.g., media pipeline 316 of FIG. 3 and FIG. 4) includes logic to facilitate the decoding, encoding, pre-processing, and/or post-processing of multimedia data, including image and video data. The media pipeline 234 implement media operations via requests to compute or sampling logic within the sub-cores 221-221F.

In one embodiment the SoC interface 232 enables the graphics processor core 219 to communicate with general-purpose application processor cores (e.g., CPUs) and/or other components within an SoC, including memory hierarchy elements such as a shared last level cache memory, the system RAM, and/or embedded on-chip or on-package DRAM. The SoC interface 232 can also enable communication with fixed function devices within the SoC, such as camera imaging pipelines, and enables the use of and/or implements global memory atomics that may be shared between the graphics processor core 219 and CPUs within the SoC. The SoC interface 232 can also implement power management controls for the graphics processor core 219 and enable an interface between a clock domain of the graphic core 219 and other clock domains within the SoC. In one embodiment the SoC interface 232 enables receipt of command buffers from a command streamer and global thread dispatcher that are configured to provide commands and instructions to each of one or more graphics cores within a graphics processor. The commands and instructions can be dispatched to the media pipeline 234, when media operations are to be performed, or a geometry and fixed function pipeline (e.g., geometry and fixed function pipeline 231, geometry and fixed function pipeline 237) when graphics processing operations are to be performed.

The graphics microcontroller 233 can be configured to perform various scheduling and management tasks for the graphics processor core 219. In one embodiment the graphics microcontroller 233 can perform graphics and/or compute workload scheduling on the various graphics parallel engines within execution unit (EU) arrays 222A-222F, 224A-224F within the sub-cores 221A-221F. In this scheduling model, host software executing on a CPU core of an SoC including the graphics processor core 219 can submit workloads one of multiple graphic processor doorbells, which invokes a scheduling operation on the appropriate graphics engine. Scheduling operations include determining which workload to run next, submitting a workload to a command streamer, pre-empting existing workloads running on an engine, monitoring progress of a workload, and notifying host software when a workload is complete. In one embodiment the graphics microcontroller 233 can also facilitate low-power or idle states for the graphics processor core 219, providing the graphics processor core 219 with the ability to save and restore registers within the graphics processor core 219 across low-power state transitions independently from the operating system and/or graphics driver software on the system.

The graphics processor core 219 may have greater than or fewer than the illustrated sub-cores 221A-221F, up to N modular sub-cores. For each set of N sub-cores, the graphics processor core 219 can also include shared function logic 235, shared and/or cache memory 236, a geometry/fixed function pipeline 237, as well as additional fixed function logic 238 to accelerate various graphics and compute processing operations. The shared function logic 235 can include logic units associated with the shared function logic 420 of FIG. 4 (e.g., sampler, math, and/or inter-thread communication logic) that can be shared by each N sub-cores within the graphics processor core 219. The shared and/or cache memory 236 can be a last-level cache for the set of N sub-cores 221A-221F within the graphics processor core 219, and can also serve as shared memory that is accessible by multiple sub-cores. The geometry/fixed function pipeline 237 can be included instead of the geometry/fixed function pipeline 231 within the fixed function block 230 and can include the same or similar logic units.

In one embodiment the graphics processor core 219 includes additional fixed function logic 238 that can include various fixed function acceleration logic for use by the graphics processor core 219. In one embodiment the additional fixed function logic 238 includes an additional geometry pipeline for use in position only shading. In position-only shading, two geometry pipelines exist, the full geometry pipeline within the geometry/fixed function pipeline 238, 231, and a cull pipeline, which is an additional geometry pipeline which may be included within the additional fixed function logic 238. In one embodiment the cull pipeline is a trimmed down version of the full geometry pipeline. The full pipeline and the cull pipeline can execute different instances of the same application, each instance having a separate context. Position only shading can hide long cull runs of discarded triangles, enabling shading to be completed earlier in some instances. For example and in one embodiment the cull pipeline logic within the additional fixed function logic 238 can execute position shaders in parallel with the main application and generally generates critical results faster than the full pipeline, as the cull pipeline fetches and shades only the position attribute of the vertices, without performing rasterization and rendering of the pixels to the frame buffer. The cull pipeline can use the generated critical results to compute visibility information for all the triangles without regard to whether those triangles are culled. The full pipeline (which in this instance may be referred to as a replay pipeline) can consume the visibility information to skip the culled triangles to shade only the visible triangles that are finally passed to the rasterization phase.

In one embodiment the additional fixed function logic 238 can also include machine-learning acceleration logic, such as fixed function matrix multiplication logic, for implementations including optimizations for machine learning training or inferencing.

Within each graphics sub-core 221A-221F includes a set of execution resources that may be used to perform graphics, media, and compute operations in response to requests by graphics pipeline, media pipeline, or shader programs. The graphics sub-cores 221A-221F include multiple EU arrays 222A-222F, 224A-224F, thread dispatch and inter-thread communication (TD/IC) logic 223A-223F, a 3D (e.g., texture) sampler 225A-225F, a media sampler 206A-206F, a shader processor 227A-227F, and shared local memory (SLM) 228A-228F. The EU arrays 222A-222F, 224A-224F each include multiple execution units, which are general-purpose graphics processing units capable of performing floating-point and integer/fixed-point logic operations in service of a graphics, media, or compute operation, including graphics, media, or compute shader programs. The TD/IC logic 223A-223F performs local thread dispatch and thread control operations for the execution units within a sub-core and facilitate communication between threads executing on the execution units of the sub-core. The 3D sampler 225A-225F can read texture or other 3D graphics related data into memory. The 3D sampler can read texture data differently based on a configured sample state and the texture format associated with a given texture. The media sampler 206A-206F can perform similar read operations based on the type and format associated with media data. In one embodiment, each graphics sub-core 221A-221F can alternately include a unified 3D and media sampler. Threads executing on the execution units within each of the sub-cores 221A-221F can make use of shared local memory 228A-228F within each sub-core, to enable threads executing within a thread group to execute using a common pool of on-chip memory.

Figure 2C:
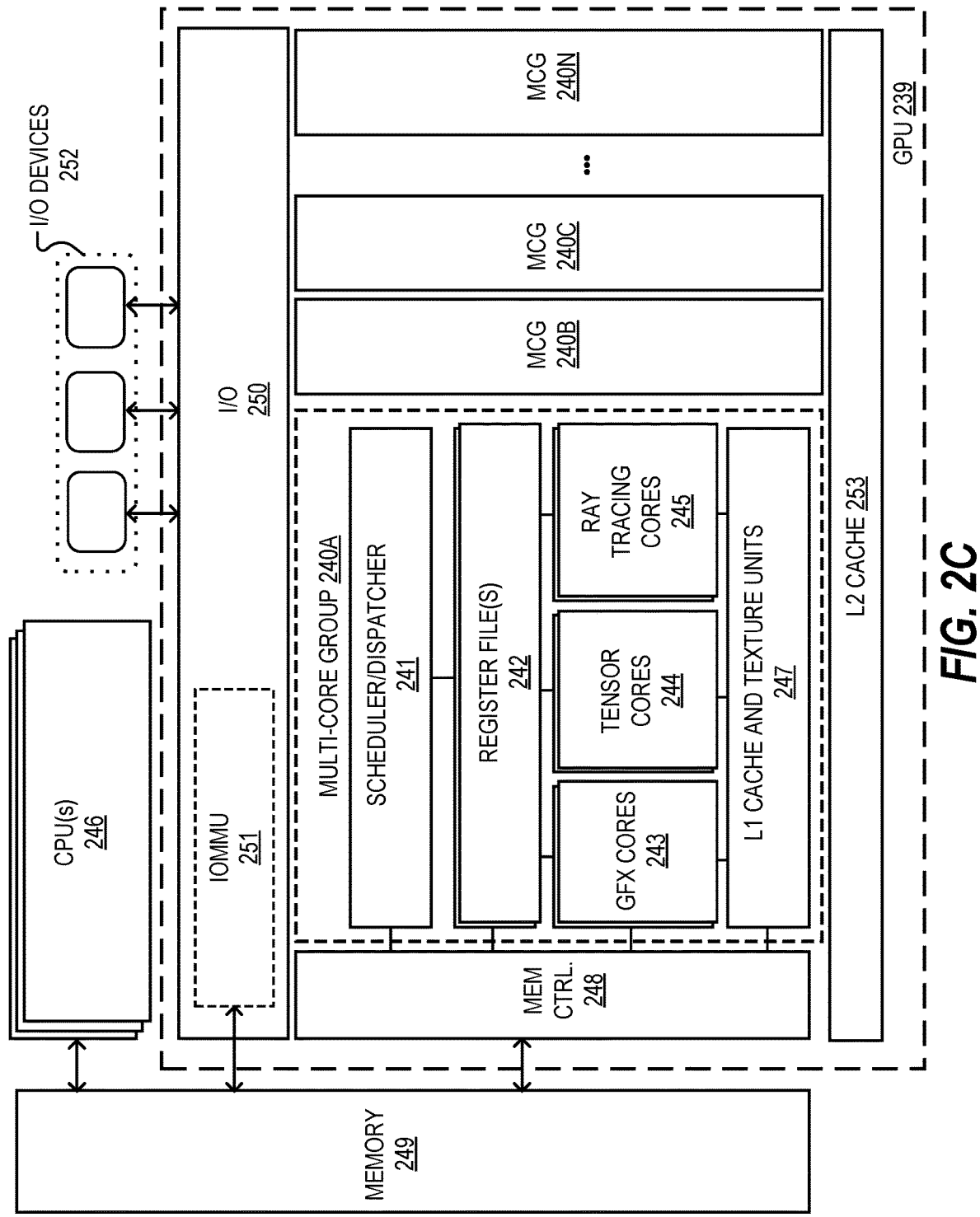

FIG. 2C illustrates a graphics processing unit (GPU) 239 that includes dedicated sets of graphics processing resources arranged into multi-core groups 240A-240N. While the details of only a single multi-core group 240A are provided, it will be appreciated that the other multi-core groups 240B-240N may be equipped with the same or similar sets of graphics processing resources.

As illustrated, a multi-core group 240A may include a set of graphics cores 243, a set of tensor cores 244, and a set of ray tracing cores 245. A scheduler/dispatcher 241 schedules and dispatches the graphics threads for execution on the various cores 243, 244, 245. A set of register files 242 store operand values used by the cores 243, 244, 245 when executing the graphics threads. These may include, for example, integer registers for storing integer values, floating point registers for storing floating point values, vector registers for storing packed data elements (integer and/or floating point data elements) and tile registers for storing tensor/matrix values. In one embodiment, the tile registers are implemented as combined sets of vector registers.

One or more combined level 1 (L1) caches and shared memory units 247 store graphics data such as texture data, vertex data, pixel data, ray data, bounding volume data, etc., locally within each multi-core group 240A. One or more texture units 247 can also be used to perform texturing operations, such as texture mapping and sampling. A Level 2 (L2) cache 253 shared by all or a subset of the multi-core groups 240A-240N stores graphics data and/or instructions for multiple concurrent graphics threads. As illustrated, the L2 cache 253 may be shared across a plurality of multi-core groups 240A-240N. One or more memory controllers 248 couple the GPU 239 to a memory 249 which may be a system memory (e.g., DRAM) and/or a dedicated graphics memory (e.g., GDDR6 memory).

Input/output (I/O) circuitry 250 couples the GPU 239 to one or more I/O devices 252 such as digital signal processors (DSPs), network controllers, or user input devices. An on-chip interconnect may be used to couple the I/O devices 252 to the GPU 239 and memory 249. One or more I/O memory management units (IOMMUs) 251 of the I/O circuitry 250 couple the I/O devices 252 directly to the system memory 249. In one embodiment, the IOMMU 251 manages multiple sets of page tables to map virtual addresses to physical addresses in system memory 249. In this embodiment, the I/O devices 252, CPU(s) 246, and GPU(s) 239 may share the same virtual address space.

In one implementation, the IOMMU 251 supports virtualization. In this case, it may manage a first set of page tables to map guest/graphics virtual addresses to guest/graphics physical addresses and a second set of page tables to map the guest/graphics physical addresses to system/host physical addresses (e.g., within system memory 249). The base addresses of each of the first and second sets of page tables may be stored in control registers and swapped out on a context switch (e.g., so that the new context is provided with access to the relevant set of page tables). While not illustrated in FIG. 2C, each of the cores 243, 244, 245 and/or multi-core groups 240A-240N may include translation lookaside buffers (TLBs) to cache guest virtual to guest physical translations, guest physical to host physical translations, and guest virtual to host physical translations.

In one embodiment, the CPUs 246, GPUs 239, and I/O devices 252 are integrated on a single semiconductor chip and/or chip package. The illustrated memory 249 may be integrated on the same chip or may be coupled to the memory controllers 248 via an off-chip interface. In one implementation, the memory 249 comprises GDDR6 memory which shares the same virtual address space as other physical system-level memories, although the underlying principles of the invention are not limited to this specific implementation.

In one embodiment, the tensor cores 244 include a plurality of execution units specifically designed to perform matrix operations, which are the fundamental compute operation used to perform deep learning operations. For example, simultaneous matrix multiplication operations may be used for neural network training and inferencing. The tensor cores 244 may perform matrix processing using a variety of operand precisions including single precision floating-point (e.g., 32 bits), half-precision floating point (e.g., 16 bits), integer words (16 bits), bytes (8 bits), and half-bytes (4 bits). In one embodiment, a neural network implementation extracts features of each rendered scene, potentially combining details from multiple frames, to construct a high-quality final image.

In deep learning implementations, parallel matrix multiplication work may be scheduled for execution on the tensor cores 244. The training of neural networks, in particular, requires a significant number of matrix dot product operations. In order to process an inner-product formulation of an N×N×N matrix multiply, the tensor cores 244 may include at least N dot-product processing elements. Before the matrix multiply begins, one entire matrix is loaded into tile registers and at least one column of a second matrix is loaded each cycle for N cycles. Each cycle, there are N dot products that are processed.

Matrix elements may be stored at different precisions depending on the particular implementation, including 16-bit words, 8-bit bytes (e.g., INT8) and 4-bit half-bytes (e.g., INT4). Different precision modes may be specified for the tensor cores 244 to ensure that the most efficient precision is used for different workloads (e.g., such as inferencing workloads which can tolerate quantization to bytes and half-bytes).

In one embodiment, the ray tracing cores 245 accelerate ray tracing operations for both real-time ray tracing and non-real-time ray tracing implementations. In particular, the ray tracing cores 245 include ray traversal/intersection circuitry for performing ray traversal using bounding volume hierarchies (BVHs) and identifying intersections between rays and primitives enclosed within the BVH volumes. The ray tracing cores 245 may also include circuitry for performing depth testing and culling (e.g., using a Z buffer or similar arrangement). In one implementation, the ray tracing cores 245 perform traversal and intersection operations in concert with the image denoising techniques described herein, at least a portion of which may be executed on the tensor cores 244. For example, in one embodiment, the tensor cores 244 implement a deep learning neural network to perform denoising of frames generated by the ray tracing cores 245. However, the CPU(s) 246, graphics cores 243, and/or ray tracing cores 245 may also implement all or a portion of the denoising and/or deep learning algorithms.

In addition, as described above, a distributed approach to denoising may be employed in which the GPU 239 is in a computing device coupled to other computing devices over a network or high speed interconnect. In this embodiment, the interconnected computing devices share neural network learning/training data to improve the speed with which the overall system learns to perform denoising for different types of image frames and/or different graphics applications.

In one embodiment, the ray tracing cores 245 process all BVH traversal and ray-primitive intersections, saving the graphics cores 243 from being overloaded with thousands of instructions per ray. In one embodiment, each ray tracing core 245 includes a first set of specialized circuitries for performing bounding box tests (e.g., for traversal operations) and a second set of specialized circuitry for performing the ray-triangle intersection tests (e.g., intersecting rays which have been traversed). Thus, in one embodiment, the multi-core group 240A can simply launch a ray probe, and the ray tracing cores 245 independently perform ray traversal and intersection and return hit data (e.g., a hit, no hit, multiple hits, etc.) to the thread context. The other cores 243, 244 are freed to perform other graphics or compute work while the ray tracing cores 245 perform the traversal and intersection operations.

In one embodiment, each ray tracing core 245 includes a traversal unit to perform BVH testing operations and an intersection unit which performs ray-primitive intersection tests. The intersection unit generates a "hit", "no hit", or "multiple hit" response, which it provides to the appropriate thread. During the traversal and intersection operations, the execution resources of the other cores (e.g., graphics cores 243 and tensor cores 244) are freed to perform other forms of graphics work.

In one particular embodiment described below, a hybrid rasterization/ray tracing approach is used in which work is distributed between the graphics cores 243 and ray tracing cores 245.

In one embodiment, the ray tracing cores 245 (and/or other cores 243, 244) include hardware support for a ray tracing instruction set such as Microsoft's DirectX Ray Tracing (DXR) which includes a DispatchRays command, as well as ray-generation, closest-hit, any-hit, and miss shaders, which enable the assignment of unique sets of shaders and textures for each object. Another ray tracing platform which may be supported by the ray tracing cores 245, graphics cores 243 and tensor cores 244 is Vulkan 1.1.85. Note, however, that the underlying principles of the invention are not limited to any particular ray tracing ISA.

In general, the various cores 245, 244, 243 may support a ray tracing instruction set that includes instructions/functions for ray generation, closest hit, any hit, ray-primitive intersection, per-primitive and hierarchical bounding box construction, miss, visit, and exceptions. More specifically, one embodiment includes ray tracing instructions to perform the following functions:

Ray Generation—Ray generation instructions may be executed for each pixel, sample, or other user-defined work assignment.

Closest Hit—A closest hit instruction may be executed to locate the closest intersection point of a ray with primitives within a scene.

Any Hit—An any hit instruction identifies multiple intersections between a ray and primitives within a scene, potentially to identify a new closest intersection point.

Intersection—An intersection instruction performs a ray-primitive intersection test and outputs a result.

Per-primitive Bounding box Construction—This instruction builds a bounding box around a given primitive or group of primitives (e.g., when building a new BVH or other acceleration data structure).

Miss—Indicates that a ray misses all geometry within a scene, or specified region of a scene.

Visit—Indicates the children volumes a ray will traverse.

Exceptions—Includes various types of exception handlers (e.g., invoked for various error conditions).

Figure 2D:
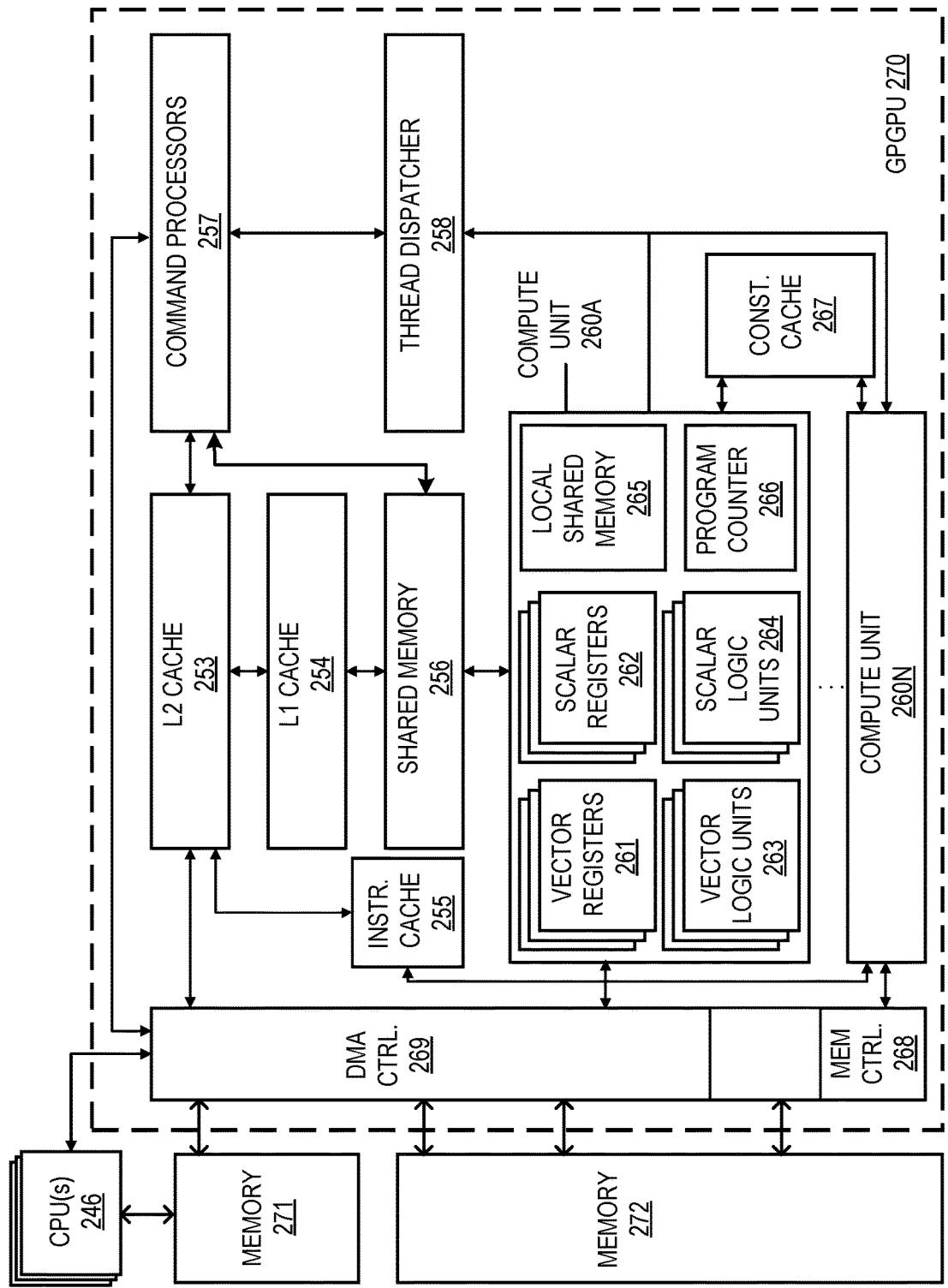

FIG. 2D is a block diagram of general purpose graphics processing unit (GPGPU) 270 that can be configured as a graphics processor and/or compute accelerator, according to embodiments described herein. The GPGPU 270 can interconnect with host processors (e.g., one or more CPU(s) 246) and memory 271, 272 via one or more system and/or memory busses. In one embodiment the memory 271 is system memory that may be shared with the one or more CPU(s) 246, while memory 272 is device memory that is dedicated to the GPGPU 270. In one embodiment, components within the GPGPU 270 and device memory 272 may be mapped into memory addresses that are accessible to the one or more CPU(s) 246. Access to memory 271 and 272 may be facilitated via a memory controller 268. In one embodiment the memory controller 268 includes an internal direct memory access (DMA) controller 269 or can include logic to perform operations that would otherwise be performed by a DMA controller.

The GPGPU 270 includes multiple cache memories, including an L2 cache 253, L1 cache 254, an instruction cache 255, and shared memory 256, at least a portion of which may also be partitioned as a cache memory. The GPGPU 270 also includes multiple compute units 260A-260N. Each compute unit 260A-260N includes a set of vector registers 261, scalar registers 262, vector logic units 263, and scalar logic units 264. The compute units 260A-260N can also include local shared memory 265 and a program counter 266. The compute units 260A-260N can couple with a constant cache 267, which can be used to store constant data, which is data that will not change during the run of kernel or shader program that executes on the GPGPU 270. In one embodiment the constant cache 267 is a scalar data cache and cached data can be fetched directly into the scalar registers 262.

During operation, the one or more CPU(s) 246 can write commands into registers or memory in the GPGPU 270 that has been mapped into an accessible address space. The command processors 257 can read the commands from registers or memory and determine how those commands will be processed within the GPGPU 270. A thread dispatcher 258 can then be used to dispatch threads to the compute units 260A-260N to perform those commands Each compute unit 260A-260N can execute threads independently of the other compute units. Additionally, each compute unit 260A-260N can be independently configured for conditional computation and can conditionally output the results of computation to memory. The command processors 257 can interrupt the one or more CPU(s) 246 when the submitted commands are complete.

Figure 3A:
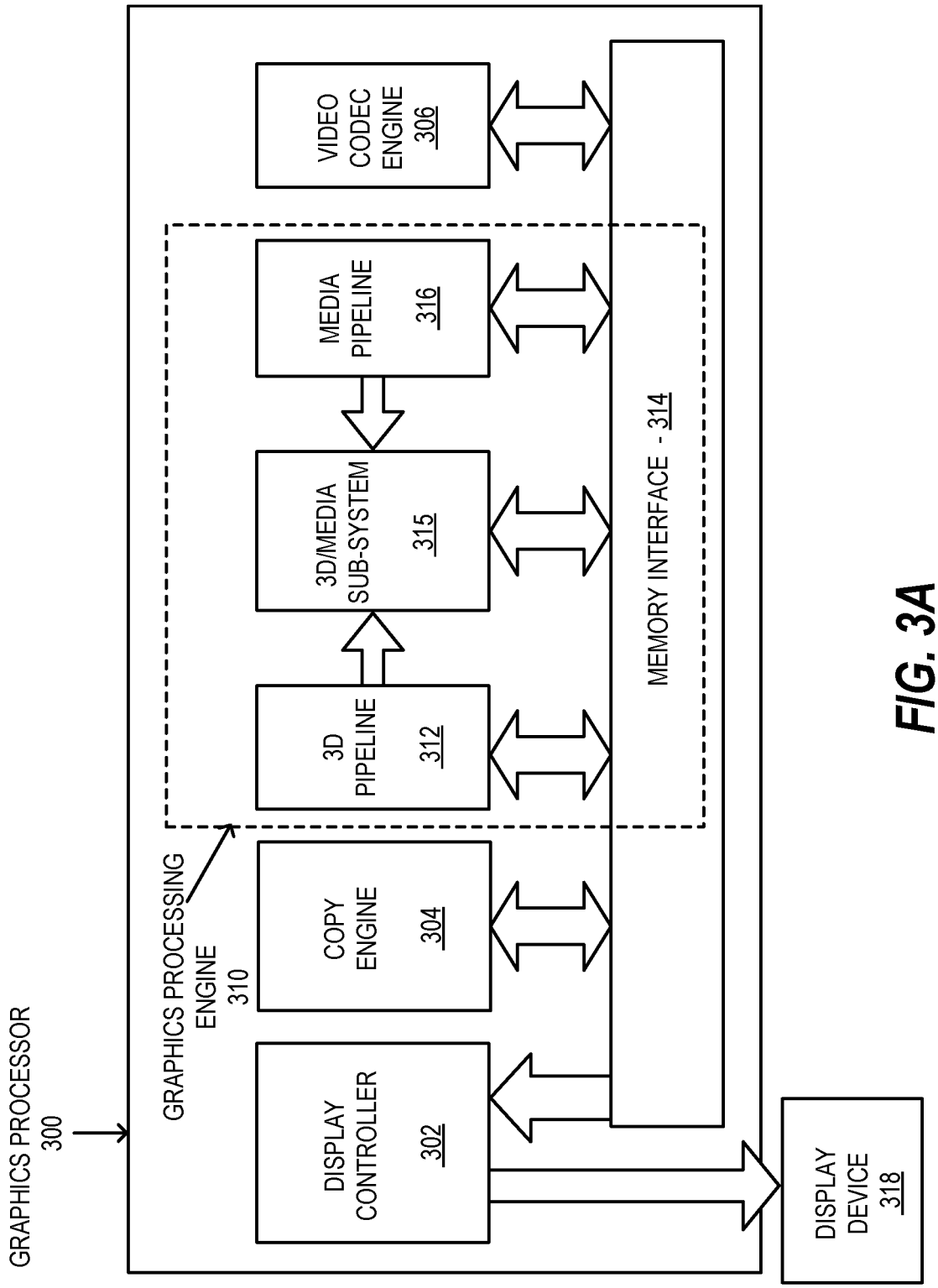
FIGS. 3A-3C illustrate block diagrams of additional graphics processor and compute accelerator architectures provided by embodiments described herein.
Figure 3B:
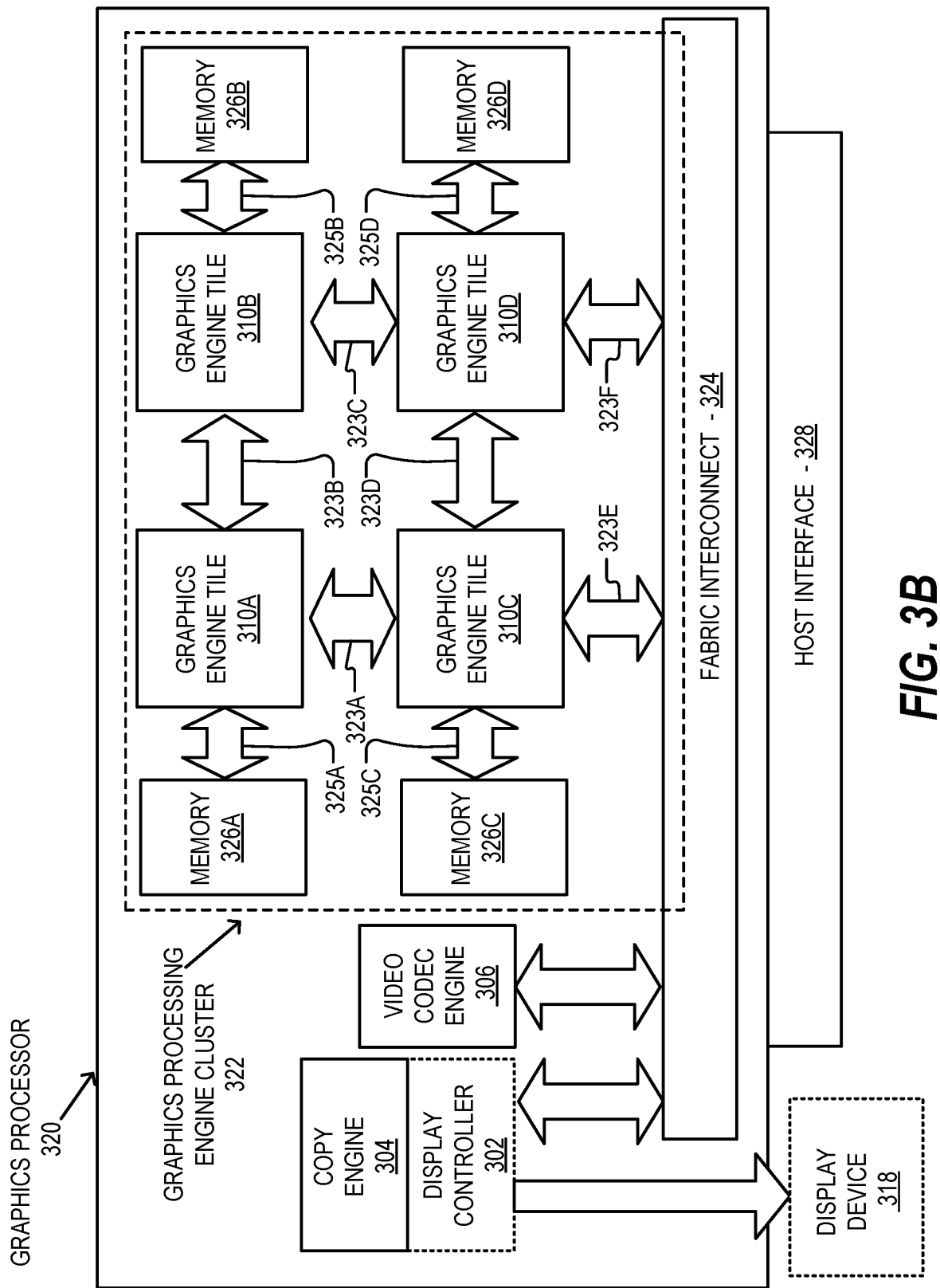
Figure 3C:
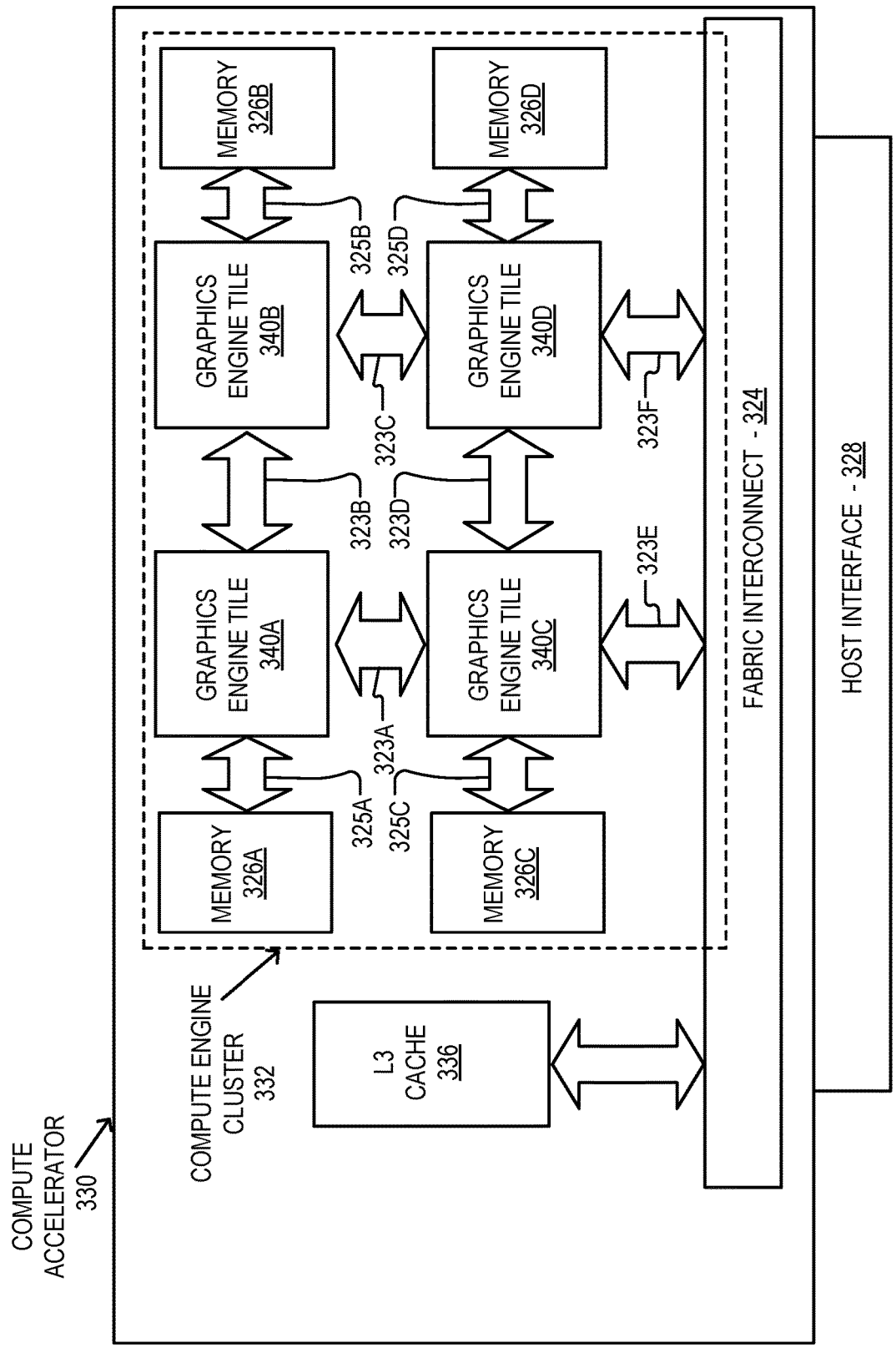

FIGS. 3A-3C illustrate block diagrams of additional graphics processor and compute accelerator architectures provided by embodiments described herein. The elements of FIGS. 3A-3C having the same reference numbers (or names) as the elements of any other figure herein can operate or function in any manner similar to that described elsewhere herein, but are not limited to such.

FIG. 3A is a block diagram of a graphics processor 300, which may be a discrete graphics processing unit, or may be a graphics processor integrated with a plurality of processing cores, or other semiconductor devices such as, but not limited to, memory devices or network interfaces. In some embodiments, the graphics processor communicates via a memory mapped I/O interface to registers on the graphics processor and with commands placed into the processor memory. In some embodiments, graphics processor 300 includes a memory interface 314 to access memory. Memory interface 314 can be an interface to local memory, one or more internal caches, one or more shared external caches, and/or to system memory.

In some embodiments, graphics processor 300 also includes a display controller 302 to drive display output data to a display device 318. Display controller 302 includes hardware for one or more overlay planes for the display and composition of multiple layers of video or user interface elements. The display device 318 can be an internal or external display device. In one embodiment the display device 318 is a head mounted display device, such as a virtual reality (VR) display device or an augmented reality (AR) display device. In some embodiments, graphics processor 300 includes a video codec engine 306 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, H.265/HEVC, Alliance for Open Media (AOMedia) VP8, VP9, as well as the Society of Motion Picture & Television Engineers (SMPTE) 421M/VC-1, and Joint Photographic Experts Group (JPEG) formats such as JPEG, and Motion JPEG (MJPEG) formats.

In some embodiments, graphics processor 300 includes a block image transfer (BLIT) engine 304 to perform two-dimensional (2D) rasterizer operations including, for example, bit-boundary block transfers. However, in one embodiment, 2D graphics operations are performed using one or more components of graphics processing engine (GPE) 310. In some embodiments, GPE 310 is a compute engine for performing graphics operations, including three-dimensional (3D) graphics operations and media operations.

In some embodiments, GPE 310 includes a 3D pipeline 312 for performing 3D operations, such as rendering three-dimensional images and scenes using processing functions that act upon 3D primitive shapes (e.g., rectangle, triangle, etc.). The 3D pipeline 312 includes programmable and fixed function elements that perform various tasks within the element and/or spawn execution threads to a 3D/Media sub-system 315. While 3D pipeline 312 can be used to perform media operations, an embodiment of GPE 310 also includes a media pipeline 316 that is specifically used to perform media operations, such as video post-processing and image enhancement.

In some embodiments, media pipeline 316 includes fixed function or programmable logic units to perform one or more specialized media operations, such as video decode acceleration, video de-interlacing, and video encode acceleration in place of, or on behalf of video codec engine 306. In some embodiments, media pipeline 316 additionally includes a thread spawning unit to spawn threads for execution on 3D/Media sub-system 315. The spawned threads perform computations for the media operations on one or more graphics execution units included in 3D/Media subsystem 315.

In some embodiments, 3D/Media subsystem 315 includes logic for executing threads spawned by 3D pipeline 312 and media pipeline 316. In one embodiment, the pipelines send thread execution requests to 3D/Media subsystem 315, which includes thread dispatch logic for arbitrating and dispatching the various requests to available thread execution resources. The execution resources include an array of graphics execution units to process the 3D and media threads. In some embodiments, 3D/Media subsystem 315 includes one or more internal caches for thread instructions and data. In some embodiments, the subsystem also includes shared memory, including registers and addressable memory, to share data between threads and to store output data.

FIG. 3B illustrates a graphics processor 320 having a tiled architecture, according to embodiments described herein. In one embodiment the graphics processor 320 includes a graphics processing engine cluster 322 having multiple instances of the graphics processing engine 310 of FIG. 3A within a graphics engine tile 310A-310D. Each graphics engine tile 310A-310D can be interconnected via a set of tile interconnects 323A-323F. Each graphics engine tile 310A-310D can also be connected to a memory module or memory device 326A-326D via memory interconnects 325A-325D. The memory devices 326A-326D can use any graphics memory technology. For example, the memory devices 326A-326D may be graphics double data rate (GDDR) memory. The memory devices 326A-326D, in one embodiment, are high-bandwidth memory (HBM) modules that can be on-die with their respective graphics engine tile 310A-310D. In one embodiment the memory devices 326A-326D are stacked memory devices that can be stacked on top of their respective graphics engine tile 310A-310D. In one embodiment, each graphics engine tile 310A-310D and associated memory 326A-326D reside on separate chiplets, which are bonded to a base die or base substrate, as described on further detail in FIGS. 11B-11D.

The graphics processing engine cluster 322 can connect with an on-chip or on-package fabric interconnect 324. The fabric interconnect 324 can enable communication between graphics engine tiles 310A-310D and components such as the video codec 306 and one or more copy engines 304. The copy engines 304 can be used to move data out of, into, and between the memory devices 326A-326D and memory that is external to the graphics processor 320 (e.g., system memory). The fabric interconnect 324 can also be used to interconnect the graphics engine tiles 310A-310D. The graphics processor 320 may optionally include a display controller 302 to enable a connection with an external display device 318. The graphics processor may also be configured as a graphics or compute accelerator. In the accelerator configuration, the display controller 302 and display device 318 may be omitted.

The graphics processor 320 can connect to a host system via a host interface 328. The host interface 328 can enable communication between the graphics processor 320, system memory, and/or other system components. The host interface 328 can be, for example a PCI express bus or another type of host system interface.

FIG. 3C illustrates a compute accelerator 330, according to embodiments described herein. The compute accelerator 330 can include architectural similarities with the graphics processor 320 of FIG. 3B and is optimized for compute acceleration. A compute engine cluster 332 can include a set of compute engine tiles 340A-340D that include execution logic that is optimized for parallel or vector-based general-purpose compute operations. In some embodiments, the compute engine tiles 340A-340D do not include fixed function graphics processing logic, although in one embodiment one or more of the compute engine tiles 340A-340D can include logic to perform media acceleration. The compute engine tiles 340A-340D can connect to memory 326A-326D via memory interconnects 325A-325D. The memory 326A-326D and memory interconnects 325A-325D may be similar technology as in graphics processor 320, or can be different. The graphics compute engine tiles 340A-340D can also be interconnected via a set of tile interconnects 323A-323F and may be connected with and/or interconnected by a fabric interconnect 324. In one embodiment the compute accelerator 330 includes a large L3 cache 336 that can be configured as a device-wide cache. The compute accelerator 330 can also connect to a host processor and memory via a host interface 328 in a similar manner as the graphics processor 320 of FIG. 3B.

Graphics Processing Engine

Figure 4:
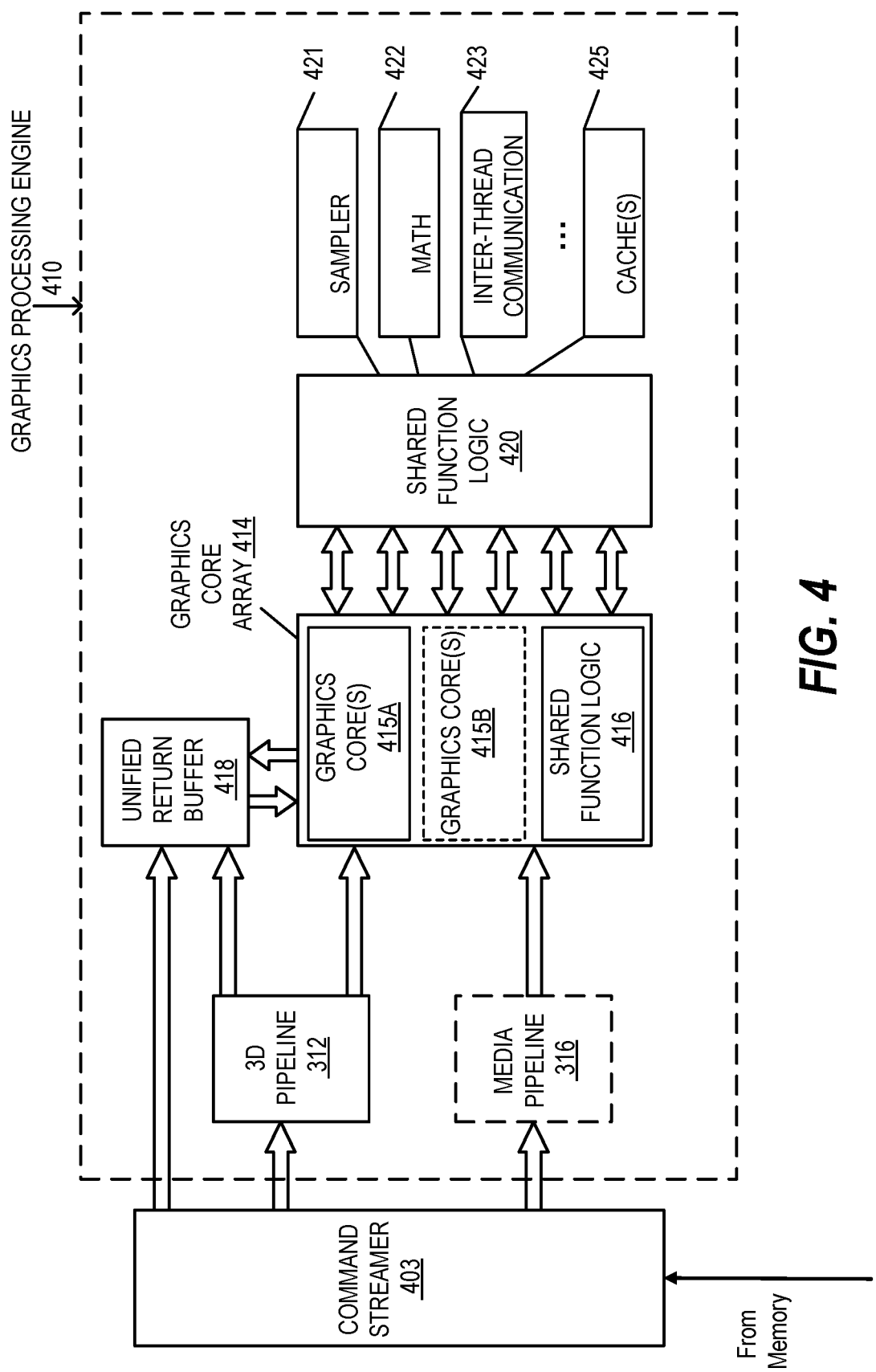
FIG. 4 is a block diagram of a graphics processing engine of a graphics processor in accordance with some embodiments.

FIG. 4 is a block diagram of a graphics processing engine 410 of a graphics processor in accordance with some embodiments. In one embodiment, the graphics processing engine (GPE) 410 is a version of the GPE 310 shown in FIG. 3A, and may also represent a graphics engine tile 310A-310D of FIG. 3B. Elements of FIG. 4 having the same reference numbers (or names) as the elements of any other figure herein can operate or function in any manner similar to that described elsewhere herein, but are not limited to such. For example, the 3D pipeline 312 and media pipeline 316 of FIG. 3A are illustrated. The media pipeline 316 is optional in some embodiments of the GPE 410 and may not be explicitly included within the GPE 410. For example, and in at least one embodiment, a separate media and/or image processor is coupled to the GPE 410.

In some embodiments, GPE 410 couples with or includes a command streamer 403, which provides a command stream to the 3D pipeline 312 and/or media pipelines 316. In some embodiments, command streamer 403 is coupled with memory, which can be system memory, or one or more of internal cache memory and shared cache memory. In some embodiments, command streamer 403 receives commands from the memory and sends the commands to 3D pipeline 312 and/or media pipeline 316. The commands are directives fetched from a ring buffer, which stores commands for the 3D pipeline 312 and media pipeline 316. In one embodiment, the ring buffer can additionally include batch command buffers storing batches of multiple commands. The commands for the 3D pipeline 312 can also include references to data stored in memory, such as but not limited to vertex and geometry data for the 3D pipeline 312 and/or image data and memory objects for the media pipeline 316. The 3D pipeline 312 and media pipeline 316 process the commands and data by performing operations via logic within the respective pipelines or by dispatching one or more execution threads to a graphics core array 414. In one embodiment the graphics core array 414 include one or more blocks of graphics cores (e.g., graphics core(s) 415A, graphics core(s) 415B), each block including one or more graphics cores. Each graphics core includes a set of graphics execution resources that includes general-purpose and graphics specific execution logic to perform graphics and compute operations, as well as fixed function texture processing and/or machine learning and artificial intelligence acceleration logic.

In various embodiments the 3D pipeline 312 can include fixed function and programmable logic to process one or more shader programs, such as vertex shaders, geometry shaders, pixel shaders, fragment shaders, compute shaders, or other shader programs, by processing the instructions and dispatching execution threads to the graphics core array 414. The graphics core array 414 provides a unified block of execution resources for use in processing these shader programs. Multi-purpose execution logic (e.g., execution units) within the graphics core(s) 415A-414B of the graphic core array 414 includes support for various 3D API shader languages and can execute multiple simultaneous execution threads associated with multiple shaders.

In some embodiments, the graphics core array 414 includes execution logic to perform media functions, such as video and/or image processing. In one embodiment, the execution units include general-purpose logic that is programmable to perform parallel general-purpose computational operations, in addition to graphics processing operations. The general-purpose logic can perform processing operations in parallel or in conjunction with general-purpose logic within the processor core(s) 107 of FIG. 1 or core 202A-202N as in FIG. 2A.

Output data generated by threads executing on the graphics core array 414 can output data to memory in a unified return buffer (URB) 418. The URB 418 can store data for multiple threads. In some embodiments the URB 418 may be used to send data between different threads executing on the graphics core array 414. In some embodiments the URB 418 may additionally be used for synchronization between threads on the graphics core array and fixed function logic within the shared function logic 420.

In some embodiments, graphics core array 414 is scalable, such that the array includes a variable number of graphics cores, each having a variable number of execution units based on the target power and performance level of GPE 410. In one embodiment the execution resources are dynamically scalable, such that execution resources may be enabled or disabled as needed.

The graphics core array 414 couples with shared function logic 420 that includes multiple resources that are shared between the graphics cores in the graphics core array. The shared functions within the shared function logic 420 are hardware logic units that provide specialized supplemental functionality to the graphics core array 414. In various embodiments, shared function logic 420 includes but is not limited to sampler 421, math 422, and inter-thread communication (ITC) 423 logic. Additionally, some embodiments implement one or more cache(s) 425 within the shared function logic 420.

A shared function is implemented at least in a case where the demand for a given specialized function is insufficient for inclusion within the graphics core array 414. Instead a single instantiation of that specialized function is implemented as a stand-alone entity in the shared function logic 420 and shared among the execution resources within the graphics core array 414. The precise set of functions that are shared between the graphics core array 414 and included within the graphics core array 414 varies across embodiments. In some embodiments, specific shared functions within the shared function logic 420 that are used extensively by the graphics core array 414 may be included within shared function logic 416 within the graphics core array 414. In various embodiments, the shared function logic 416 within the graphics core array 414 can include some or all logic within the shared function logic 420. In one embodiment, all logic elements within the shared function logic 420 may be duplicated within the shared function logic 416 of the graphics core array 414. In one embodiment the shared function logic 420 is excluded in favor of the shared function logic 416 within the graphics core array 414.

Execution Units

Figure 5A:
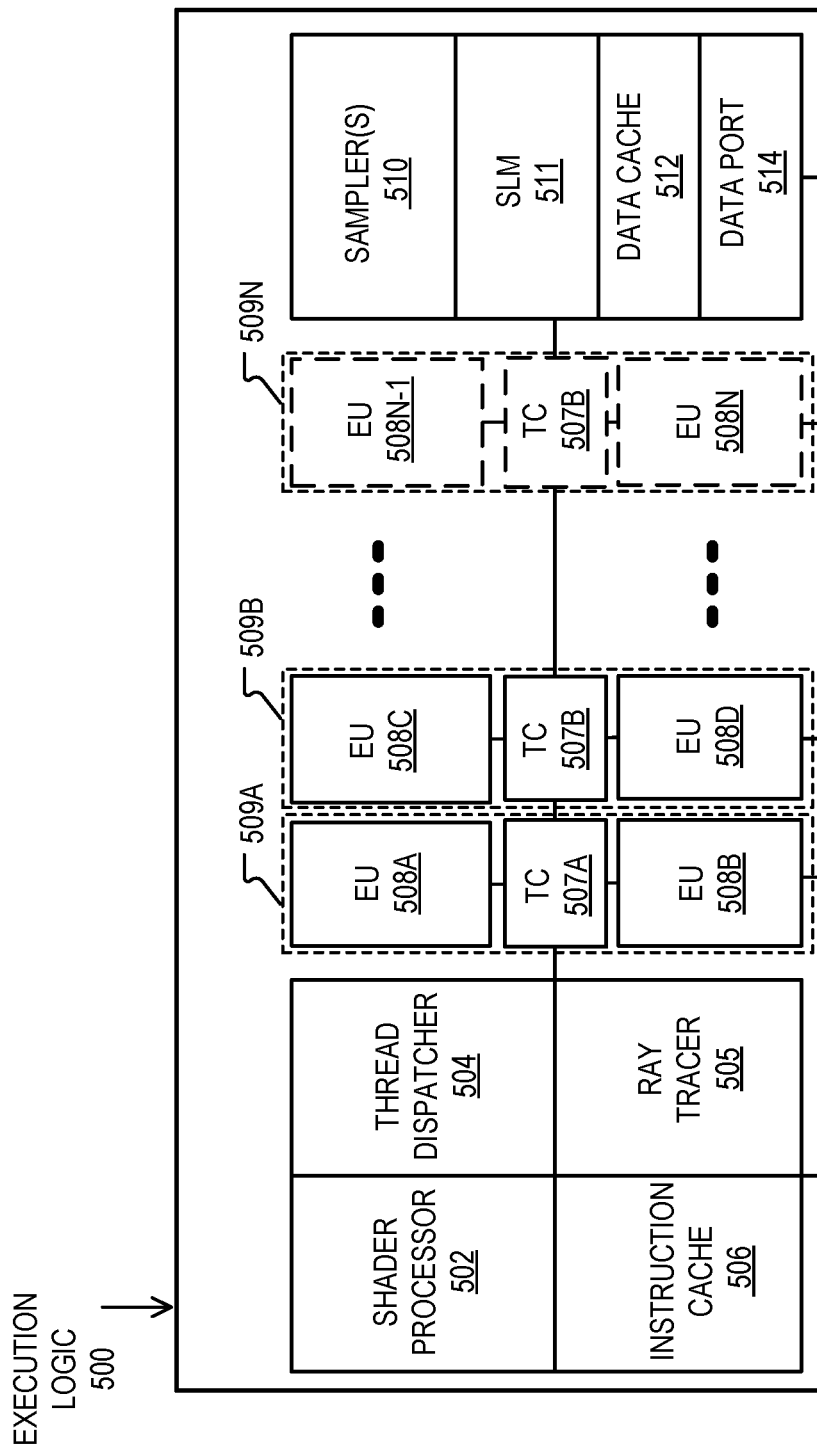
FIGS. 5A-5B illustrate thread execution logic including an array of processing elements employed in a graphics processor core according to embodiments described herein.
Figure 5B:
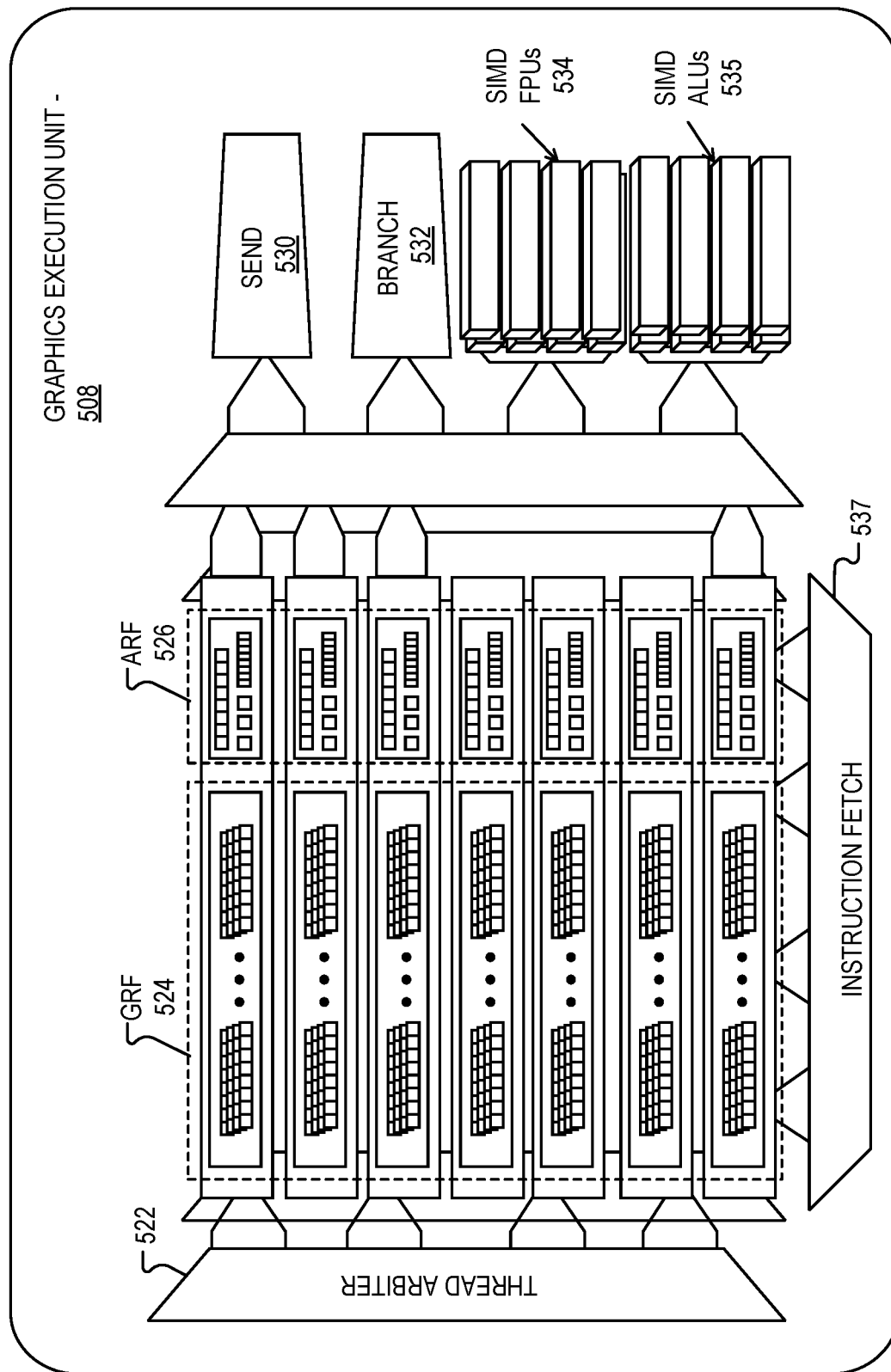

FIGS. 5A-5B illustrate thread execution logic 500 including an array of processing elements employed in a graphics processor core according to embodiments described herein. Elements of FIGS. 5A-5B having the same reference numbers (or names) as the elements of any other figure herein can operate or function in any manner similar to that described elsewhere herein, but are not limited to such. FIG. 5A-5B illustrates an overview of thread execution logic 500, which may be representative of hardware logic illustrated with each sub-core 221A-221F of FIG. 2B. FIG. 5A is representative of an execution unit within a general-purpose graphics processor, while FIG. 5B is representative of an execution unit that may be used within a compute accelerator.

As illustrated in FIG. 5A, in some embodiments thread execution logic 500 includes a shader processor 502, a thread dispatcher 504, instruction cache 506, a scalable execution unit array including a plurality of execution units 508A-508N, a sampler 510, shared local memory 511, a data cache 512, and a data port 514. In one embodiment the scalable execution unit array can dynamically scale by enabling or disabling one or more execution units (e.g., any of execution units 508A, 508B, 508C, 508D, through 508N-1 and 508N) based on the computational requirements of a workload. In one embodiment the included components are interconnected via an interconnect fabric that links to each of the components. In some embodiments, thread execution logic 500 includes one or more connections to memory, such as system memory or cache memory, through one or more of instruction cache 506, data port 514, sampler 510, and execution units 508A-508N. In some embodiments, each execution unit (e.g. 508A) is a stand-alone programmable general-purpose computational unit that is capable of executing multiple simultaneous hardware threads while processing multiple data elements in parallel for each thread. In various embodiments, the array of execution units 508A-508N is scalable to include any number individual execution units.

In some embodiments, the execution units 508A-508N are primarily used to execute shader programs. A shader processor 502 can process the various shader programs and dispatch execution threads associated with the shader programs via a thread dispatcher 504. In one embodiment the thread dispatcher includes logic to arbitrate thread initiation requests from the graphics and media pipelines and instantiate the requested threads on one or more execution unit in the execution units 508A-508N. For example, a geometry pipeline can dispatch vertex, tessellation, or geometry shaders to the thread execution logic for processing. In some embodiments, thread dispatcher 504 can also process runtime thread spawning requests from the executing shader programs.

In some embodiments, the execution units 508A-508N support an instruction set that includes native support for many standard 3D graphics shader instructions, such that shader programs from graphics libraries (e.g., Direct 3D and OpenGL) are executed with a minimal translation. The execution units support vertex and geometry processing (e.g., vertex programs, geometry programs, vertex shaders), pixel processing (e.g., pixel shaders, fragment shaders) and general-purpose processing (e.g., compute and media shaders). Each of the execution units 508A-508N is capable of multi-issue single instruction multiple data (SIMD) execution and multi-threaded operation enables an efficient execution environment in the face of higher latency memory accesses. Each hardware thread within each execution unit has a dedicated high-bandwidth register file and associated independent thread-state. Execution is multi-issue per clock to pipelines capable of integer, single and double precision floating point operations, SIMD branch capability, logical operations, transcendental operations, and other miscellaneous operations. While waiting for data from memory or one of the shared functions, dependency logic within the execution units 508A-508N causes a waiting thread to sleep until the requested data has been returned. While the waiting thread is sleeping, hardware resources may be devoted to processing other threads. For example, during a delay associated with a vertex shader operation, an execution unit can perform operations for a pixel shader, fragment shader, or another type of shader program, including a different vertex shader. Various embodiments can apply to use execution by use of Single Instruction Multiple Thread (SIMT) as an alternate to use of SIMD or in addition to use of SIMD. Reference to a SIMD core or operation can apply also to SIMT or apply to SIMD in combination with SIMT.

Each execution unit in execution units 508A-508N operates on arrays of data elements. The number of data elements is the "execution size," or the number of channels for the instruction. An execution channel is a logical unit of execution for data element access, masking, and flow control within instructions. The number of channels may be independent of the number of physical Arithmetic Logic Units (ALUs) or Floating Point Units (FPUs) for a particular graphics processor. In some embodiments, execution units 508A-508N support integer and floating-point data types.

The execution unit instruction set includes SIMD instructions. The various data elements can be stored as a packed data type in a register and the execution unit will process the various elements based on the data size of the elements. For example, when operating on a 256-bit wide vector, the 256 bits of the vector are stored in a register and the execution unit operates on the vector as four separate 54-bit packed data elements (Quad-Word (QW) size data elements), eight separate 32-bit packed data elements (Double Word (DW) size data elements), sixteen separate 16-bit packed data elements (Word (W) size data elements), or thirty-two separate 8-bit data elements (byte (B) size data elements). However, different vector widths and register sizes are possible.

In one embodiment one or more execution units can be combined into a fused execution unit 509A-509N having thread control logic (507A-507N) that is common to the fused EUs. Multiple EUs can be fused into an EU group. Each EU in the fused EU group can be configured to execute a separate SIMD hardware thread. The number of EUs in a fused EU group can vary according to embodiments. Additionally, various SIMD widths can be performed per-EU, including but not limited to SIMD8, SIMD16, and SIMD32. Each fused graphics execution unit 509A-509N includes at least two execution units. For example, fused execution unit 509A includes a first EU 508A, second EU 508B, and thread control logic 507A that is common to the first EU 508A and the second EU 508B. The thread control logic 507A controls threads executed on the fused graphics execution unit 509A, allowing each EU within the fused execution units 509A-509N to execute using a common instruction pointer register.

One or more internal instruction caches (e.g., 506) are included in the thread execution logic 500 to cache thread instructions for the execution units. In some embodiments, one or more data caches (e.g., 512) are included to cache thread data during thread execution. Threads executing on the execution logic 500 can also store explicitly managed data in the shared local memory 511. In some embodiments, a sampler 510 is included to provide texture sampling for 3D operations and media sampling for media operations. In some embodiments, sampler 510 includes specialized texture or media sampling functionality to process texture or media data during the sampling process before providing the sampled data to an execution unit.

During execution, the graphics and media pipelines send thread initiation requests to thread execution logic 500 via thread spawning and dispatch logic. Once a group of geometric objects has been processed and rasterized into pixel data, pixel processor logic (e.g., pixel shader logic, fragment shader logic, etc.) within the shader processor 502 is invoked to further compute output information and cause results to be written to output surfaces (e.g., color buffers, depth buffers, stencil buffers, etc.). In some embodiments, a pixel shader or fragment shader calculates the values of the various vertex attributes that are to be interpolated across the rasterized object. In some embodiments, pixel processor logic within the shader processor 502 then executes an application programming interface (API)-supplied pixel or fragment shader program. To execute the shader program, the shader processor 502 dispatches threads to an execution unit (e.g., 508A) via thread dispatcher 504. In some embodiments, shader processor 502 uses texture sampling logic in the sampler 510 to access texture data in texture maps stored in memory. Arithmetic operations on the texture data and the input geometry data compute pixel color data for each geometric fragment, or discards one or more pixels from further processing.

In some embodiments, the data port 514 provides a memory access mechanism for the thread execution logic 500 to output processed data to memory for further processing on a graphics processor output pipeline. In some embodiments, the data port 514 includes or couples to one or more cache memories (e.g., data cache 512) to cache data for memory access via the data port.

In one embodiment, the execution logic 500 can also include a ray tracer 505 that can provide ray tracing acceleration functionality. The ray tracer 505 can support a ray tracing instruction set that includes instructions/functions for ray generation. The ray tracing instruction set can be similar to or different from the ray-tracing instruction set supported by the ray tracing cores 245 in FIG. 2C.

FIG. 5B illustrates exemplary internal details of an execution unit 508, according to embodiments. A graphics execution unit 508 can include an instruction fetch unit 537, a general register file array (GRF) 524, an architectural register file array (ARF) 526, a thread arbiter 522, a send unit 530, a branch unit 532, a set of SIMD floating point units (FPUs) 534, and in one embodiment a set of dedicated integer SIMD ALUs 535. The GRF 524 and ARF 526 includes the set of general register files and architecture register files associated with each simultaneous hardware thread that may be active in the graphics execution unit 508. In one embodiment, per thread architectural state is maintained in the ARF 526, while data used during thread execution is stored in the GRF 524. The execution state of each thread, including the instruction pointers for each thread, can be held in thread-specific registers in the ARF 526.

In one embodiment the graphics execution unit 508 has an architecture that is a combination of Simultaneous Multi-Threading (SMT) and fine-grained Interleaved Multi-Threading (IMT). The architecture has a modular configuration that can be fine-tuned at design time based on a target number of simultaneous threads and number of registers per execution unit, where execution unit resources are divided across logic used to execute multiple simultaneous threads. The number of logical threads that may be executed by the graphics execution unit 508 is not limited to the number of hardware threads, and multiple logical threads can be assigned to each hardware thread.

In one embodiment, the graphics execution unit 508 can co-issue multiple instructions, which may each be different instructions. The thread arbiter 522 of the graphics execution unit thread 508 can dispatch the instructions to one of the send unit 530, branch unit 532, or SIMD FPU(s) 534 for execution. Each execution thread can access 128 general-purpose registers within the GRF 524, where each register can store 32 bytes, accessible as a SIMD 8-element vector of 32-bit data elements. In one embodiment, each execution unit thread has access to 4 Kbytes within the GRF 524, although embodiments are not so limited, and greater or fewer register resources may be provided in other embodiments. In one embodiment the graphics execution unit 508 is partitioned into seven hardware threads that can independently perform computational operations, although the number of threads per execution unit can also vary according to embodiments. For example, in one embodiment up to 16 hardware threads are supported. In an embodiment in which seven threads may access 4 Kbytes, the GRF 524 can store a total of 28 Kbytes. Where 16 threads may access 4 Kbytes, the GRF 524 can store a total of 64 Kbytes. Flexible addressing modes can permit registers to be addressed together to build effectively wider registers or to represent strided rectangular block data structures.

In one embodiment, memory operations, sampler operations, and other longer-latency system communications are dispatched via "send" instructions that are executed by the message passing send unit 530. In one embodiment, branch instructions are dispatched to a dedicated branch unit 532 to facilitate SIMD divergence and eventual convergence.

In one embodiment the graphics execution unit 508 includes one or more SIMD floating point units (FPU(s)) 534 to perform floating-point operations. In one embodiment, the FPU(s) 534 also support integer computation. In one embodiment the FPU(s) 534 can SIMD execute up to M number of 32-bit floating-point (or integer) operations, or SIMD execute up to 2M 16-bit integer or 16-bit floating-point operations. In one embodiment, at least one of the FPU(s) provides extended math capability to support high-throughput transcendental math functions and double precision 54-bit floating-point. In some embodiments, a set of 8-bit integer SIMD ALUs 535 are also present, and may be specifically optimized to perform operations associated with machine learning computations.

In one embodiment, arrays of multiple instances of the graphics execution unit 508 can be instantiated in a graphics sub-core grouping (e.g., a sub-slice). For scalability, product architects can choose the exact number of execution units per sub-core grouping. In one embodiment the execution unit 508 can execute instructions across a plurality of execution channels. In a further embodiment, each thread executed on the graphics execution unit 508 is executed on a different channel.

Figure 6:
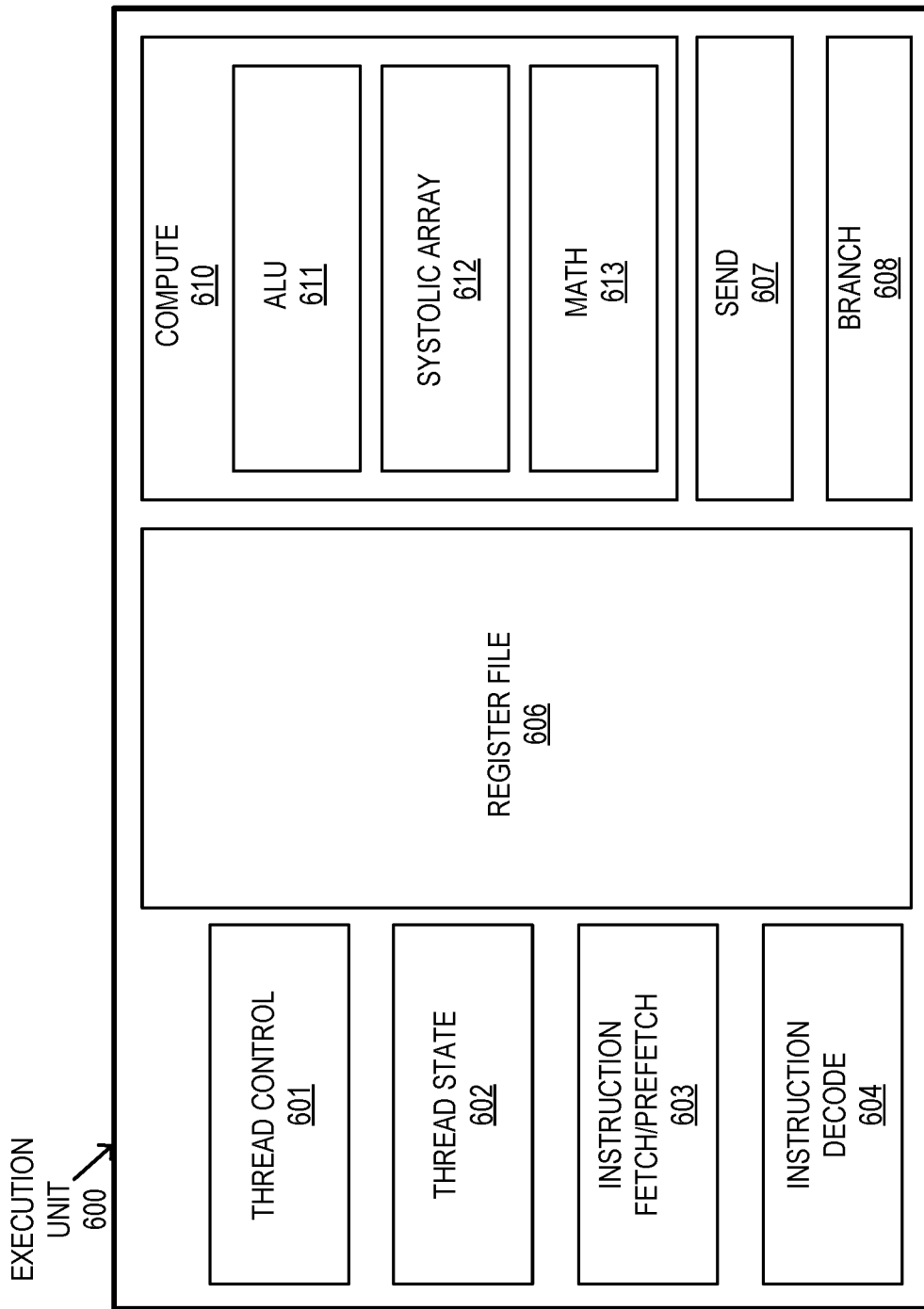
FIG. 6 illustrates an additional execution unit, according to an embodiment.

FIG. 6 illustrates an additional execution unit 600, according to an embodiment. The execution unit 600 may be a compute-optimized execution unit for use in, for example, a compute engine tile 340A-340D as in FIG. 3C, but is not limited as such. Variants of the execution unit 600 may also be used in a graphics engine tile 310A-310D as in FIG. 3B. In one embodiment, the execution unit 600 includes a thread control unit 601, a thread state unit 602, an instruction fetch/prefetch unit 603, and an instruction decode unit 604. The execution unit 600 additionally includes a register file 606 that stores registers that can be assigned to hardware threads within the execution unit. The execution unit 600 additionally includes a send unit 607 and a branch unit 608. In one embodiment, the send unit 607 and branch unit 608 can operate similarly as the send unit 530 and a branch unit 532 of the graphics execution unit 508 of FIG. 5B.

The execution unit 600 also includes a compute unit 610 that includes multiple different types of functional units. In one embodiment the compute unit 610 includes an ALU unit 611 that includes an array of arithmetic logic units. The ALU unit 611 can be configured to perform 64-bit, 32-bit, and 16-bit integer and floating point operations. Integer and floating point operations may be performed simultaneously.

The compute unit 610 can also include a systolic array 612, and a math unit 613. The systolic array 612 includes a W wide and D deep network of data processing units that can be used to perform vector or other data-parallel operations in a systolic manner In one embodiment the systolic array 612 can be configured to perform matrix operations, such as matrix dot product operations. In one embodiment the systolic array 612 support 16-bit floating point operations, as well as 8-bit and 4-bit integer operations. In one embodiment the systolic array 612 can be configured to accelerate machine learning operations. In such embodiments, the systolic array 612 can be configured with support for the bfloat 16-bit floating point format. In one embodiment, a math unit 613 can be included to perform a specific subset of mathematical operations in an efficient and lower-power manner than then ALU unit 611. The math unit 613 can include a variant of math logic that may be found in shared function logic of a graphics processing engine provided by other embodiments (e.g., math logic 422 of the shared function logic 420 of FIG. 4). In one embodiment the math unit 613 can be configured to perform 32-bit and 64-bit floating point operations.

The thread control unit 601 includes logic to control the execution of threads within the execution unit. The thread control unit 601 can include thread arbitration logic to start, stop, and preempt execution of threads within the execution unit 600. The thread state unit 602 can be used to store thread state for threads assigned to execute on the execution unit 600. Storing the thread state within the execution unit 600 enables the rapid pre-emption of threads when those threads become blocked or idle. The instruction fetch/prefetch unit 603 can fetch instructions from an instruction cache of higher level execution logic (e.g., instruction cache 506 as in FIG. 5A). The instruction fetch/prefetch unit 603 can also issue prefetch requests for instructions to be loaded into the instruction cache based on an analysis of currently executing threads. The instruction decode unit 604 can be used to decode instructions to be executed by the compute units. In one embodiment, the instruction decode unit 604 can be used as a secondary decoder to decode complex instructions into constituent micro-operations.

The execution unit 600 additionally includes a register file 606 that can be used by hardware threads executing on the execution unit 600. Registers in the register file 606 can be divided across the logic used to execute multiple simultaneous threads within the compute unit 610 of the execution unit 600. The number of logical threads that may be executed by the graphics execution unit 600 is not limited to the number of hardware threads, and multiple logical threads can be assigned to each hardware thread. The size of the register file 606 can vary across embodiments based on the number of supported hardware threads. In one embodiment, register renaming may be used to dynamically allocate registers to hardware threads.

Figure 7:
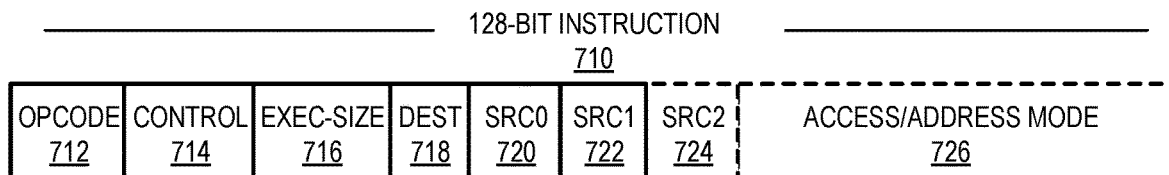
FIG. 7 is a block diagram illustrating a graphics processor instruction formats according to some embodiments.
Figure 7:
Figure 7:
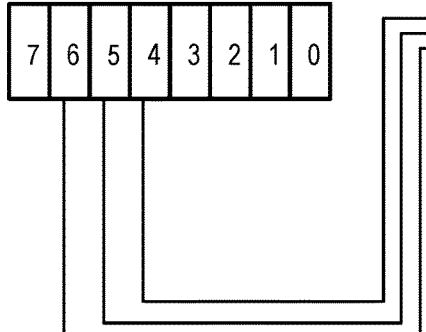

FIG. 7 is a block diagram illustrating a graphics processor instruction formats 700 according to some embodiments. In one or more embodiment, the graphics processor execution units support an instruction set having instructions in multiple formats. The solid lined boxes illustrate the components that are generally included in an execution unit instruction, while the dashed lines include components that are optional or that are only included in a sub-set of the instructions. In some embodiments, instruction format 700 described and illustrated are macro-instructions, in that they are instructions supplied to the execution unit, as opposed to micro-operations resulting from instruction decode once the instruction is processed.

In some embodiments, the graphics processor execution units natively support instructions in a 128-bit instruction format 710. A 64-bit compacted instruction format 730 is available for some instructions based on the selected instruction, instruction options, and number of operands. The native 128-bit instruction format 710 provides access to all instruction options, while some options and operations are restricted in the 64-bit format 730. The native instructions available in the 64-bit format 730 vary by embodiment. In some embodiments, the instruction is compacted in part using a set of index values in an index field 713. The execution unit hardware references a set of compaction tables based on the index values and uses the compaction table outputs to reconstruct a native instruction in the 128-bit instruction format 710. Other sizes and formats of instruction can be used.

For each format, instruction opcode 712 defines the operation that the execution unit is to perform. The execution units execute each instruction in parallel across the multiple data elements of each operand. For example, in response to an add instruction the execution unit performs a simultaneous add operation across each color channel representing a texture element or picture element. By default, the execution unit performs each instruction across all data channels of the operands. In some embodiments, instruction control field 714 enables control over certain execution options, such as channels selection (e.g., predication) and data channel order (e.g., swizzle). For instructions in the 128-bit instruction format 710 an exec-size field 716 limits the number of data channels that will be executed in parallel. In some embodiments, exec-size field 716 is not available for use in the 64-bit compact instruction format 730.

Some execution unit instructions have up to three operands including two source operands, src0 720, src1 722, and one destination 718. In some embodiments, the execution units support dual destination instructions, where one of the destinations is implied. Data manipulation instructions can have a third source operand (e.g., SRC2 724), where the instruction opcode 712 determines the number of source operands. An instruction's last source operand can be an immediate (e.g., hard-coded) value passed with the instruction.

In some embodiments, the 128-bit instruction format 710 includes an access/address mode field 726 specifying, for example, whether direct register addressing mode or indirect register addressing mode is used. When direct register addressing mode is used, the register address of one or more operands is directly provided by bits in the instruction.

In some embodiments, the 128-bit instruction format 710 includes an access/address mode field 726, which specifies an address mode and/or an access mode for the instruction. In one embodiment the access mode is used to define a data access alignment for the instruction. Some embodiments support access modes including a 16-byte aligned access mode and a 1-byte aligned access mode, where the byte alignment of the access mode determines the access alignment of the instruction operands. For example, when in a first mode, the instruction may use byte-aligned addressing for source and destination operands and when in a second mode, the instruction may use 16-byte-aligned addressing for all source and destination operands.

In one embodiment, the address mode portion of the access/address mode field 726 determines whether the instruction is to use direct or indirect addressing. When direct register addressing mode is used bits in the instruction directly provide the register address of one or more operands. When indirect register addressing mode is used, the register address of one or more operands may be computed based on an address register value and an address immediate field in the instruction.

In some embodiments instructions are grouped based on opcode 712 bit-fields to simplify Opcode decode 740. For an 8-bit opcode, bits 4, 5, and 6 allow the execution unit to determine the type of opcode. The precise opcode grouping shown is merely an example. In some embodiments, a move and logic opcode group 742 includes data movement and logic instructions (e.g., move (mov), compare (cmp)). In some embodiments, move and logic group 742 shares the five most significant bits (MSB), where move (mov) instructions are in the form of 0000xxxxb and logic instructions are in the form of 0001xxxxb. A flow control instruction group 744 (e.g., call, jump (jmp)) includes instructions in the form of 0010xxxxb (e.g., 0x20). A miscellaneous instruction group 746 includes a mix of instructions, including synchronization instructions (e.g., wait, send) in the form of 0011xxxxb (e.g., 0x30). A parallel math instruction group 748 includes component-wise arithmetic instructions (e.g., add, multiply (mul)) in the form of 0100xxxxb (e.g., 0x40). The parallel math group 748 performs the arithmetic operations in parallel across data channels. The vector math group 750 includes arithmetic instructions (e.g., dp4) in the form of 0101xxxxb (e.g., 0x50). The vector math group performs arithmetic such as dot product calculations on vector operands. The illustrated opcode decode 740, in one embodiment, can be used to determine which portion of an execution unit will be used to execute a decoded instruction. For example, some instructions may be designated as systolic instructions that will be performed by a systolic array. Other instructions, such as ray-tracing instructions (not shown) can be routed to a ray-tracing core or ray-tracing logic within a slice or partition of execution logic.

Graphics Pipeline

Figure 8:
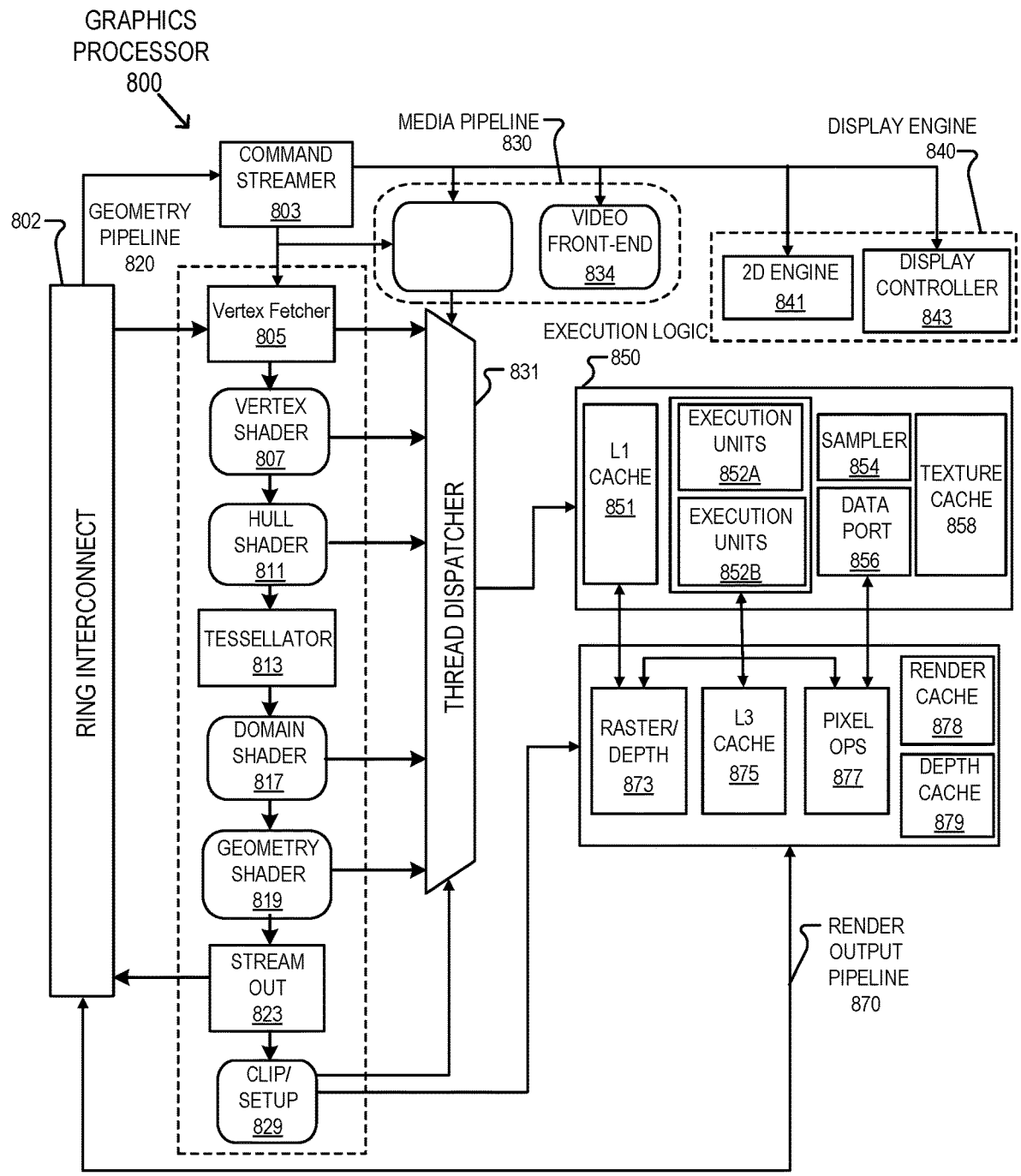
FIG. 8 is a block diagram of another embodiment of a graphics processor.

FIG. 8 is a block diagram of another embodiment of a graphics processor 800. Elements of FIG. 8 having the same reference numbers (or names) as the elements of any other figure herein can operate or function in any manner similar to that described elsewhere herein, but are not limited to such.

In some embodiments, graphics processor 800 includes a geometry pipeline 820, a media pipeline 830, a display engine 840, thread execution logic 850, and a render output pipeline 870. In some embodiments, graphics processor 800 is a graphics processor within a multi-core processing system that includes one or more general-purpose processing cores. The graphics processor is controlled by register writes to one or more control registers (not shown) or via commands issued to graphics processor 800 via a ring interconnect 802. In some embodiments, ring interconnect 802 couples graphics processor 800 to other processing components, such as other graphics processors or general-purpose processors. Commands from ring interconnect 802 are interpreted by a command streamer 803, which supplies instructions to individual components of the geometry pipeline 820 or the media pipeline 830.

In some embodiments, command streamer 803 directs the operation of a vertex fetcher 805 that reads vertex data from memory and executes vertex-processing commands provided by command streamer 803. In some embodiments, vertex fetcher 805 provides vertex data to a vertex shader 807, which performs coordinate space transformation and lighting operations to each vertex. In some embodiments, vertex fetcher 805 and vertex shader 807 execute vertex-processing instructions by dispatching execution threads to execution units 852A-852B via a thread dispatcher 831.

In some embodiments, execution units 852A-852B are an array of vector processors having an instruction set for performing graphics and media operations. In some embodiments, execution units 852A-852B have an attached L1 cache 851 that is specific for each array or shared between the arrays. The cache can be configured as a data cache, an instruction cache, or a single cache that is partitioned to contain data and instructions in different partitions.

In some embodiments, geometry pipeline 820 includes tessellation components to perform hardware-accelerated tessellation of 3D objects. In some embodiments, a programmable hull shader 811 configures the tessellation operations. A programmable domain shader 817 provides back-end evaluation of tessellation output. A tessellator 813 operates at the direction of hull shader 811 and contains special purpose logic to generate a set of detailed geometric objects based on a coarse geometric model that is provided as input to geometry pipeline 820. In some embodiments, if tessellation is not used, tessellation components (e.g., hull shader 811, tessellator 813, and domain shader 817) can be bypassed.

In some embodiments, complete geometric objects can be processed by a geometry shader 819 via one or more threads dispatched to execution units 852A-852B, or can proceed directly to the clipper 829. In some embodiments, the geometry shader operates on entire geometric objects, rather than vertices or patches of vertices as in previous stages of the graphics pipeline. If the tessellation is disabled, the geometry shader 819 receives input from the vertex shader 807. In some embodiments, geometry shader 819 is programmable by a geometry shader program to perform geometry tessellation if the tessellation units are disabled.

Before rasterization, a clipper 829 processes vertex data. The clipper 829 may be a fixed function clipper or a programmable clipper having clipping and geometry shader functions. In some embodiments, a rasterizer and depth test component 873 in the render output pipeline 870 dispatches pixel shaders to convert the geometric objects into per pixel representations. In some embodiments, pixel shader logic is included in thread execution logic 850. In some embodiments, an application can bypass the rasterizer and depth test component 873 and access un-rasterized vertex data via a stream out unit 823.

The graphics processor 800 has an interconnect bus, interconnect fabric, or some other interconnect mechanism that allows data and message passing amongst the major components of the processor. In some embodiments, execution units 852A-852B and associated logic units (e.g., L1 cache 851, sampler 854, texture cache 858, etc.) interconnect via a data port 856 to perform memory access and communicate with render output pipeline components of the processor. In some embodiments, sampler 854, caches 851, 858 and execution units 852A-852B each have separate memory access paths. In one embodiment the texture cache 858 can also be configured as a sampler cache.

In some embodiments, render output pipeline 870 contains a rasterizer and depth test component 873 that converts vertex-based objects into an associated pixel-based representation. In some embodiments, the rasterizer logic includes a windower/masker unit to perform fixed function triangle and line rasterization. An associated render cache 878 and depth cache 879 are also available in some embodiments. A pixel operations component 877 performs pixel-based operations on the data, though in some instances, pixel operations associated with 2D operations (e.g. bit block image transfers with blending) are performed by the 2D engine 841, or substituted at display time by the display controller 843 using overlay display planes. In some embodiments, a shared L3 cache 875 is available to all graphics components, allowing the sharing of data without the use of main system memory.

In some embodiments, graphics processor media pipeline 830 includes a media engine 837 and a video front-end 834. In some embodiments, video front-end 834 receives pipeline commands from the command streamer 803. In some embodiments, media pipeline 830 includes a separate command streamer. In some embodiments, video front-end 834 processes media commands before sending the command to the media engine 837. In some embodiments, media engine 837 includes thread spawning functionality to spawn threads for dispatch to thread execution logic 850 via thread dispatcher 831.

In some embodiments, graphics processor 800 includes a display engine 840. In some embodiments, display engine 840 is external to processor 800 and couples with the graphics processor via the ring interconnect 802, or some other interconnect bus or fabric. In some embodiments, display engine 840 includes a 2D engine 841 and a display controller 843. In some embodiments, display engine 840 contains special purpose logic capable of operating independently of the 3D pipeline. In some embodiments, display controller 843 couples with a display device (not shown), which may be a system integrated display device, as in a laptop computer, or an external display device attached via a display device connector.

In some embodiments, the geometry pipeline 820 and media pipeline 830 are configurable to perform operations based on multiple graphics and media programming interfaces and are not specific to any one application programming interface (API). In some embodiments, driver software for the graphics processor translates API calls that are specific to a particular graphics or media library into commands that can be processed by the graphics processor. In some embodiments, support is provided for the Open Graphics Library (OpenGL), Open Computing Language (OpenCL), and/or Vulkan graphics and compute API, all from the Khronos Group. In some embodiments, support may also be provided for the Direct3D library from the Microsoft Corporation. In some embodiments, a combination of these libraries may be supported. Support may also be provided for the Open Source Computer Vision Library (OpenCV). A future API with a compatible 3D pipeline would also be supported if a mapping can be made from the pipeline of the future API to the pipeline of the graphics processor.

Graphics Pipeline Programming

Figure 9A:
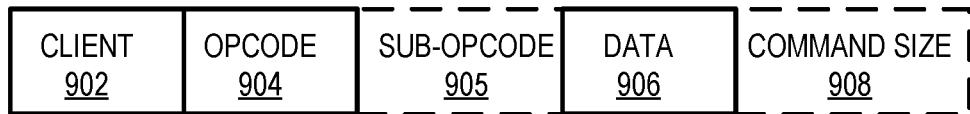
FIG. 9A is a block diagram illustrating a graphics processor command format according to some embodiments.
Figure 9B:
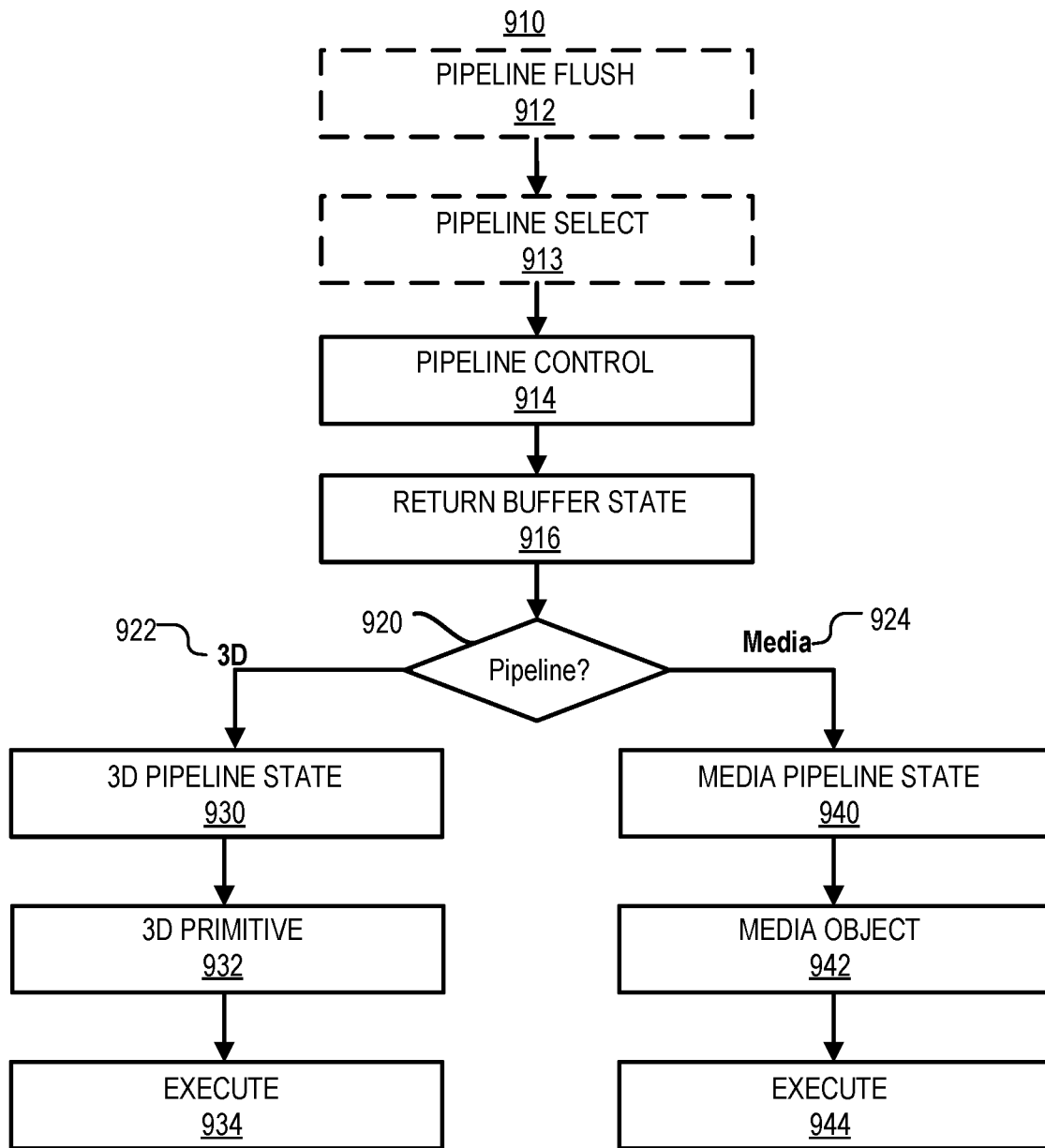
FIG. 9B is a block diagram illustrating a graphics processor command sequence according to an embodiment.

FIG. 9A is a block diagram illustrating a graphics processor command format 900 according to some embodiments. FIG. 9B is a block diagram illustrating a graphics processor command sequence 910 according to an embodiment. The solid lined boxes in FIG. 9A illustrate the components that are generally included in a graphics command while the dashed lines include components that are optional or that are only included in a sub-set of the graphics commands. The exemplary graphics processor command format 900 of FIG. 9A includes data fields to identify a client 902, a command operation code (opcode) 904, and data 906 for the command A sub-opcode 905 and a command size 908 are also included in some commands.

In some embodiments, client 902 specifies the client unit of the graphics device that processes the command data. In some embodiments, a graphics processor command parser examines the client field of each command to condition the further processing of the command and route the command data to the appropriate client unit. In some embodiments, the graphics processor client units include a memory interface unit, a render unit, a 2D unit, a 3D unit, and a media unit. Each client unit has a corresponding processing pipeline that processes the commands Once the command is received by the client unit, the client unit reads the opcode 904 and, if present, sub-opcode 905 to determine the operation to perform. The client unit performs the command using information in data field 906. For some commands an explicit command size 908 is expected to specify the size of the command In some embodiments, the command parser automatically determines the size of at least some of the commands based on the command opcode. In some embodiments commands are aligned via multiples of a double word. Other command formats can be used.

The flow diagram in FIG. 9B illustrates an exemplary graphics processor command sequence 910. In some embodiments, software or firmware of a data processing system that features an embodiment of a graphics processor uses a version of the command sequence shown to set up, execute, and terminate a set of graphics operations. A sample command sequence is shown and described for purposes of example only as embodiments are not limited to these specific commands or to this command sequence. Moreover, the commands may be issued as batch of commands in a command sequence, such that the graphics processor will process the sequence of commands in at least partially concurrence.

In some embodiments, the graphics processor command sequence 910 may begin with a pipeline flush command 912 to cause any active graphics pipeline to complete the currently pending commands for the pipeline. In some embodiments, the 3D pipeline 922 and the media pipeline 924 do not operate concurrently. The pipeline flush is performed to cause the active graphics pipeline to complete any pending commands In response to a pipeline flush, the command parser for the graphics processor will pause command processing until the active drawing engines complete pending operations and the relevant read caches are invalidated. Optionally, any data in the render cache that is marked 'dirty' can be flushed to memory. In some embodiments, pipeline flush command 912 can be used for pipeline synchronization or before placing the graphics processor into a low power state.

In some embodiments, a pipeline select command 913 is used when a command sequence requires the graphics processor to explicitly switch between pipelines. In some embodiments, a pipeline select command 913 is required only once within an execution context before issuing pipeline commands unless the context is to issue commands for both pipelines. In some embodiments, a pipeline flush command 912 is required immediately before a pipeline switch via the pipeline select command 913.

In some embodiments, a pipeline control command 914 configures a graphics pipeline for operation and is used to program the 3D pipeline 922 and the media pipeline 924. In some embodiments, pipeline control command 914 configures the pipeline state for the active pipeline. In one embodiment, the pipeline control command 914 is used for pipeline synchronization and to clear data from one or more cache memories within the active pipeline before processing a batch of commands.

In some embodiments, return buffer state commands 916 are used to configure a set of return buffers for the respective pipelines to write data. Some pipeline operations require the allocation, selection, or configuration of one or more return buffers into which the operations write intermediate data during processing. In some embodiments, the graphics processor also uses one or more return buffers to store output data and to perform cross thread communication. In some embodiments, the return buffer state 916 includes selecting the size and number of return buffers to use for a set of pipeline operations.

The remaining commands in the command sequence differ based on the active pipeline for operations. Based on a pipeline determination 920, the command sequence is tailored to the 3D pipeline 922 beginning with the 3D pipeline state 930 or the media pipeline 924 beginning at the media pipeline state 940.

The commands to configure the 3D pipeline state 930 include 3D state setting commands for vertex buffer state, vertex element state, constant color state, depth buffer state, and other state variables that are to be configured before 3D primitive commands are processed. The values of these commands are determined at least in part based on the particular 3D API in use. In some embodiments, 3D pipeline state 930 commands are also able to selectively disable or bypass certain pipeline elements if those elements will not be used.

In some embodiments, 3D primitive 932 command is used to submit 3D primitives to be processed by the 3D pipeline. Commands and associated parameters that are passed to the graphics processor via the 3D primitive 932 command are forwarded to the vertex fetch function in the graphics pipeline. The vertex fetch function uses the 3D primitive 932 command data to generate vertex data structures. The vertex data structures are stored in one or more return buffers. In some embodiments, 3D primitive 932 command is used to perform vertex operations on 3D primitives via vertex shaders. To process vertex shaders, 3D pipeline 922 dispatches shader execution threads to graphics processor execution units.

In some embodiments, 3D pipeline 922 is triggered via an execute 934 command or event. In some embodiments, a register write triggers command execution. In some embodiments execution is triggered via a 'go' or 'kick' command in the command sequence. In one embodiment, command execution is triggered using a pipeline synchronization command to flush the command sequence through the graphics pipeline. The 3D pipeline will perform geometry processing for the 3D primitives. Once operations are complete, the resulting geometric objects are rasterized and the pixel engine colors the resulting pixels. Additional commands to control pixel shading and pixel back end operations may also be included for those operations.

In some embodiments, the graphics processor command sequence 910 follows the media pipeline 924 path when performing media operations. In general, the specific use and manner of programming for the media pipeline 924 depends on the media or compute operations to be performed. Specific media decode operations may be offloaded to the media pipeline during media decode. In some embodiments, the media pipeline can also be bypassed and media decode can be performed in whole or in part using resources provided by one or more general-purpose processing cores. In one embodiment, the media pipeline also includes elements for general-purpose graphics processor unit (GPGPU) operations, where the graphics processor is used to perform SIMD vector operations using computational shader programs that are not explicitly related to the rendering of graphics primitives.

In some embodiments, media pipeline 924 is configured in a similar manner as the 3D pipeline 922. A set of commands to configure the media pipeline state 940 are dispatched or placed into a command queue before the media object commands 942. In some embodiments, commands for the media pipeline state 940 include data to configure the media pipeline elements that will be used to process the media objects. This includes data to configure the video decode and video encode logic within the media pipeline, such as encode or decode format. In some embodiments, commands for the media pipeline state 940 also support the use of one or more pointers to "indirect" state elements that contain a batch of state settings.

In some embodiments, media object commands 942 supply pointers to media objects for processing by the media pipeline. The media objects include memory buffers containing video data to be processed. In some embodiments, all media pipeline states must be valid before issuing a media object command 942. Once the pipeline state is configured and media object commands 942 are queued, the media pipeline 924 is triggered via an execute command 944 or an equivalent execute event (e.g., register write). Output from media pipeline 924 may then be post processed by operations provided by the 3D pipeline 922 or the media pipeline 924. In some embodiments, GPGPU operations are configured and executed in a similar manner as media operations.

Graphics Software Architecture

Figure 10:
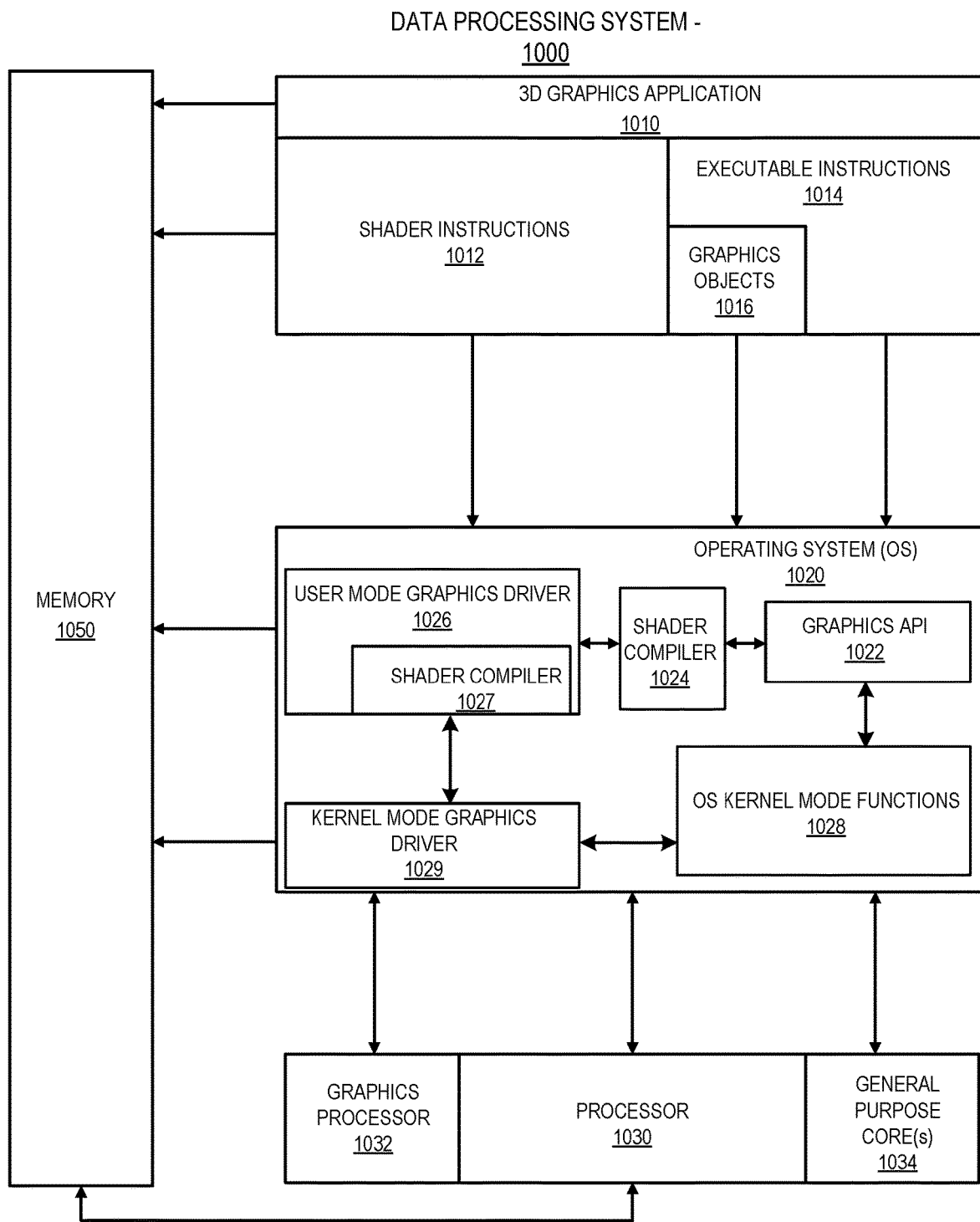
FIG. 10 illustrates an exemplary graphics software architecture for a data processing system according to some embodiments.

FIG. 10 illustrates an exemplary graphics software architecture for a data processing system 1000 according to some embodiments. In some embodiments, software architecture includes a 3D graphics application 1010, an operating system 1020, and at least one processor 1030. In some embodiments, processor 1030 includes a graphics processor 1032 and one or more general-purpose processor core(s) 1034. The graphics application 1010 and operating system 1020 each execute in the system memory 1050 of the data processing system.

In some embodiments, 3D graphics application 1010 contains one or more shader programs including shader instructions 1012. The shader language instructions may be in a high-level shader language, such as the High-Level Shader Language (HLSL) of Direct3D, the OpenGL Shader Language (GLSL), and so forth. The application also includes executable instructions 1014 in a machine language suitable for execution by the general-purpose processor core 1034. The application also includes graphics objects 1016 defined by vertex data.

In some embodiments, operating system 1020 is a Microsoft® Windows® operating system from the Microsoft Corporation, a proprietary UNIX-like operating system, or an open source UNIX-like operating system using a variant of the Linux kernel. The operating system 1020 can support a graphics API 1022 such as the Direct3D API, the OpenGL API, or the Vulkan API. When the Direct3D API is in use, the operating system 1020 uses a front-end shader compiler 1024 to compile any shader instructions 1012 in HLSL into a lower-level shader language. The compilation may be a just-in-time (JIT) compilation or the application can perform shader pre-compilation. In some embodiments, high-level shaders are compiled into low-level shaders during the compilation of the 3D graphics application 1010. In some embodiments, the shader instructions 1012 are provided in an intermediate form, such as a version of the Standard Portable Intermediate Representation (SPIR) used by the Vulkan API.

In some embodiments, user mode graphics driver 1026 contains a back-end shader compiler 1027 to convert the shader instructions 1012 into a hardware specific representation. When the OpenGL API is in use, shader instructions 1012 in the GLSL high-level language are passed to a user mode graphics driver 1026 for compilation. In some embodiments, user mode graphics driver 1026 uses operating system kernel mode functions 1028 to communicate with a kernel mode graphics driver 1029. In some embodiments, kernel mode graphics driver 1029 communicates with graphics processor 1032 to dispatch commands and instructions.

IP Core Implementations

One or more aspects of at least one embodiment may be implemented by representative code stored on a machine-readable medium which represents and/or defines logic within an integrated circuit such as a processor. For example, the machine-readable medium may include instructions which represent various logic within the processor. When read by a machine, the instructions may cause the machine to fabricate the logic to perform the techniques described herein. Such representations, known as "IP cores," are reusable units of logic for an integrated circuit that may be stored on a tangible, machine-readable medium as a hardware model that describes the structure of the integrated circuit. The hardware model may be supplied to various customers or manufacturing facilities, which load the hardware model on fabrication machines that manufacture the integrated circuit. The integrated circuit may be fabricated such that the circuit performs operations described in association with any of the embodiments described herein.

Figure 11A:
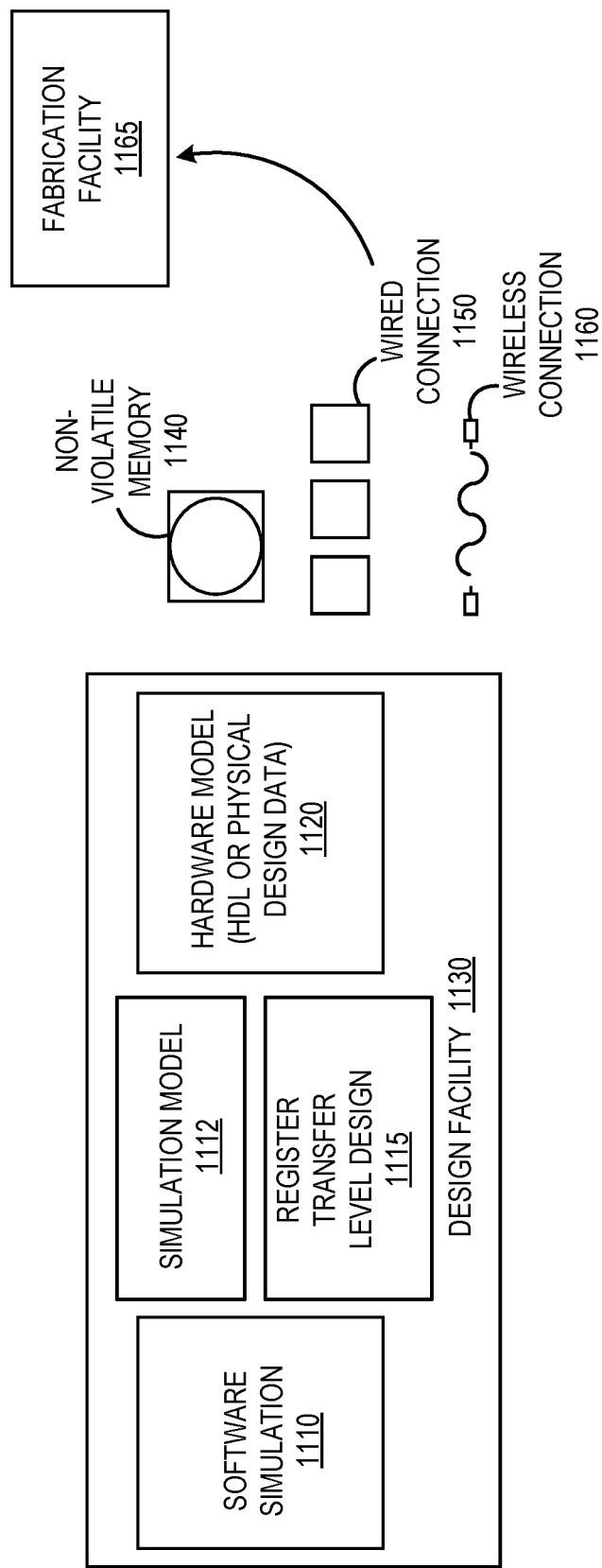
FIG. 11A is a block diagram illustrating an IP core development system that may be used to manufacture an integrated circuit to perform operations according to an embodiment.

FIG. 11A is a block diagram illustrating an IP core development system 1100 that may be used to manufacture an integrated circuit to perform operations according to an embodiment. The IP core development system 1100 may be used to generate modular, reusable designs that can be incorporated into a larger design or used to construct an entire integrated circuit (e.g., an SOC integrated circuit). A design facility 1130 can generate a software simulation 1110 of an IP core design in a high-level programming language (e.g., C/C++). The software simulation 1110 can be used to design, test, and verify the behavior of the IP core using a simulation model 1112. The simulation model 1112 may include functional, behavioral, and/or timing simulations. A register transfer level (RTL) design 1115 can then be created or synthesized from the simulation model 1112. The RTL design 1115 is an abstraction of the behavior of the integrated circuit that models the flow of digital signals between hardware registers, including the associated logic performed using the modeled digital signals. In addition to an RTL design 1115, lower-level designs at the logic level or transistor level may also be created, designed, or synthesized. Thus, the particular details of the initial design and simulation may vary.

The RTL design 1115 or equivalent may be further synthesized by the design facility into a hardware model 1120, which may be in a hardware description language (HDL), or some other representation of physical design data. The HDL may be further simulated or tested to verify the IP core design. The IP core design can be stored for delivery to a 3rd party fabrication facility 1165 using non-volatile memory 1140 (e.g., hard disk, flash memory, or any non-volatile storage medium). Alternatively, the IP core design may be transmitted (e.g., via the Internet) over a wired connection 1150 or wireless connection 1160. The fabrication facility 1165 may then fabricate an integrated circuit that is based at least in part on the IP core design. The fabricated integrated circuit can be configured to perform operations in accordance with at least one embodiment described herein.

Figure 11B:
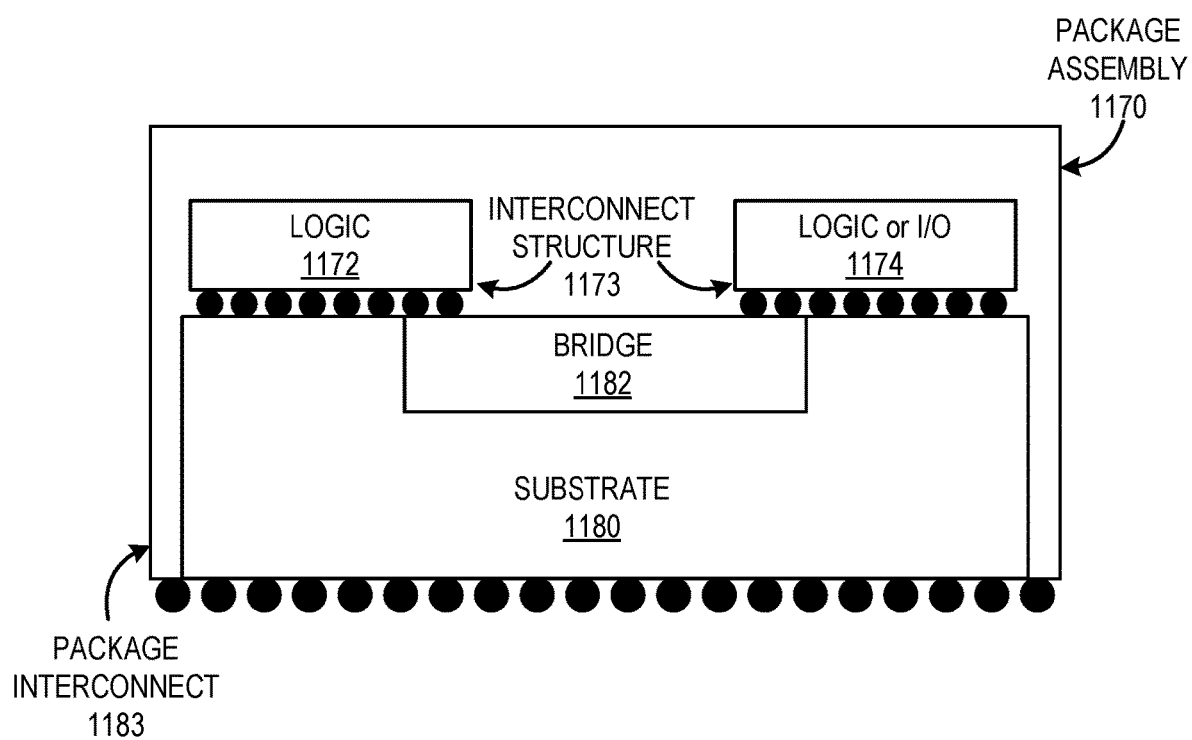
FIG. 11B illustrates a cross-section side view of an integrated circuit package assembly, according to some embodiments described herein.

FIG. 11B illustrates a cross-section side view of an integrated circuit package assembly 1170, according to some embodiments described herein. The integrated circuit package assembly 1170 illustrates an implementation of one or more processor or accelerator devices as described herein. The package assembly 1170 includes multiple units of hardware logic 1172, 1174 connected to a substrate 1180. The logic 1172, 1174 may be implemented at least partly in configurable logic or fixed-functionality logic hardware, and can include one or more portions of any of the processor core(s), graphics processor(s), or other accelerator devices described herein. Each unit of logic 1172, 1174 can be implemented within a semiconductor die and coupled with the substrate 1180 via an interconnect structure 1173. The interconnect structure 1173 may be configured to route electrical signals between the logic 1172, 1174 and the substrate 1180, and can include interconnects such as, but not limited to bumps or pillars. In some embodiments, the interconnect structure 1173 may be configured to route electrical signals such as, for example, input/output (I/O) signals and/or power or ground signals associated with the operation of the logic 1172, 1174. In some embodiments, the substrate 1180 is an epoxy-based laminate substrate. The substrate 1180 may include other suitable types of substrates in other embodiments. The package assembly 1170 can be connected to other electrical devices via a package interconnect 1183. The package interconnect 1183 may be coupled to a surface of the substrate 1180 to route electrical signals to other electrical devices, such as a motherboard, other chipset, or multi-chip module.

In some embodiments, the units of logic 1172, 1174 are electrically coupled with a bridge 1182 that is configured to route electrical signals between the logic 1172, 1174. The bridge 1182 may be a dense interconnect structure that provides a route for electrical signals. The bridge 1182 may include a bridge substrate composed of glass or a suitable semiconductor material. Electrical routing features can be formed on the bridge substrate to provide a chip-to-chip connection between the logic 1172, 1174.

Although two units of logic 1172, 1174 and a bridge 1182 are illustrated, embodiments described herein may include more or fewer logic units on one or more dies. The one or more dies may be connected by zero or more bridges, as the bridge 1182 may be excluded when the logic is included on a single die. Alternatively, multiple dies or units of logic can be connected by one or more bridges. Additionally, multiple logic units, dies, and bridges can be connected together in other possible configurations, including three-dimensional configurations.

Figure 11C:
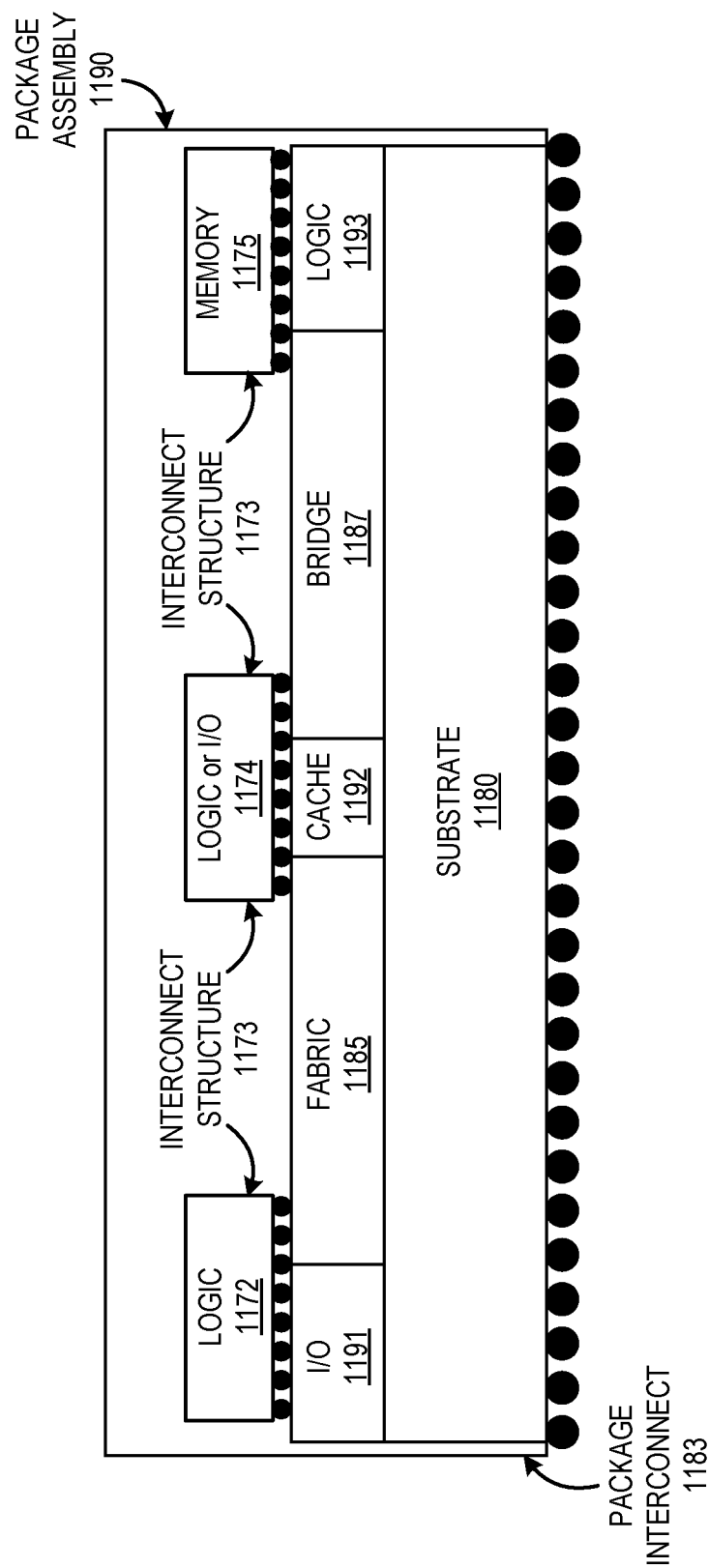
FIG. 11C illustrates a package assembly that includes multiple units of hardware logic chiplets connected to a substrate.

FIG. 11C illustrates a package assembly 1190 that includes multiple units of hardware logic chiplets connected to a substrate 1180 (e.g., base die). A graphics processing unit, parallel processor, and/or compute accelerator as described herein can be composed from diverse silicon chiplets that are separately manufactured. In this context, a chiplet is an at least partially packaged integrated circuit that includes distinct units of logic that can be assembled with other chiplets into a larger package. A diverse set of chiplets with different IP core logic can be assembled into a single device. Additionally, the chiplets can be integrated into a base die or base chiplet using active interposer technology. The concepts described herein enable the interconnection and communication between the different forms of IP within the GPU. IP cores can be manufactured using different process technologies and composed during manufacturing, which avoids the complexity of converging multiple IPs, especially on a large SoC with several flavors IPs, to the same manufacturing process. Enabling the use of multiple process technologies improves the time to market and provides a cost-effective way to create multiple product SKUs. Additionally, the disaggregated IPs are more amenable to being power gated independently, components that are not in use on a given workload can be powered off, reducing overall power consumption.

The hardware logic chiplets can include special purpose hardware logic chiplets 1172, logic or I/O chiplets 1174, and/or memory chiplets 1175. The hardware logic chiplets 1172 and logic or I/O chiplets 1174 may be implemented at least partly in configurable logic or fixed-functionality logic hardware and can include one or more portions of any of the processor core(s), graphics processor(s), parallel processors, or other accelerator devices described herein. The memory chiplets 1175 can be DRAM (e.g., GDDR, HBM) memory or cache (SRAM) memory.

Each chiplet can be fabricated as separate semiconductor die and coupled with the substrate 1180 via an interconnect structure 1173. The interconnect structure 1173 may be configured to route electrical signals between the various chiplets and logic within the substrate 1180. The interconnect structure 1173 can include interconnects such as, but not limited to bumps or pillars. In some embodiments, the interconnect structure 1173 may be configured to route electrical signals such as, for example, input/output (I/O) signals and/or power or ground signals associated with the operation of the logic, I/O and memory chiplets.

In some embodiments, the substrate 1180 is an epoxy-based laminate substrate. The substrate 1180 may include other suitable types of substrates in other embodiments. The package assembly 1190 can be connected to other electrical devices via a package interconnect 1183. The package interconnect 1183 may be coupled to a surface of the substrate 1180 to route electrical signals to other electrical devices, such as a motherboard, other chipset, or multi-chip module.

In some embodiments, a logic or I/O chiplet 1174 and a memory chiplet 1175 can be electrically coupled via a bridge 1187 that is configured to route electrical signals between the logic or I/O chiplet 1174 and a memory chiplet 1175. The bridge 1187 may be a dense interconnect structure that provides a route for electrical signals. The bridge 1187 may include a bridge substrate composed of glass or a suitable semiconductor material. Electrical routing features can be formed on the bridge substrate to provide a chip-to-chip connection between the logic or I/O chiplet 1174 and a memory chiplet 1175. The bridge 1187 may also be referred to as a silicon bridge or an interconnect bridge. For example, the bridge 1187, in some embodiments, is an Embedded Multi-die Interconnect Bridge (EMIB). In some embodiments, the bridge 1187 may simply be a direct connection from one chiplet to another chiplet.

The substrate 1180 can include hardware components for I/O 1191, cache memory 1192, and other hardware logic 1193. A fabric 1185 can be embedded in the substrate 1180 to enable communication between the various logic chiplets and the logic 1191, 1193 within the substrate 1180. In one embodiment, the I/O 1191, fabric 1185, cache, bridge, and other hardware logic 1193 can be integrated into a base die that is layered on top of the substrate 1180.

In various embodiments a package assembly 1190 can include fewer or greater number of components and chiplets that are interconnected by a fabric 1185 or one or more bridges 1187. The chiplets within the package assembly 1190 may be arranged in a 3D or 2.5D arrangement. In general, bridge structures 1187 may be used to facilitate a point to point interconnect between, for example, logic or I/O chiplets and memory chiplets. The fabric 1185 can be used to interconnect the various logic and/or I/O chiplets (e.g., chiplets 1172, 1174, 1191, 1193). with other logic and/or I/O chiplets. In one embodiment, the cache memory 1192 within the substrate can act as a global cache for the package assembly 1190, part of a distributed global cache, or as a dedicated cache for the fabric 1185.

Figure 11D:
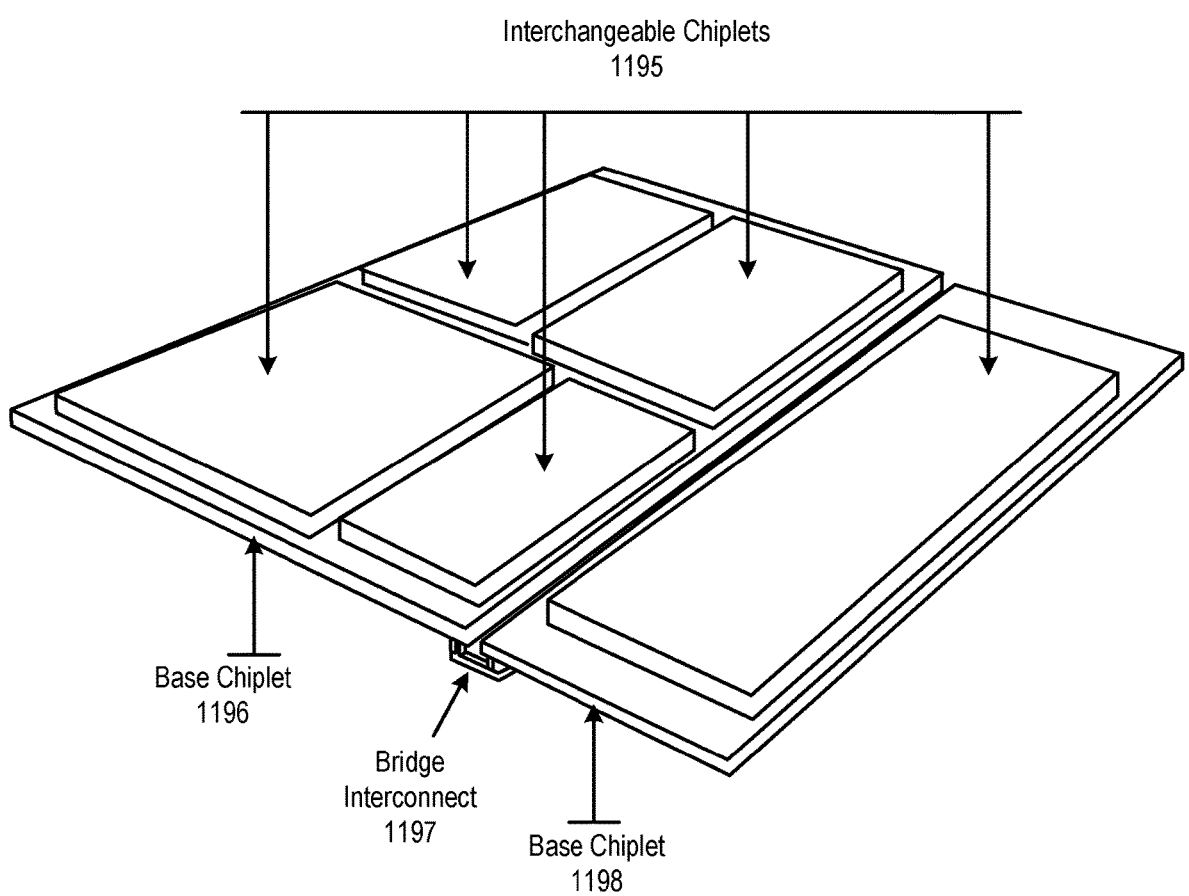
FIG. 11D illustrates a package assembly including interchangeable chiplets, according to an embodiment.

FIG. 11D illustrates a package assembly 1194 including interchangeable chiplets 1195, according to an embodiment. The interchangeable chiplets 1195 can be assembled into standardized slots on one or more base chiplets 1196, 1198. The base chiplets 1196, 1198 can be coupled via a bridge interconnect 1197, which can be similar to the other bridge interconnects described herein and may be, for example, an EMIB. Memory chiplets can also be connected to logic or I/O chiplets via a bridge interconnect. I/O and logic chiplets can communicate via an interconnect fabric. The base chiplets can each support one or more slots in a standardized format for one of logic or I/O or memory/cache.

In one embodiment, SRAM and power delivery circuits can be fabricated into one or more of the base chiplets 1196, 1198, which can be fabricated using a different process technology relative to the interchangeable chiplets 1195 that are stacked on top of the base chiplets. For example, the base chiplets 1196, 1198 can be fabricated using a larger process technology, while the interchangeable chiplets can be manufactured using a smaller process technology. One or more of the interchangeable chiplets 1195 may be memory (e.g., DRAM) chiplets. Different memory densities can be selected for the package assembly 1194 based on the power, and/or performance targeted for the product that uses the package assembly 1194. Additionally, logic chiplets with a different number of type of functional units can be selected at time of assembly based on the power, and/or performance targeted for the product. Additionally, chiplets containing IP logic cores of differing types can be inserted into the interchangeable chiplet slots, enabling hybrid processor designs that can mix and match different technology IP blocks.

Exemplary System on a Chip Integrated Circuit

Figure 12:
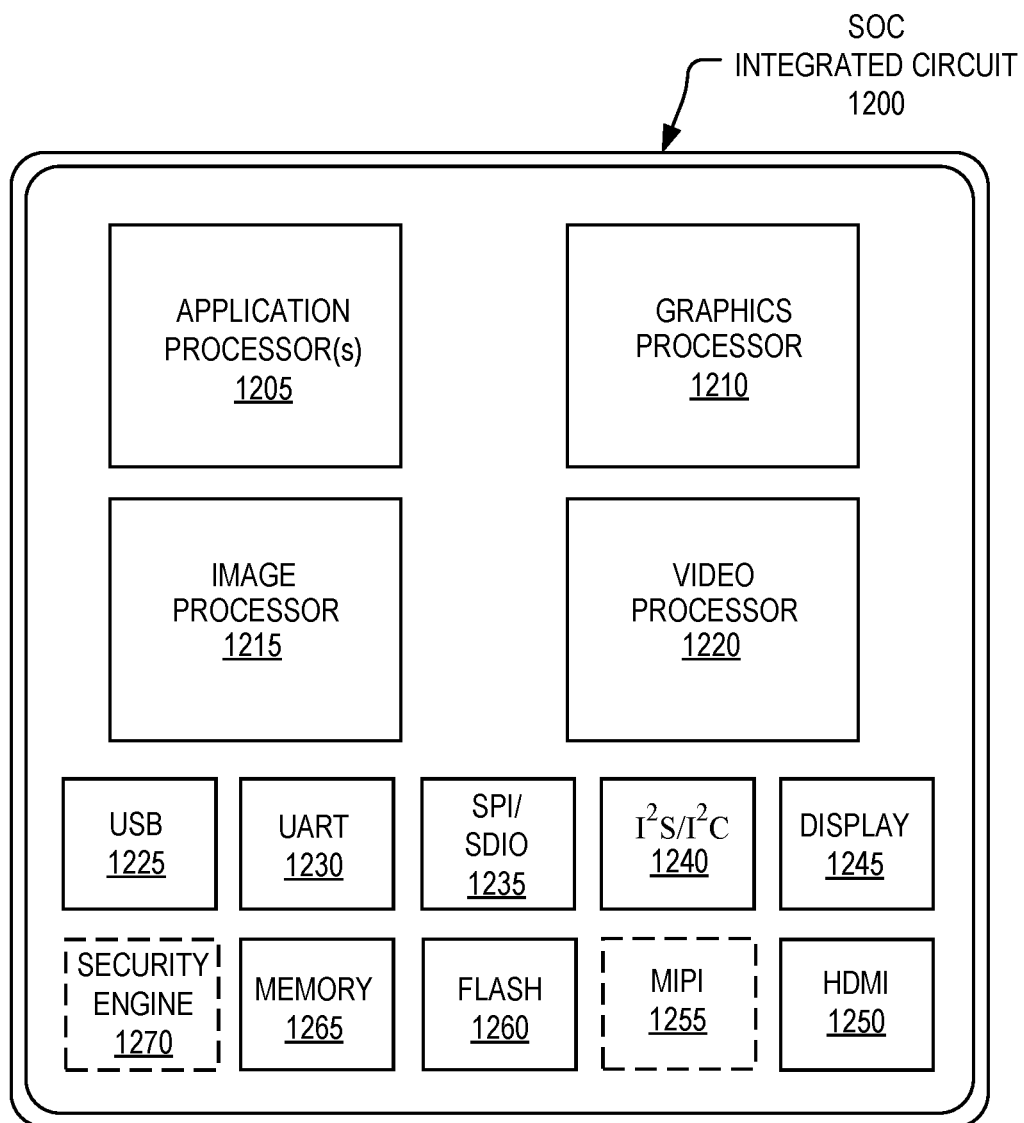
FIGS. 12, 13A and 13B illustrate exemplary integrated circuits and associated graphics processors that may be fabricated using one or more IP cores, according to various embodiments described herein.
Figure 13A:
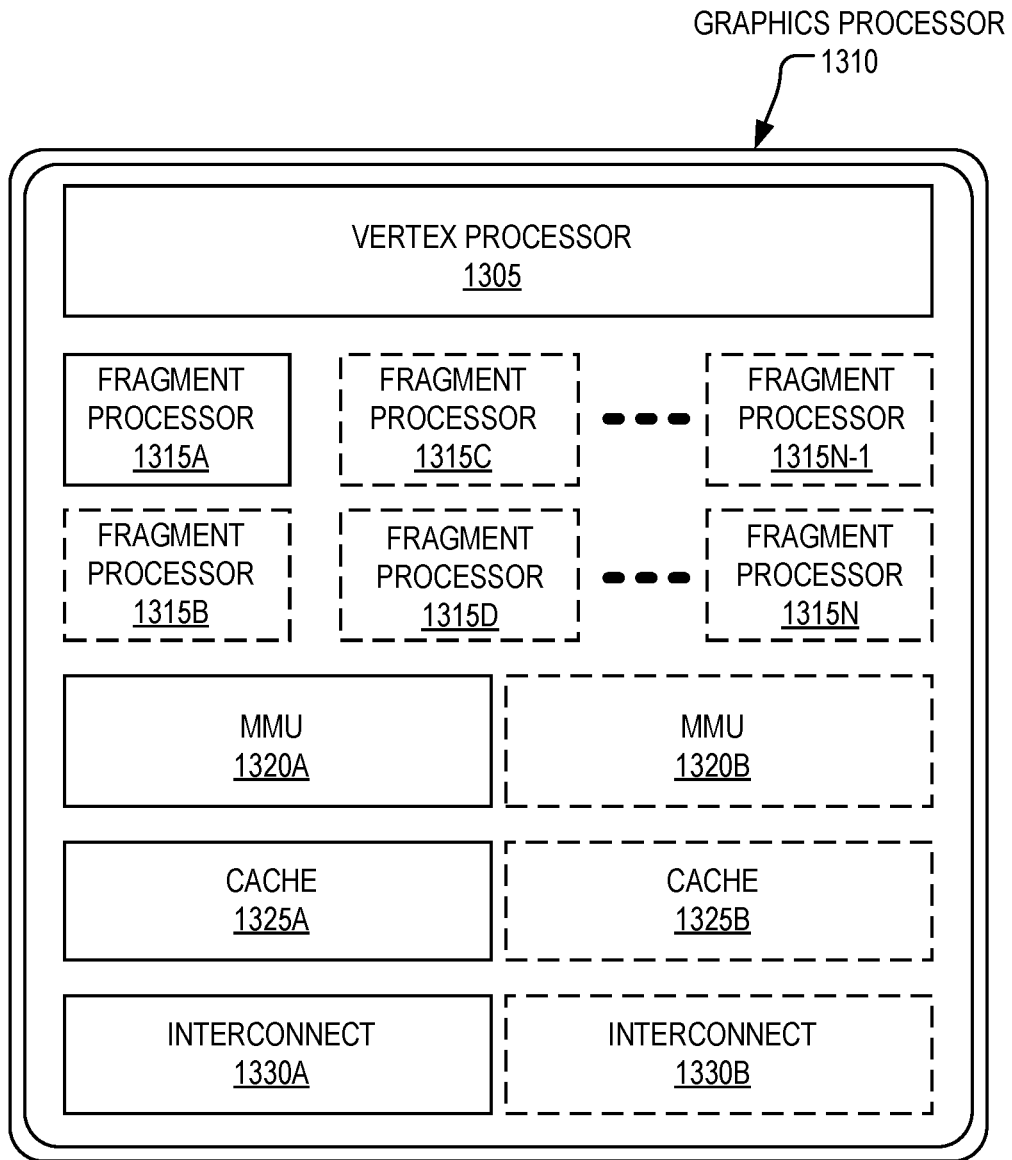
Figure 13B:
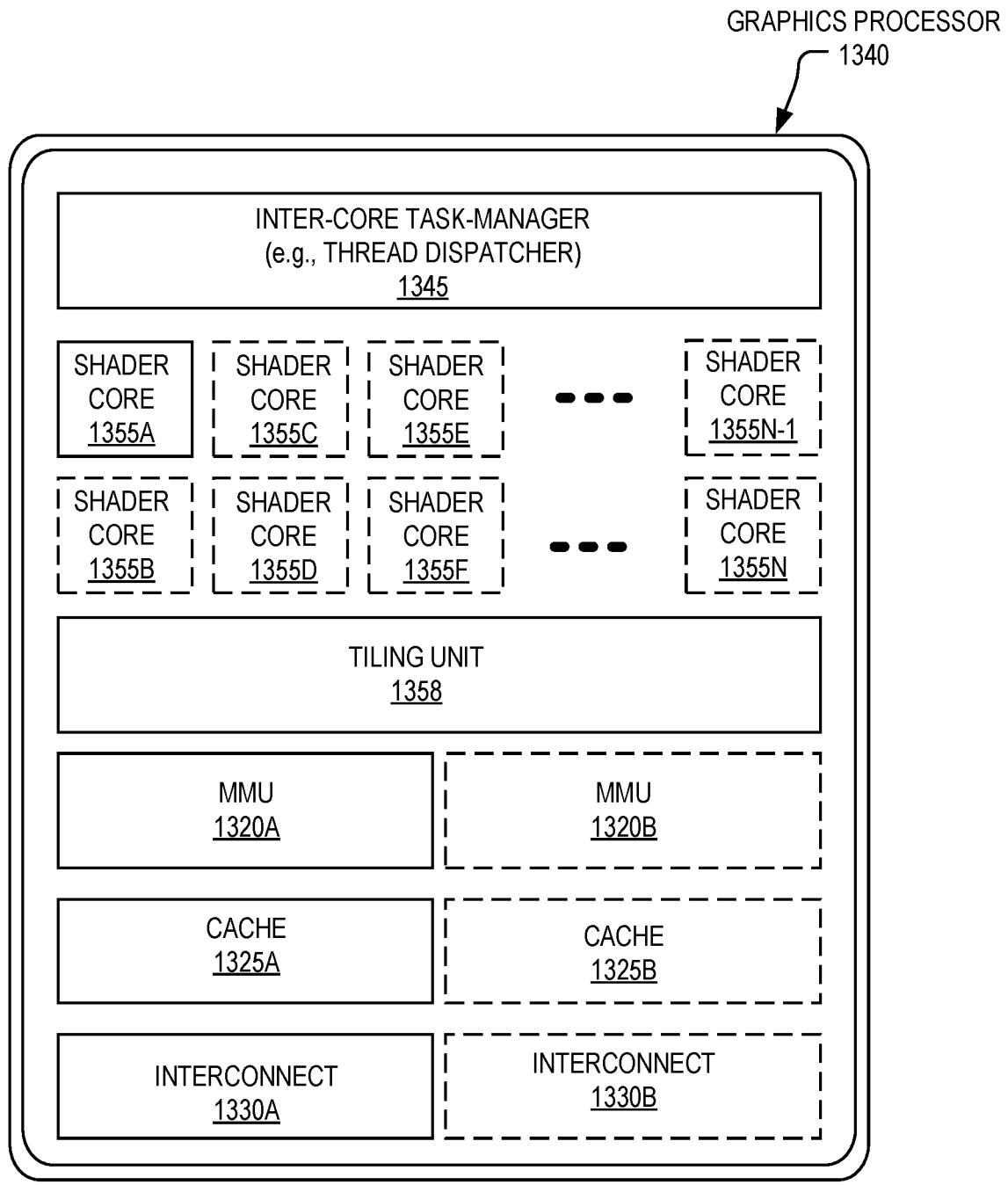

FIGS. 12 and 13A-13B illustrate exemplary integrated circuits and associated graphics processors that may be fabricated using one or more IP cores, according to various embodiments described herein. In addition to what is illustrated, other logic and circuits may be included, including additional graphics processors/cores, peripheral interface controllers, or general-purpose processor cores.

FIG. 12 is a block diagram illustrating an exemplary system on a chip integrated circuit 1200 that may be fabricated using one or more IP cores, according to an embodiment. Exemplary integrated circuit 1200 includes one or more application processor(s) 1205 (e.g., CPUs), at least one graphics processor 1210, and may additionally include an image processor 1215 and/or a video processor 1220, any of which may be a modular IP core from the same or multiple different design facilities. Integrated circuit 1200 includes peripheral or bus logic including a USB controller 1225, UART controller 1230, an SPI/SDIO controller 1235, and an I2S/I2C controller 1240. Additionally, the integrated circuit can include a display device 1245 coupled to one or more of a high-definition multimedia interface (HDMI) controller 1250 and a mobile industry processor interface (MIPI) display interface 1255. Storage may be provided by a flash memory subsystem 1260 including flash memory and a flash memory controller. Memory interface may be provided via a memory controller 1265 for access to SDRAM or SRAM memory devices. Some integrated circuits additionally include an embedded security engine 1270.

FIGS. 13A-13B are block diagrams illustrating exemplary graphics processors for use within an SoC, according to embodiments described herein. FIG. 13A illustrates an exemplary graphics processor 1310 of a system on a chip integrated circuit that may be fabricated using one or more IP cores, according to an embodiment. FIG. 13B illustrates an additional exemplary graphics processor 1340 of a system on a chip integrated circuit that may be fabricated using one or more IP cores, according to an embodiment. Graphics processor 1310 of FIG. 13A is an example of a low power graphics processor core. Graphics processor 1340 of FIG. 13B is an example of a higher performance graphics processor core. Each of the graphics processors 1310, 1340 can be variants of the graphics processor 1210 of FIG. 12.

As shown in FIG. 13A, graphics processor 1310 includes a vertex processor 1305 and one or more fragment processor(s) 1315A-1315N (e.g., 1315A, 1315B, 1315C, 1315D, through 1315N-1, and 1315N). Graphics processor 1310 can execute different shader programs via separate logic, such that the vertex processor 1305 is optimized to execute operations for vertex shader programs, while the one or more fragment processor(s) 1315A-1315N execute fragment (e.g., pixel) shading operations for fragment or pixel shader programs. The vertex processor 1305 performs the vertex processing stage of the 3D graphics pipeline and generates primitives and vertex data. The fragment processor(s) 1315A-1315N use the primitive and vertex data generated by the vertex processor 1305 to produce a framebuffer that is displayed on a display device. In one embodiment, the fragment processor(s) 1315A-1315N are optimized to execute fragment shader programs as provided for in the OpenGL API, which may be used to perform similar operations as a pixel shader program as provided for in the Direct 3D API.

Graphics processor 1310 additionally includes one or more memory management units (MMUs) 1320A-1320B, cache(s) 1325A-1325B, and circuit interconnect(s) 1330A-1330B. The one or more MMU(s) 1320A-1320B provide for virtual to physical address mapping for the graphics processor 1310, including for the vertex processor 1305 and/or fragment processor(s) 1315A-1315N, which may reference vertex or image/texture data stored in memory, in addition to vertex or image/texture data stored in the one or more cache(s) 1325A-1325B. In one embodiment the one or more MMU(s) 1320A-1320B may be synchronized with other MMUs within the system, including one or more MMUs associated with the one or more application processor(s) 1205, image processor 1215, and/or video processor 1220 of FIG. 12, such that each processor 1205-1220 can participate in a shared or unified virtual memory system. The one or more circuit interconnect(s) 1330A-1330B enable graphics processor 1310 to interface with other IP cores within the SoC, either via an internal bus of the SoC or via a direct connection, according to embodiments.

As shown FIG. 13B, graphics processor 1340 includes the one or more MMU(s) 1320A-1320B, cache(s) 1325A-1325B, and circuit interconnect(s) 1330A-1330B of the graphics processor 1310 of FIG. 13A. Graphics processor 1340 includes one or more shader core(s) 1355A-1355N (e.g., 1455A, 1355B, 1355C, 1355D, 1355E, 1355F, through 1355N-1, and 1355N), which provides for a unified shader core architecture in which a single core or type or core can execute all types of programmable shader code, including shader program code to implement vertex shaders, fragment shaders, and/or compute shaders. The exact number of shader cores present can vary among embodiments and implementations.

Additionally, graphics processor 1340 includes an inter-core task manager 1345, which acts as a thread dispatcher to dispatch execution threads to one or more shader cores 1355A-1355N and a tiling unit 1358 to accelerate tiling operations for tile-based rendering, in which rendering operations for a scene are subdivided in image space, for example to exploit local spatial coherence within a scene or to optimize use of internal caches.

Hybrid Methodology for Simulation Speed Up

Various embodiments provide an automated port mapping between first and second circuit representations and predict a naming convention used for connectivity. In some examples, based on previous mapping information of a connection between a first circuit representation port to second circuit representation port (e.g., multi-dimensional structures, multi-dimensional structures containing other structures and unions) or vice versa. The second circuit representation connection can be a bit blasted form of the first circuit representation connection, which can be used to match and connect with a port of the first circuit representation. A database can store information of nodes or pins of a design that glues or connects the Netlist and RTL into a hybrid design at any given time. The database can include a history of connections between first and second circuit representations or connections between second and first circuit representations and can be updated with newly discovered connections between first and second circuit representations or connections between second and first circuit representations that were previously not identified or not predicted using machine learning (ML). For example, determining a connection between a first circuit representation to a second circuit representation can make use of a database, and can provide a prediction of how RTL and Netlist can be connected and merged to build a hybrid model (e.g., combination of RTL and Netlist) to reduce simulation time. In some examples, an API provides access to the database that includes a prediction of how RTL and Netlist can be connected and combined to build the hybrid model. The hybrid model could be processed by a native simulator (e.g., gate level simulators from Synopsys or Cadence) to evaluate the states of the RTL and Netlist so that a designer can determine whether any errors are present and to correct or accept a design.

Figure 14:
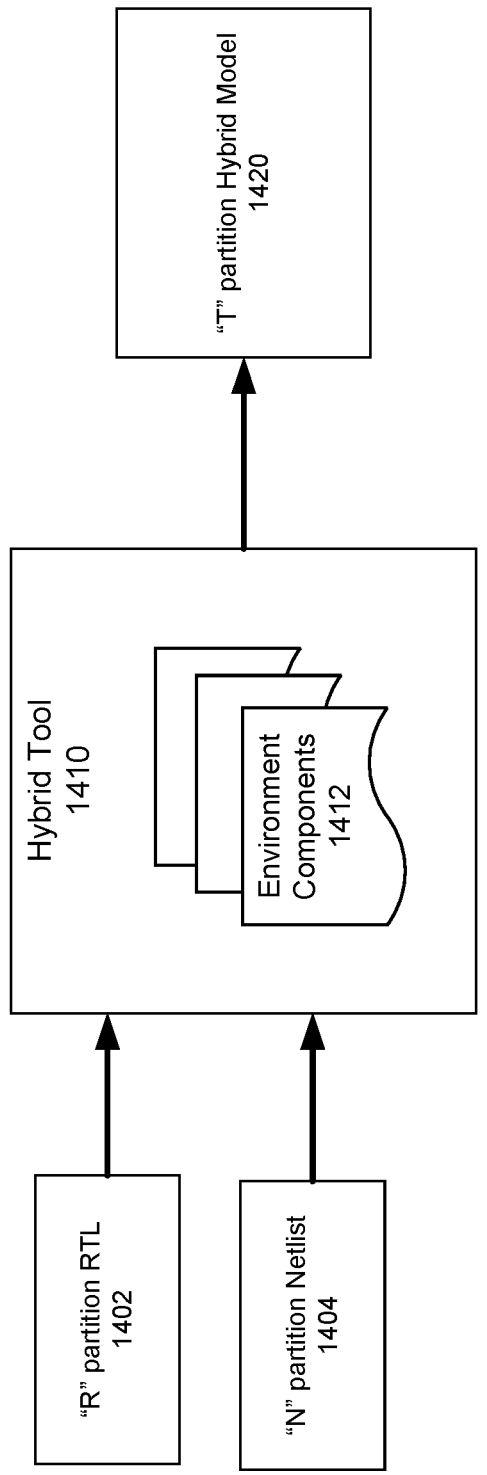
FIG. 14 shows an overview of a system.

FIG. 14 shows an overview of a system. Inputs to hybrid tool 1410 include, at least, RTL partitions 1402 and Netlist partitions 1404. A partition can be a boundary at which the design under test (DUT) is fragmented with various units and clusters. A partition can be user defined or based on criteria such as: timing of data synchronization, power estimates of device operation, floorplan, or testing criteria. Hybrid tool 1410 can create intermediate results in the form of Environment Components 1412 to mimic 1:1 signal mapping (e.g., port mapping) between RTL and Netlist partitions in a hybrid GLS model. A port can represent a connection between circuits and connection between RTL and Netlist endpoints or Netlist and RTL endpoints. A connection can represent one or more of bus, bitblast, clock tree, feed through, repeater, isolator, and so forth. An RTL representation can group signals to a bus, whereas a Netlist representation can identify single bit connections.

A port mapping can be 1:1 correlation of Netlist code with inputs/outputs to RTL code with inputs/outputs. An output from hybrid tool 1410 can be a hybrid model 1420 that includes "T" partitions. As part of a compilation process or model build, various embodiments replace a selected number of RTL ("R") partitions with Netlist ("N") partitions, to form a hybrid model where T=N+R can represent a total number of partitions. A Netlist partition can be a synthesized version of its RTL partition with information such as inserted clock trees, isolators, repeaters, and complex interconnects (e.g., feedthroughs). The choice of number of synthesized Netlist ("N") partitions can depend on design requirements such as power estimation, timing criteria, etc. An RTL partition can be defined as combination of units and functional blocks (fubs) that are grouped together to form a larger block of code based on predefined criteria. A fub can be a smallest object of a design, such as an adder, multiplexer, and so forth. The choice of number of synthesized RTL ("R") partitions can depend on design requirements such as power estimation, timing criteria, etc. The choice of R also can be considered a validation criteria to focus review on a particular area of the design under test, such as that partition that is converted to Netlist. In some examples, N:R connections are not 1:1, and various embodiments modify R, so that R is compatible with N, or vice versa.

Various embodiments provide a hybrid GLS technology that is compatible with industry simulator tools, such as Synopsys® or Cadence® simulators. A hybrid GLS technology can be used at least to calculate accurate power use estimation of silicon generated from a design. Hybrid GLS modeling can be fully automated to reduce human error. Hybrid GLS technology can provide efficient use of memory resources such as reducing memory footprint and need for high memory usage during simulation. By contrast, a Netlist-only based simulation could take longer to complete than a hybrid RTL-Netlist representation of a circuit.

Figure 15:
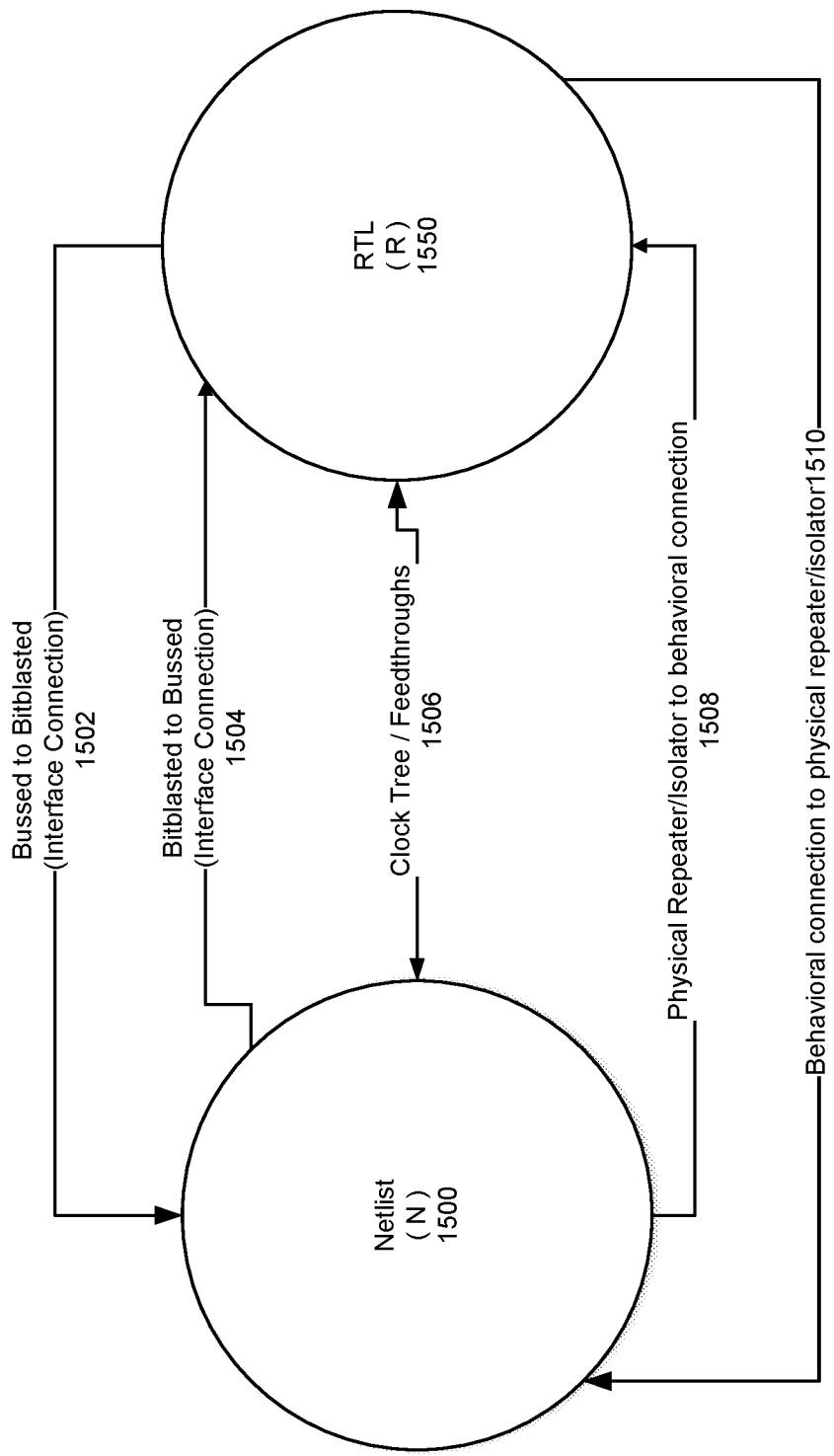
FIG. 15 depicts an example of connections of Netlist to RTL and RTL to Netlist.

FIG. 15 depicts an example of determination of Netlist to RTL connections and RTL to Netlist connections. There can be multiple types of RTL-Netlist signal connections that form environment components. Hybrid tool can identify connections in Netlist and convert such connections to RTL or identify connections in RTL and convert such connections to Netlist. Hybrid tool can identify an RTL (non-synthesized) connection conversion to Netlist (synthesized) design and a conversion of connections from Netlist design to RTL design without human intervention as human intervention can increase or introduce design errors. For example, an interface connection 1502 can be converted from RTL bussed to Netlist bitblasted. For example, an interface connection 1504 can be converted from Netlist bitblasted to RTL bussed. For example, an interface connection 1506 can convert RTL clock tree or feedthrough wires to Netlist. For example, an interface connection 1508 can be converted from Netlist physical repeater or isolator to RTL behavioral connection. For example, a behavioral connection 1510 can be converted from RTL to Netlist physical repeater or isolator. Bussed can include a group of ports or signals that are grouped by a unique name in a form of a vector. For example, bussed can be represented as address[47:0], which presents 48 objects. Bitblasted can indicate a signal where each name presents a unique signal. For example, "address_1" is single bit that maps to only 1 unique object.

A clock tree can represent a network of clocks that are used for synchronization in the design under test. Feedthrough can represent wires that connect two end points in a circuit that may travel from source to destination, and may travel but not get used by any other component between the source and destination points. A physical repeater can represent a synthesized form of repeaters in the design under test. An isolator can represent a circuitry that isolates or transfers digital signal(s) across an isolation barrier.

Figure 16:
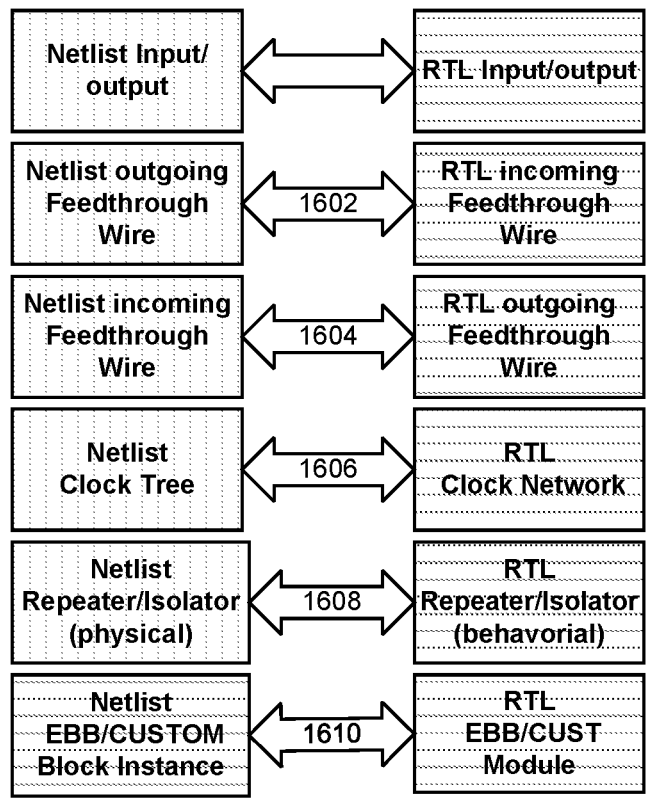
FIG. 16 depicts an example of represents the elements needed for port mapping that can be connected.
Figure 16:
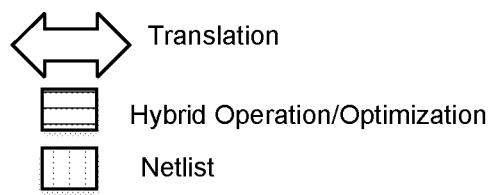

FIG. 16 depicts an example of represents the elements needed for port mapping that can be connected. For example, connection 1602 can represent a connection from Netlist outgoing feedthrough wire to RTL incoming feedthrough wire, and vice versa. For example, connection 1604 can represent a connection to a Netlist incoming feedthrough wire from an RTL outgoing feedthrough wire, and vice versa. For example, connection 1606 can represent a connection from a Netlist clock tree to RTL clock network, and vice versa. For example, connection 1608 can represent a connection to a Netlist clock repeater or isolator from RTL repeater or isolator, and vice versa. For example, connection 1610 can represent a connection from Netlist embedded black box (EBB) or custom block to RTL EBB or custom module, and vice versa. A hybrid model can speed up gate level simulation as compared to pure Netlist, particularly for designs under test with specific partitions whose operation is to be evaluated carefully.

Figure 17:
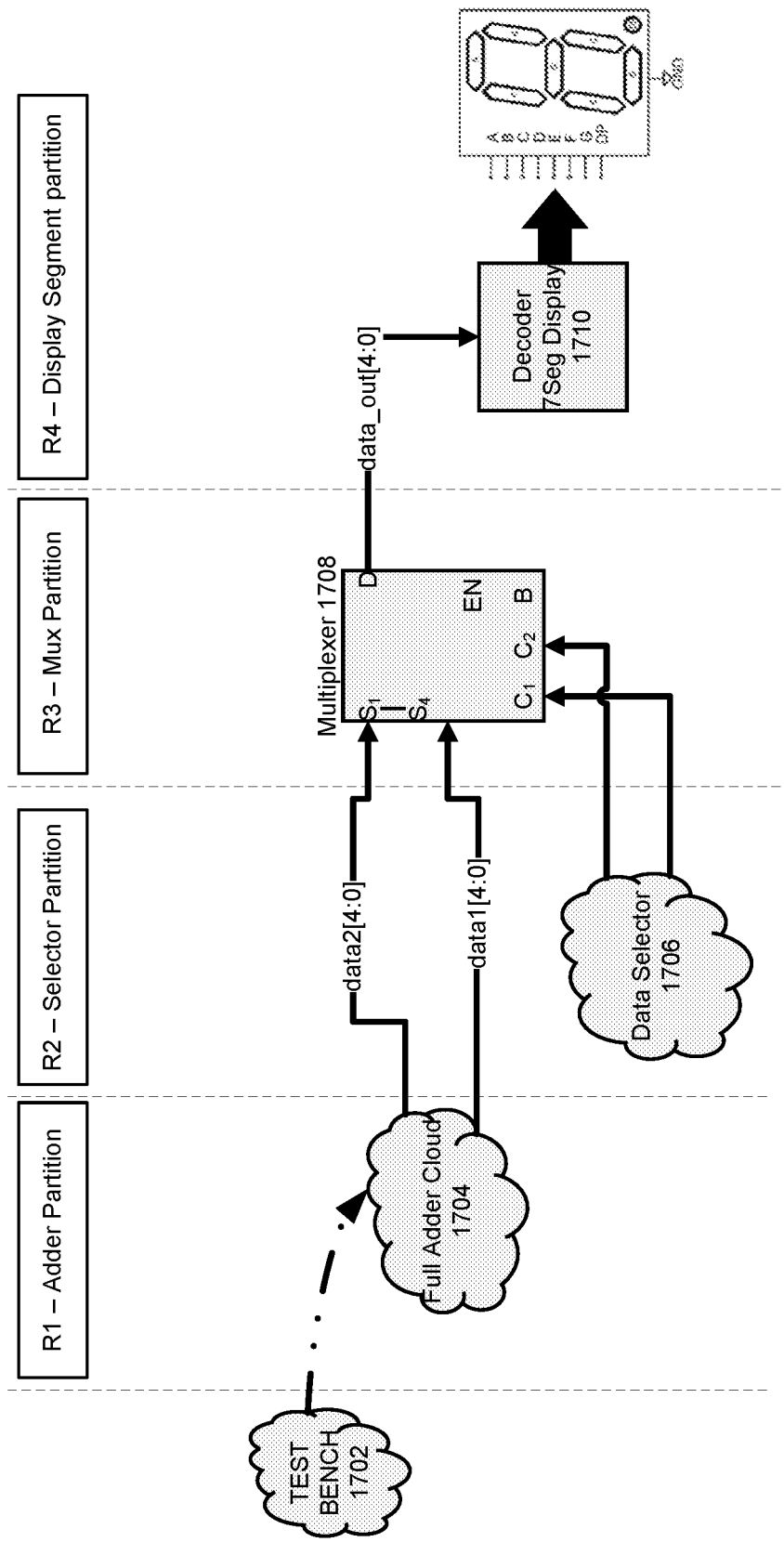
FIG. 17 illustrates an example of port mapping operations for RTL.

FIG. 17 illustrates an example of port mapping operations for RTL. In this example, an RTL design example is shown with 4 RTL partitions (R1, R2, R3, and R4). This design represents a full adder that produces a value, which can propagate through other partitions to be displayed on a 7 Segment display. In partition R1, an input to adder 1704 can be data driven from a test bench. In partition R1, an output from adder 1704 can be two 5-bit data, data1 and data2, provided to partition R2. In some examples, bits[3:0] can represent a calculated integer from an adder and bit [4] can represent the carry out.

In partition R2, data selector 1706 can select one of two 5-bit data from R1 provided to multiplexer 1708 of partition R3 to be output. An output from partition R2 to partition R3 can be two 5-bit data values and a bypass signal as well as two 1-bit data-select values $C_1$ and $C_2$.

In partition R3, a multiplexer 1708 can receive two 5-bit data from partition R2 and two 1-bit (data select) values $C_1$ and $C_2$ from partition R2. Multiplexer 1708 is a 4:1 multiplexer but operates using two inputs ($S_1$ and $S_2$) and provides one 5 bit value to partition R4 based on $C_1$. In partition R4, a decoder for a 7 segment display 1710 can receive a single 5-bit value from partition R3 and outputs 7 segment bits to an LED. Note that this partition operates on 4-bit mux_out[3:0] and mux[4] is not used.

Figure 18:
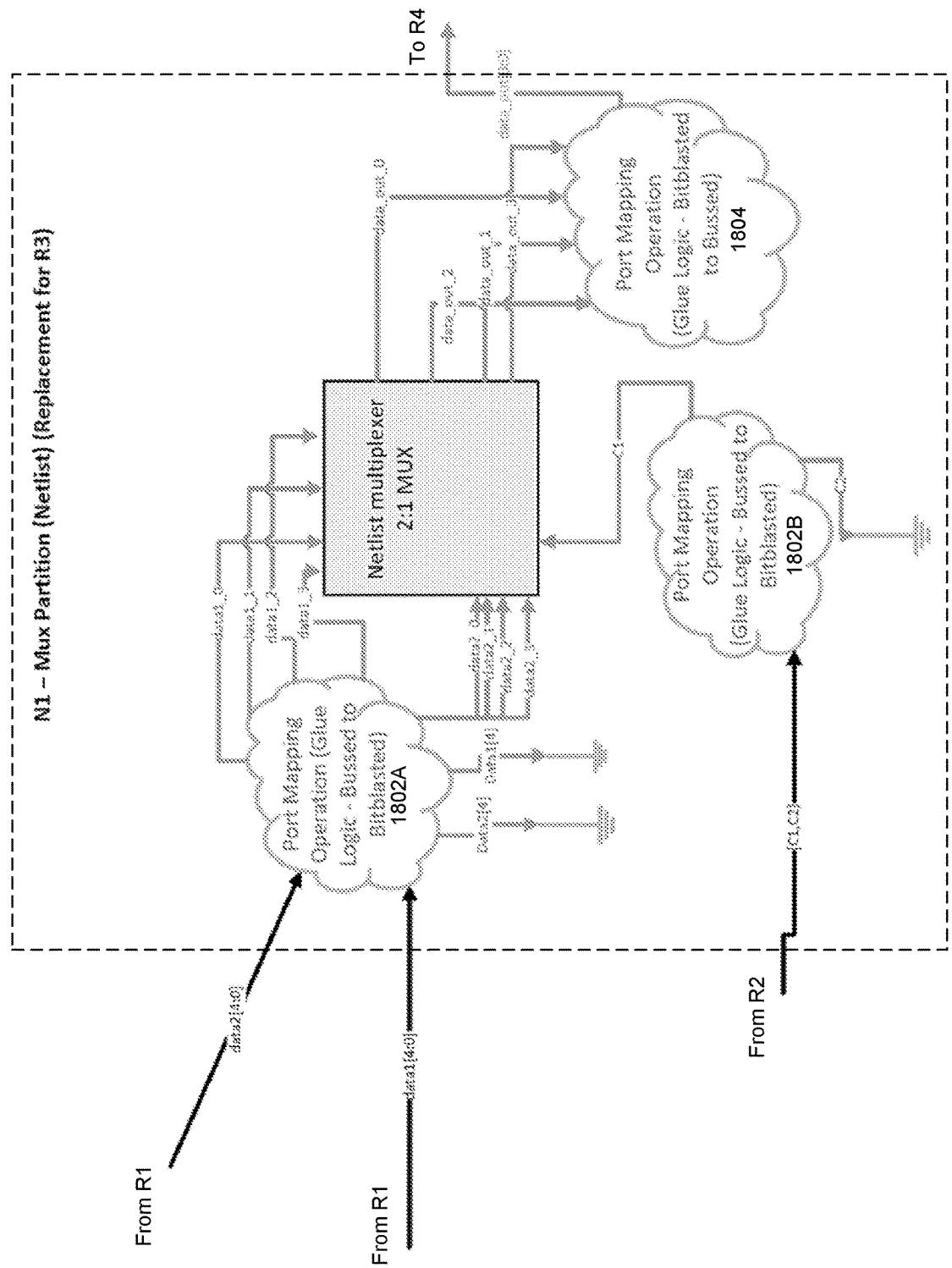
FIG. 18 depicts a translation of an RTL partition to a Netlist partition.

FIG. 18 depicts a translation of an RTL partition to a Netlist partition. In this example, multiplexer 1708 of RTL partition R3 from FIG. 17 is replaced by Netlist partition N1. A port mapping between R2, N1, and R4 is illustrated for a 1-dimensional bused data signal, which is produced by RTL partition R1, and goes through RTL partition R2 as a feedthrough signal, and is received by Netlist partition N1. As the multiplexer 1708 was a 4:1 multiplexer that is used as a 2:1 multiplexer, the Netlist multiplexer is optimized to a 2:1 multiplexer during synthesis conversion to Netlist. Port mapping operation 1802A converts bussed data signals data1 and data2 from R2 into single bit signals (bit blasted) for input into a Netlist represented multiplexer. Port mapping operation 1802B converts bussed selector signals $C_1$ and $C_2$ into single bit signals (bit blasted) for input into a Netlist represented 2:1 multiplexer. Port mapping operation 1804 converts bitblasted data signals to bussed format signals for output to partition R4. Conversion to Netlist can remove obsolete or unused signals (e.g., mux select C2, data1[4], and data2[4]). Note that signal $C_2$ is not utilized by N1 and a bit blasting operation can drop the signal by tying signal $C_2$ to ground.

In some examples, a database of connection between RTL and Netlist can be maintained and updated with connection made between RTL to Netlist and such connection can be reused where RTL-representations of circuitry, naming conventions, and/or data paths are presented for connection to Netlist.

Figure 19:
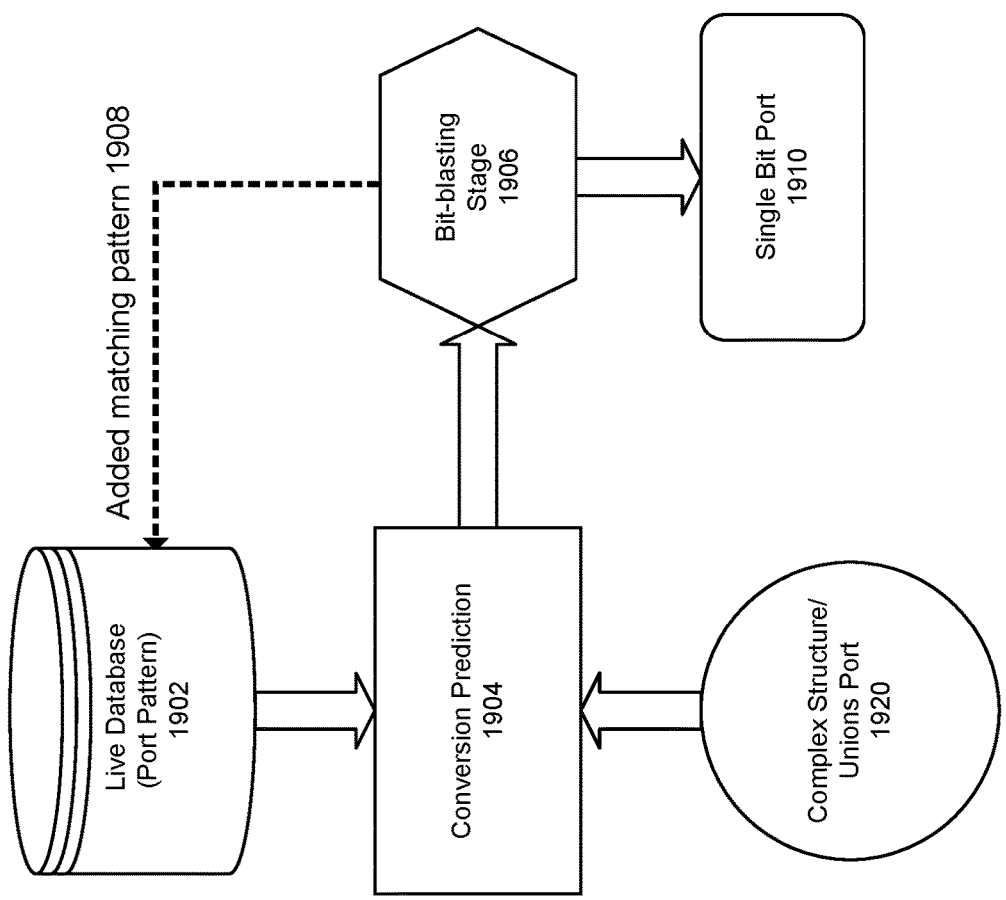
FIG. 19 depicts an example system to connect RTL to Netlist.

FIG. 19 depicts an example system to connect a first circuit representation to a second circuit representation. With respect to the example of FIG. 18, the connection is from RTL to Netlist. The system can match and unite design logic of both synthesized (Netlist) and non-synthesized (RTL) design using machine learning (ML)-based automation. Database 1902 can store a predefined history of connections between RTL to Netlist representations and/or connections between RTL and Netlist representations. For example, connections between RTL and Netlist representations can include a connection of an RTL representation of a bus to Netlist representation of bit lines, such as incoming/outgoing feedthrough between RTL and Netlist, clock tree conversion between RTL and Netlist, repeater or isolator connections between RTL and Netlist, custom block and SRAM patterns and connections between RTL and Netlist, or conversion from RTL to Netlist naming conventions. Database 1902 can be updated to include or remove connections between RTL and Netlist and/or Netlist and RTL, as described herein.

Based on an input of an RTL and/or Netlist structure and unions 1920 as inputs, conversion prediction 1904 can provide an output of a Netlist connection to an RTL structure based on a look-up of Netlist-to-RTL and/or an output of an RTL connection to a Netlist representation based on a look-up of RTL-to-Netlist connection entries in database 1902. For example, in system Verilog, a union can be a single storage component that can be used or referenced by different names at any given time. For example, inputs can be data1[4:0] and data2[4:0] and MUX select $C_1$ and $C_2$ in the example of FIG. 17.

If the prediction is successful by providing a corresponding RTL connection to a Netlist circuit representation from database 1902, then an output of bit-blasting stage 1906 can be one or more single bit ports 1910 or other output that represents a connection. For example, a single bit port can present a 1 bit value, for example, a binary "0" or a "1", and alternately it cannot present a binary value of "10". A 2 bit port signal can be used to present binary "10."

If the prediction is not successful because there is no corresponding RTL connection to a Netlist circuit representation from database 1902, then bit-blasting stage 1906 can update database 1902 with a connection that represents a connection of one or more ports of RTL to one or more ports of Netlist determined by bit-blasting stage 1906. Note that the example is described with respect to connections of signals from partitions R1 and R2 to partition R3, which is replaced by Netlist N1. But the use of the system of FIG. 19 can apply to signals from partition N1 to partition R4 and would provide connections between Netlist and RTL ports.

The following provides examples of prediction that can be performed by conversion prediction 1904 based on signal naming or signal formats based on signal formats in FIG. 18. For example, referring to the examples of FIGS. 17 and 18, transformation of data[4:0] into 5 single bits can be identified by a predefined pattern of {signal_width} in database 1902 with output signals as listed in Table 1.

TABLE 1

1D signal bussed format into 5 single bit blasted signals

| Database (Port Pattern)(Input) Complex Structure/Unions Port (Input) (RTL original signal) | Predefined:{signal_width} Bit-blasting Stage (Output) (Bit-blasted signal) |
|---|---|
| data1[4:0] | data1_4 |
|  | data1_3 |
|  | data1_2 |
|  | data1_1 |
|  | data1_0 |
| data2[4:0] | data2_4 |
|  | data2_3 |
|  | data2_2 |
|  | data2_1 |
|  | data2_0 |

In Table 1, there are two unique signal names (e.g., data1[4:0] and data2[4:0]), each 5 bits wide. Based on the 1-dimensional bussed signal represented by Table 1 in database 1902, bit-blasting stage 1906 can create a 2-dimensional bussed format such as data[0:1][4:0]. Based on prediction by machine learning-based conversion prediction 1904, bit-blasting stage 1906 can add a new pattern into database 1902 for the 2-dimensional bussed signal identified using {signal_dimension_width}, resulting in generation of 10 single bit signals shown in Table 2 as part of bit-blasting stage. For example, in Table 1, a pattern can be stored in the form of "name_id," so that an incoming signal has additional criteria in it and machine learning-based conversion prediction 1904 can use the existing pattern of "name_id" to predict the final output of "name_dimension_id."

Table 2 provides an example of the created new pattern that can be used to connect RTL to Netlist for examples that are predicted to occur, but has not been used in FIG. 18. Table 2 provides a version of Table 1 but with unique 2-dimensional signal names (e.g., data[1:0][4:0]) that are each 5 bits wide.

TABLE 2

2-dimensional signal bussed format into 10 single bit-blasted

| Pattern From ML Database(Input) Complex Structure/ Unions Port(Input) (RTL original signal) | Predefined: {signal_width] Update/added: {signal_dimension_width} Bit-blasting Stage(Output) (bit-blasted signal) |
|---|---|
| data[0][4:0] | data_0_4, |
|  | data_0_3, |
|  | data_0_2, |
|  | data_0_1, |
|  | data_0_0 |
| data[1][4:0] | data_1_4, |
|  | data_1_3, |
|  | data_1_2, |
|  | data_1_1, |
|  | data_1_0 |

A 2-dimensional structure can be defined as:

```
struct{
    string pipename;
    struct{
        logic [1:0][4:0]data;
    }
}mystruct
```

In some cases, where database 1902 includes two existing patterns, existing patterns can be used by machine learning-based conversion prediction 1904 and/or bit-blasting stage 1906 to create a new pattern {struct_name_signal_dimension_width} and {struct_name_signal}, to accommodate this new structure such as a 2-dimensional struct signal with 11 bitblasted signals. The conversion of Table 3 is predicted to occur, but has not been used in FIG. 18 but can be used for other determinations of connections. Table 1 represents one form of data (1 dimension), and Table 2 represents another form of data (2 dimension). A combination of Table 1 and Table 2 can be used to predict the complex data in Table 3. Table 3 can be derived from Tables 1 and 2 by using existing patterns to predict a final signal. Table 3 provides an example of the created new pattern that can be used to connect RTL to Netlist.

TABLE 3

2-dimensional struct signal, with 11 bitblasted signal

| Pattern From database(Input) | Predefined:<br>{signal_width}<br>Existing:<br>{signal_dimension_width}<br>Update/added:<br>{struct_name_signal_dimension_width}<br>Update/added:<br>{struct_name_signal} |
|---|---|
| Complex Structure/Unions<br>Port(Input)<br>(RTL original signal) | Bit-blasting Stage (Bitblasted signal)<br>(output) |
| mystruct.pipename<br>mystruct.data[0][4:0] | mystruct_pipename<br>mystruct_data_0_4<br>mystruct_data_0_3<br>mystruct_data_0_2<br>mystruct_data_0_1<br>mystruct_data_0_0 |
| mystruct.data[1][4:0] | mystruct_data_1_4<br>mystruct_data_1_3<br>mystruct_data_1_2<br>mystruct_data_1_1<br>mystruct_data_1_0 |

Data in Table 3 represents a 1-dimensional element called mystruct, with embedded 2-dimensional element called data [1:0][4:0]. The 1-dimensional pattern comes from learning from Table 1 and the 2-dimensional pattern comes from Table 2 learning, to successfully predict the new pattern for Table 3. Accordingly, machine learning-based conversion prediction 1904 and/or bit-blasting stage 1906 can predict Netlist names based on observed patterns from previous data patterns. A name can represent a port pattern format or syntax.

Figure 20:
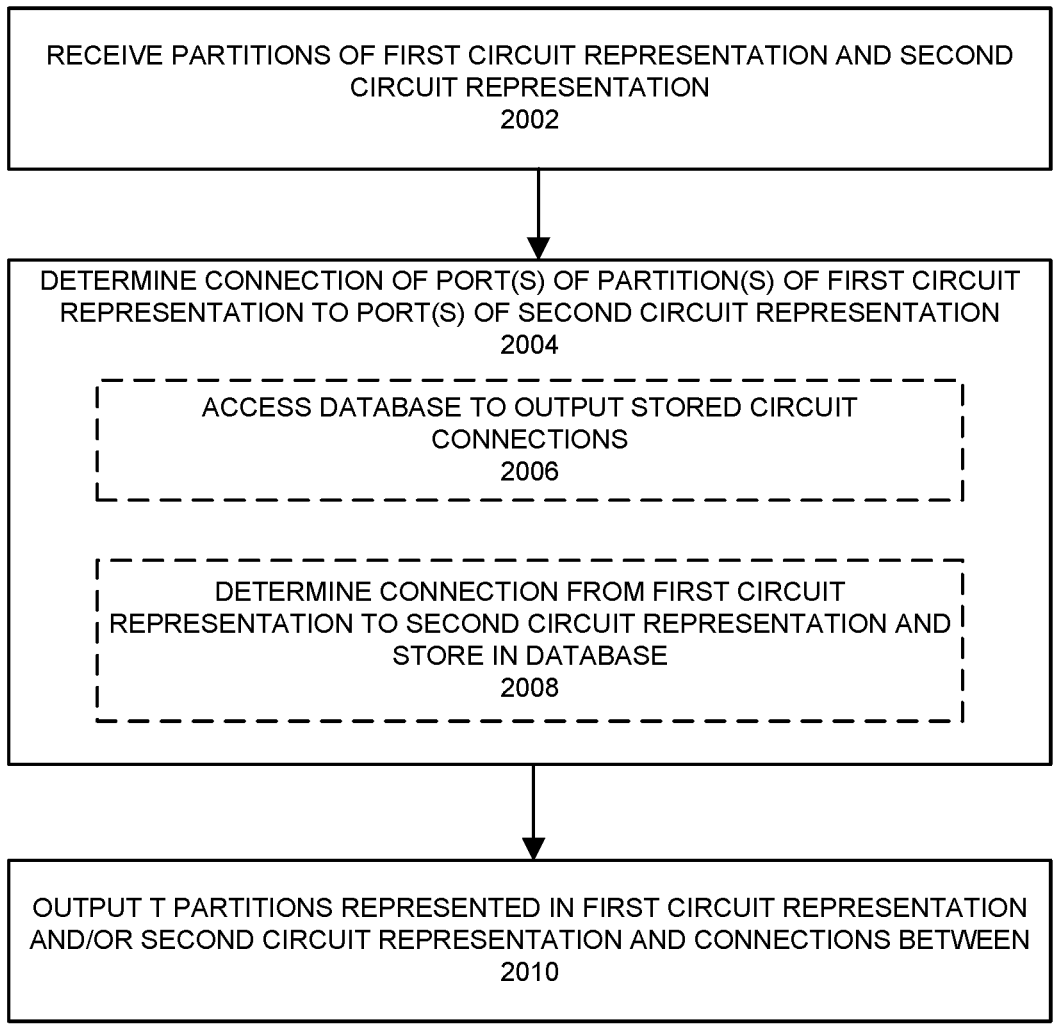
FIG. 20 depicts an example process.

FIG. 20 depicts an example process that can be performed by a synthesis tool (e.g., electronic design automation (EDA) tool) to convert a representation of a digital circuit as signals between registers and logical operations performed on the signals to a transistor-level schematic. RTL and Netlist support supersets of many components such as clock tree, isolators, feedthroughs, repeaters, and input/output pins. At 2002, inputs are received that represent first and second circuit representations. For example, for RTL-to-Netlist connections, first and second circuit representations can be respective RTL partitions and Netlist partitions. However, for Netlist-to-RTL connections, first and second circuit representations can be respective Netlist partitions and RTL partitions. An RTL partition can be represented as a behavioral representation of a circuit block. A Netlist partition can be represented as a synthesized representation of a circuit block.

At 2004, a selected number of partitions represented by the first circuit representation can be converted to the second circuit representation format. For example, one or more RTL (R) partitions can be replaced with equivalent Synthesized Netlist (N) partitions, to form total number of T partitions where (T=N+R). For example, at 2006, a database can be accessed to select a connection from one or more ports of the first circuit representation to one or more ports of the second circuit representation format for reuse. In some examples, a prediction of a connection between the first and second circuit representations can be made using one or more stored naming conventions.

At 2008, if the database does not include the connection from one or more ports of the first circuit representation to one or more ports of the second circuit representation format for reuse, a bit blasting operation can be performed to connect one or more ports of the first circuit representation to one or more ports of the second circuit representation format. The database can be updated with identified connections from the first circuit representation to the second circuit representation. For example, RTL to Netlist connections stored in a database can be reused in subsequent connections between an RTL partition and a Netlist partition. A single bit port can be an output of conversion from first circuit representation to second circuit representation. A bit blasting stage can decide if an RTL behavioral connection is to be tied or dropped by considering what exists in the Netlist, and if it is ignorable, the connection is bypassed from replacement by Netlist.

At 2010, an output that includes T connected partitions can be used to perform gate level simulations. A hybrid simulation using both RTL and Netlist can be used to test an integrity of a circuit design.

The appearances of the phrase "one example" or "an example" are not necessarily all referring to the same example or embodiment. Any aspect described herein can be combined with any other aspect or similar aspect described herein, regardless of whether the aspects are described with respect to the same figure or element.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. In flow diagrams, other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z.'"

Embodiments of the invention may include various steps, which have been described above. The steps may be embodied in machine-executable instructions which may be used to cause a general-purpose or special-purpose processor to perform the steps. Alternatively, these steps may be performed by specific hardware components that contain hard-wired logic for performing the steps, or by any combination of programmed computer components and custom hardware components.

As described herein, instructions may refer to specific configurations of hardware such as application specific integrated circuits (ASICs) configured to perform certain operations or having a predetermined functionality or software instructions stored in memory embodied in a non-transitory computer readable medium. Thus, the techniques shown in the figures can be implemented using code and data stored and executed on one or more electronic devices (e.g., an end station, a network element, etc.). Such electronic devices store and communicate (internally and/or with other electronic devices over a network) code and data using computer machine-readable media, such as non-transitory computer machine-readable storage media (e.g., magnetic disks; optical disks; random access memory; read only memory; flash memory devices; phase-change memory) and transitory computer machine-readable communication media (e.g., electrical, optical, acoustical or other form of propagated signals—such as carrier waves, infrared signals, digital signals, etc.).

In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). The storage device and signals carrying the network traffic respectively represent one or more machine-readable storage media and machine-readable communication media. Thus, the storage device of a given electronic device typically stores code and/or data for execution on the set of one or more processors of that electronic device. Of course, one or more parts of an embodiment of the invention may be implemented using different combinations of software, firmware, and/or hardware. Throughout this detailed description, for the purposes of explanation, numerous specific details were set forth in order to provide a thorough understanding of the present invention. It will be apparent, however, to one skilled in the art that the invention may be practiced without some of these specific details. In certain instances, well known structures and functions were not described in elaborate detail in order to avoid obscuring the subject matter of the present invention. Accordingly, the scope and spirit of the invention should be judged in terms of the claims which follow.

Example 1 includes a computer-readable medium comprising instructions stored thereon, that if executed by one or more processors, cause the one or more processors to: access partitions representative of a first circuit representation; map at least one port representation of at least one partition of the partitions representative of the first circuit representation to at least one port of a second circuit representation based on a stored mapping of the at least one port representation of at least one partition of the partitions representative of the first circuit representation to the at least one port of a second circuit representation; and output the at least one single bit port representation of the at least one port of a second circuit representation.

Example 2 includes one or more examples, wherein the first circuit representation comprises register transfer level (RTL) or Netlist.

Example 3 includes one or more examples, wherein the second circuit representation comprises Netlist or register transfer level (RTL).

Example 4 includes one or more examples, wherein the first circuit representation comprises a signal representation and the second circuit representation comprises a bit level representation.

Example 5 includes one or more examples, wherein the at least one port representation comprises a multi-dimensional structure including structures and unions and a single bit port representation of the at least one single bit port representation comprises a bit blasted form of the multi-dimensional structure.

Example 6 includes one or more examples, comprising instructions stored thereon, that if executed by one or more processors, cause the one or more processors to: based on unavailability of the stored mapping of the at least one port representation of at least one partition of the partitions representative of the first circuit representation to the at least one port of a second circuit representation: determine a connection between the at least one port representation of at least one partition of the partitions representative of the first circuit representation to the at least one port of a second circuit representation and update a database to include the connection.

Example 7 includes one or more examples, comprising instructions stored thereon, that if executed by one or more processors, cause the one or more processors to: form a hybrid circuit representation comprising first and second circuit representations and the determined mapping.

Example 8 includes one or more examples, comprising instructions stored thereon, that if executed by one or more processors, cause the one or more processors to: execute a native simulator to provide an evaluation of the hybrid circuit representation.

Example 9 includes one or more examples, wherein the map at least one port representation of at least one partition of the partitions representative of the first circuit representation to at least one port of a second circuit representation comprises: provide conversion of one or more of bussed to bit blasted, clock tree or feed through to clock tree or feed through, behavioral connection to physical repeater, or behavioral connection to isolator.

Example 10 includes one or more examples, and includes an apparatus comprising: at least one processor and at least one memory comprising instructions stored thereon, that if executed by the at least one processor, cause the at least one processor to: access partitions representative of a first circuit representation, map at least one port representation of at least one partition of the partitions representative of the first circuit representation to at least one port of a second circuit representation based on a stored mapping of the at least one port representation of at least one partition of the partitions representative of the first circuit representation to the at least one port of a second circuit representation, and output the at least one single bit port representation of the at least one port of a second circuit representation.

Example 11 includes one or more examples, wherein the first circuit representation comprises register transfer level (RTL) or Netlist.

Example 12 includes one or more examples, wherein the second circuit representation comprises Netlist or register transfer level (RTL).

Example 13 includes one or more examples, wherein the first circuit representation comprises a signal representation and the second circuit representation comprises a bit level representation.

Example 14 includes one or more examples, wherein the at least one port representation comprises a multi-dimensional structure including structures and unions and a single bit port representation of the at least one single bit port representation comprises a bit blasted form of the multi-dimensional structure.

Example 15 includes one or more examples, wherein the at least one memory comprises instructions stored thereon, that if executed by the at least one processor, cause the at least one processor to: based on unavailability of the stored mapping of the at least one port representation of at least one partition of the partitions representative of the first circuit representation to the at least one port of a second circuit representation: determine a connection between the at least one port representation of at least one partition of the partitions representative of the first circuit representation to the at least one port of a second circuit representation and update a database to include the connection.

Example 16 includes one or more examples, wherein the at least one memory comprises instructions stored thereon, that if executed by the at least one processor, cause the at least one processor to: form a hybrid circuit representation comprising first and second circuit representations and the determined mapping and execute a native simulator to provide an evaluation of the hybrid circuit representation.

Example 17 includes one or more examples, wherein the map at least one port representation of at least one partition of the partitions representative of the first circuit representation to at least one port of a second circuit representation comprises: provide conversion of one or more of bussed to bit blasted, clock tree or feed through to clock tree or feed through, behavioral connection to physical repeater, or behavioral connection to isolator.

Example 18 includes one or more examples, and includes a method comprising: accessing partitions representative of a first circuit representation; mapping at least one port representation of at least one partition of the partitions representative of the first circuit representation to at least one port of a second circuit representation based on a stored mapping of the at least one port representation of at least one partition of the partitions representative of the first circuit representation to the at least one port of a second circuit representation; and outputting the at least one single bit port representation of the at least one port of a second circuit representation.

Example 19 includes one or more examples, wherein the first circuit representation comprises register transfer level (RTL) or Netlist.

Example 20 includes one or more examples, wherein the second circuit representation comprises Netlist or register transfer level (RTL).

Example 21 includes one or more examples, wherein the first circuit representation comprises a signal representation and the second circuit representation comprises a bit level representation.

Example 22 includes one or more examples, wherein the at least one port representation comprises a multi-dimensional structure including structures and unions and a single bit port representation of the at least one single bit port representation comprises a bit blasted form of the multi-dimensional structure.

Example 23 includes one or more examples, comprising: based on unavailability of the stored mapping of the at least one port representation of at least one partition of the partitions representative of the first circuit representation to the at least one port of a second circuit representation: determining a connection between the at least one port representation of at least one partition of the partitions representative of the first circuit representation to the at least one port of a second circuit representation and updating a database to include the connection.

Example 24 includes one or more examples, comprising: forming a hybrid circuit representation comprising first and second circuit representations and the determined mapping.

Example 25 includes one or more examples, comprising: providing the hybrid circuit representation to a native simulator to provide an evaluation of the hybrid circuit representation.

What is claimed is:

1. At least one non-transitory computer-readable medium comprising instructions stored thereon, that if executed by one or more processors, cause the one or more processors to:
   access partitions representative of a first circuit representation;
   map at least one port representation of at least one partition of the partitions representative of the first circuit representation to at least one port of a second circuit representation based on a stored mapping of the at least one port representation of at least one partition of the partitions representative of the first circuit representation to the at least one port of a second circuit representation, wherein the at least one port representation comprises a multi-dimensional structure; and
   output at least one single bit port representation of the at least one port of a second circuit representation, wherein the at least one single bit port representation of the at least one single bit port representation comprises a bit blasted form of the multi-dimensional structure.

2. The computer-readable medium of claim 1, wherein the first circuit representation comprises register transfer level (RTL) or Netlist.

3. The computer-readable medium of claim 1, wherein the second circuit representation comprises Netlist or register transfer level (RTL).

4. The computer-readable medium of claim 1, wherein the first circuit representation comprises a signal representation and the second circuit representation comprises a bit level representation.

5. The computer-readable medium of claim 1, wherein
the multi-dimensional structure comprises structures and unions.

6. The computer-readable medium of claim 1, comprising instructions stored thereon, that if executed by one or more processors, cause the one or more processors to:
   based on unavailability of the stored mapping of the at least one port representation of at least one partition of the partitions representative of the first circuit representation to the at least one port of a second circuit representation:
determine a connection between the at least one port representation of at least one partition of the partitions representative of the first circuit representation to the at least one port of a second circuit representation and
update a database to include the connection.

7. The computer-readable medium of claim 1, comprising instructions stored thereon, that if executed by one or more processors, cause the one or more processors to:
form a hybrid circuit representation comprising first and second circuit representations and the stored mapping.

8. The computer-readable medium of claim 7, comprising instructions stored thereon, that if executed by one or more processors, cause the one or more processors to:
execute a native simulator to provide an evaluation of the hybrid circuit representation.

9. The computer-readable medium of claim 1, wherein the map at least one port representation of at least one partition of the partitions representative of the first circuit representation to at least one port of a second circuit representation comprises:
provide conversion of one or more of bussed to bit blasted, clock tree or feed through to clock tree or feed through, behavioral connection to physical repeater, or behavioral connection to isolator.

10. An apparatus comprising:
at least one processor and
at least one memory comprising instructions stored thereon, that if executed by the at least one processor, cause the at least one processor to:
access partitions representative of a first circuit representation,
map at least one port representation of at least one partition of the partitions representative of the first circuit representation to at least one port of a second circuit representation based on a stored mapping of the at least one port representation of at least one partition of the partitions representative of the first circuit representation to the at least one port of a second circuit representation, wherein the at least one port representation comprises a multi-dimensional structure, and
output at least one single bit port representation of the at least one port of a second circuit representation, wherein the at least one single bit port representation of the at least one single bit port representation comprises a bit blasted form of the multi-dimensional structure.

11. The apparatus of claim 10, wherein the first circuit representation comprises register transfer level (RTL) or Netlist.

12. The apparatus of claim 10, wherein the second circuit representation comprises Netlist or register transfer level (RTL).

13. The apparatus of claim 10, wherein the first circuit representation comprises a signal representation and the second circuit representation comprises a bit level representation.

14. The apparatus of claim 10, wherein
the multi-dimensional structure comprises structures and unions.

15. The apparatus of claim 10, wherein the at least one memory comprises instructions stored thereon, that if executed by the at least one processor, cause the at least one processor to:
based on unavailability of the stored mapping of the at least one port representation of at least one partition of the partitions representative of the first circuit representation to the at least one port of a second circuit representation:
determine a connection between the at least one port representation of at least one partition of the partitions representative of the first circuit representation to the at least one port of a second circuit representation and
update a database to include the connection.

16. The apparatus of claim 10, wherein the at least one memory comprises instructions stored thereon, that if executed by the at least one processor, cause the at least one processor to:
form a hybrid circuit representation comprising first and second circuit representations and the stored mapping and
execute a native simulator to provide an evaluation of the hybrid circuit representation.

17. The apparatus of claim 10, wherein the map at least one port representation of at least one partition of the partitions representative of the first circuit representation to at least one port of a second circuit representation comprises:
provide conversion of one or more of bussed to bit blasted, clock tree or feed through to clock tree or feed through, behavioral connection to physical repeater, or behavioral connection to isolator.

18. A method comprising:
accessing partitions representative of a first circuit representation;
mapping at least one port representation of at least one partition of the partitions representative of the first circuit representation to at least one port of a second circuit representation based on a stored mapping of the at least one port representation of at least one partition of the partitions representative of the first circuit representation to the at least one port of a second circuit representation, wherein the at least one port representation comprises a multi-dimensional structure; and
outputting at least one single bit port representation of the at least one port of a second circuit representation, wherein the at least one single bit port representation of the at least one single bit port representation comprises a bit blasted form of the multi-dimensional structure.

19. The method of claim 18, wherein the first circuit representation comprises register transfer level (RTL) or Netlist.

20. The method of claim 18, wherein the second circuit representation comprises Netlist or register transfer level (RTL).

21. The method of claim 18, wherein the first circuit representation comprises a signal representation and the second circuit representation comprises a bit level representation.

22. The method of claim 18, wherein
the multi-dimensional structure comprises structures and unions.

23. The method of claim 18, comprising:
based on unavailability of the stored mapping of the at least one port representation of at least one partition of the partitions representative of the first circuit representation to the at least one port of a second circuit representation:
determining a connection between the at least one port representation of at least one partition of the partitions representative of the first circuit representation to the at least one port of a second circuit representation and
updating a database to include the connection.

24. The method of claim 18, comprising:
forming a hybrid circuit representation comprising first and second circuit representations and the stored mapping.

25. The method of claim 24, comprising:
providing the hybrid circuit representation to a native simulator to provide an evaluation of the hybrid circuit representation.

\* \* \* \* \*